(12) United States Patent
Tanaka et al.

(10) Patent No.: US 7,767,595 B2
(45) Date of Patent: Aug. 3, 2010

(54) MANUFACTURING METHOD OF SEMICONDUCTOR DEVICE

(75) Inventors: Koichiro Tanaka, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 88 days.

(21) Appl. No.: 11/876,981

(22) Filed: Oct. 23, 2007

(65) Prior Publication Data

US 2008/0108229 A1     May 8, 2008

(30) Foreign Application Priority Data

Oct. 26, 2006   (JP) .............................. 2006-290771

(51) Int. Cl.
*H01L 21/00* (2006.01)
(52) U.S. Cl. .................. 438/795; 438/487; 438/460; 438/461; 438/462; 438/463; 438/464; 438/465; 219/121.68; 219/121.69; 219/121.76; 219/121.77; 257/66; 257/E21.328
(58) Field of Classification Search ................ 438/795, 438/487, 460, 461, 462, 463, 464, 465; 257/66; 219/220, 255, 121.68, 121.69, 121.76, 121.77
See application file for complete search history.

(56) References Cited

U.S. PATENT DOCUMENTS

| | | | |
|---|---|---|---|
| 4,594,471 A | 6/1986 | Yamazaki | |
| 4,603,470 A | 8/1986 | Yamazaki | |
| 4,861,964 A | 8/1989 | Sinohara | |
| 5,708,252 A | 1/1998 | Shinohara et al. | |
| 6,149,988 A | 11/2000 | Shinohara et al. | |
| 6,261,856 B1 | 7/2001 | Shinohara et al. | |
| 6,872,607 B2 * | 3/2005 | Tanaka | 438/166 |
| 7,176,069 B2 | 2/2007 | Yamazaki et al. | |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 2003/0141504 A1 * | 7/2003 | Kuwabara et al. | 257/66 |
| 2005/0043186 A1 | 2/2005 | Maekawa et al. | |

(Continued)

FOREIGN PATENT DOCUMENTS

DE   198 39 718 A1   3/2000

(Continued)

OTHER PUBLICATIONS

Office Action re Chinese application No. CN 200710167028.4 dated Mar. 12, 2010 (with English translation).

*Primary Examiner*—Davienne Monbleau
*Assistant Examiner*—Farid Khan
(74) *Attorney, Agent, or Firm*—Husch Blackwell Sanders LLP

(57) ABSTRACT

In a manufacturing process of a semiconductor device, a manufacturing technique of a semiconductor device by which a lithography step that uses a photoresist is simplified is provided. A manufacturing cost is reduced and throughput is improved. An irradiation object is formed over a substrate by sequentially stacking a first material layer and a second material layer. The irradiation object is irradiated with a first laser beam that is absorbed by the first material layer and a second laser beam that is absorbed by the second material layer so that the laser beams overlap. A part or all of the region irradiated with an overlap part of the laser beams is ablated to form an opening.

15 Claims, 33 Drawing Sheets

U.S. PATENT DOCUMENTS

| | | | |
|---|---|---|---|
| 2005/0048710 A1* | 3/2005 | Onishi | 438/202 |
| 2006/0051943 A1* | 3/2006 | Inoue et al. | 438/487 |
| 2006/0158482 A1 | 7/2006 | Nakamura et al. | |
| 2006/0270175 A1 | 11/2006 | Aoki et al. | |
| 2007/0051952 A1 | 3/2007 | Yamazaki et al. | |

FOREIGN PATENT DOCUMENTS

| | | | |
|---|---|---|---|
| JP | 2001-77194 | | 3/2001 |
| JP | 2001-196665 | | 7/2001 |
| JP | 2001-212685 | * | 8/2001 |

* cited by examiner

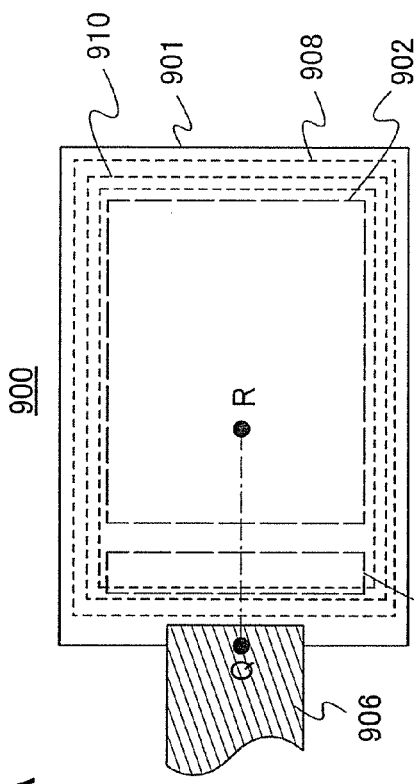
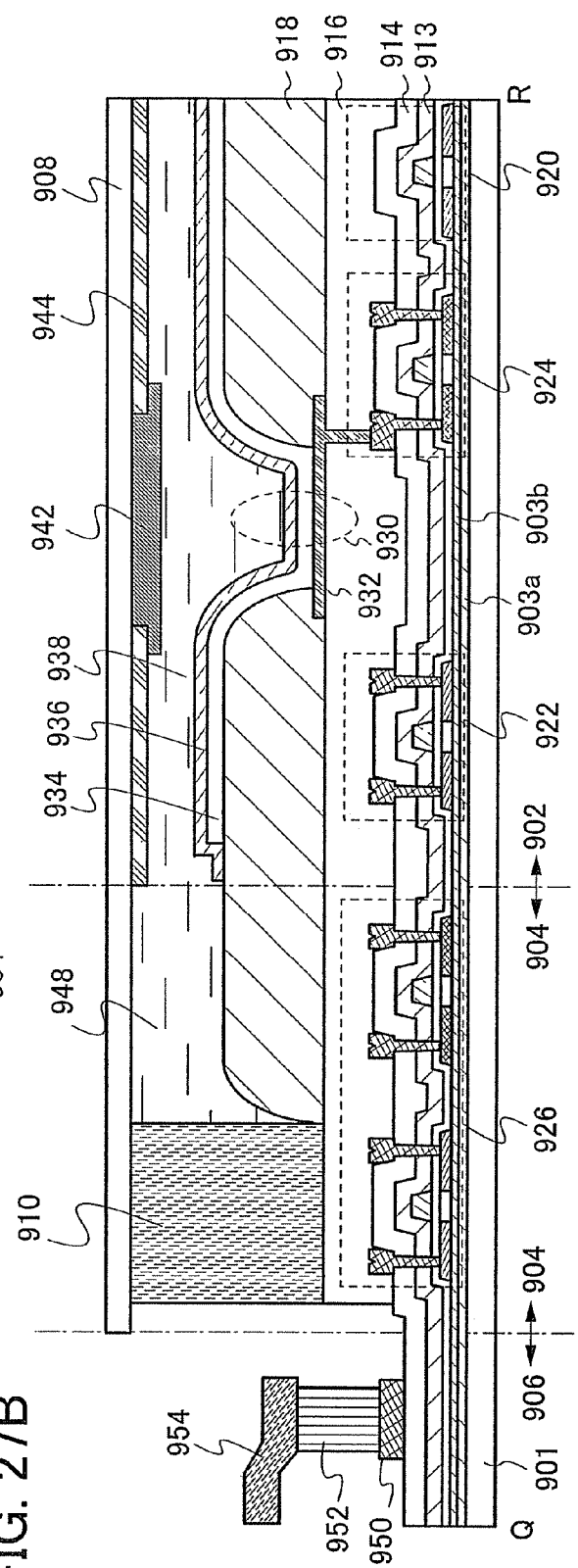
FIG. 27A
FIG. 27B

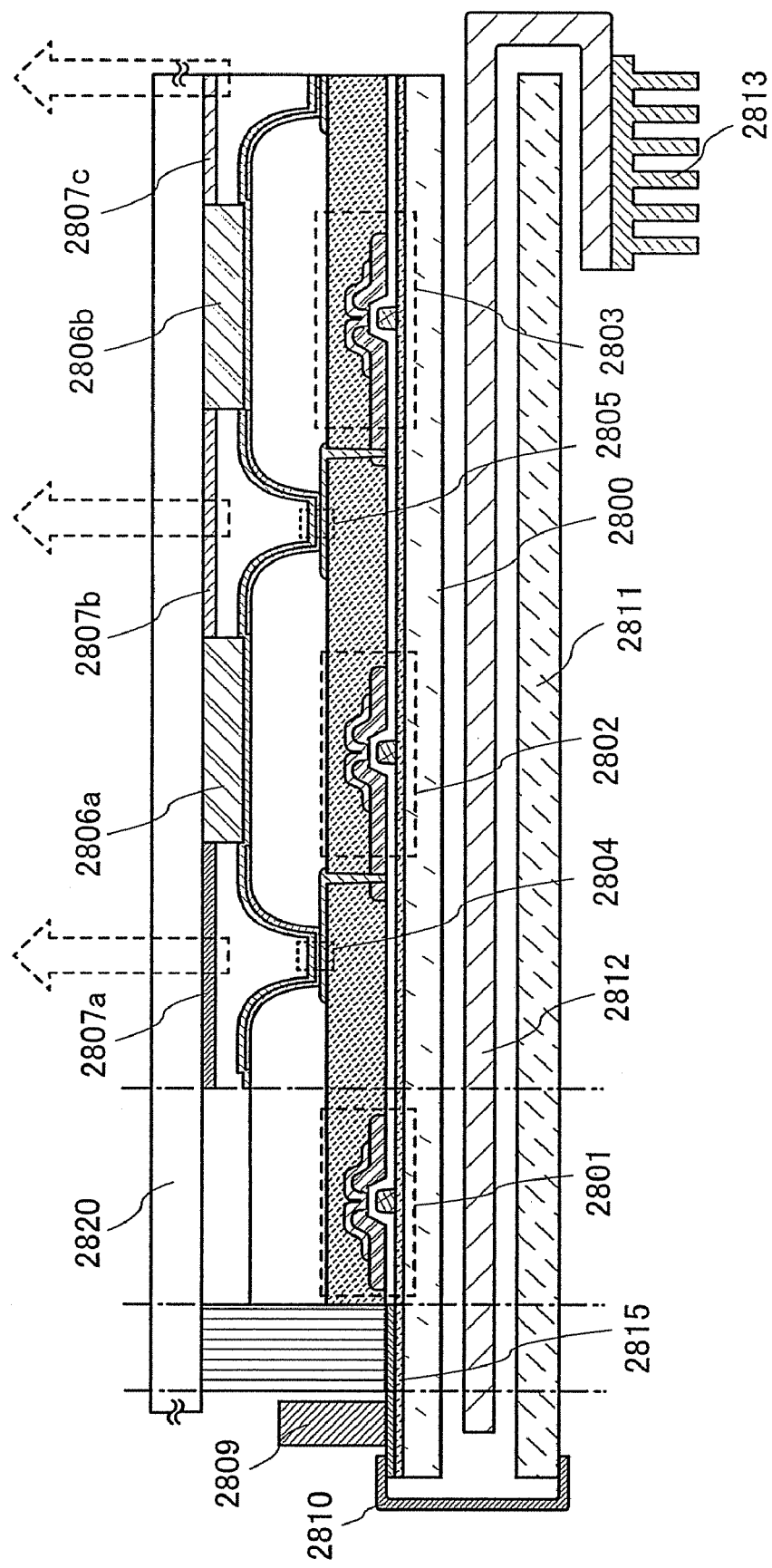

MANUFACTURING METHOD OF SEMICONDUCTOR DEVICE

BACKGROUND OF THE INVENTION

1. Field of the Invention

The present invention relates to a manufacturing method of a semiconductor device. In particular, the present invention relates to a method of forming an opening in a thin film such as a conductive layer or an insulating layer.

2. Description of the Related Art

In a conventional technique, thin films such as an insulating layer and a conductive layer are formed over a substrate and a desired pattern is formed by a lithography technique, as appropriate, so as to manufacture a MOS transistor, a thin film transistor (hereinafter also referred to as a TFT), and a semiconductor device including such a transistor. A lithography technique is a technique in which a pattern of a circuit or the like called a photomask, which is formed with a light-blocking material over a transparent flat plate, is transferred to an aimed object by utilizing light. The lithography technique has been widely used in a process of manufacturing a semiconductor integrated circuit and the like.

However, in the manufacturing process using a lithography technique, multiple steps such as resist application using a photosensitive resin called a photoresist, pattern light exposure, development, etching using a resist as a mask, and resist removal are necessary. Therefore, the cost is increased and the throughput is decreased as the number of lithography steps is increased.

For example, a manufacturing method of a semiconductor device is disclosed in Patent Document 1: Japanese Published Patent Application No. 2001-77194, in which a lithography step is simplified by removing the necessity of an etching step in forming an opening in an insulating film. Specifically, a resist film is formed in advance in a region where it is desired to form an opening, an insulating film is formed in a region other than the resist film, and the resist film is removed, whereby the opening is formed in the insulating film.

SUMMARY OF THE INVENTION

It is an object of the present invention to provide a manufacturing technique of a semiconductor device by which a lithography step is simplified, or a manufacturing technique of a semiconductor device by which the number of lithography steps is reduced.

The present invention has a feature in that ablation by laser beam irradiation is utilized to form an opening for electrically connecting conductive layers to each other or an opening for electrically connecting a conductive layer to a semiconductor layer, without using a photoresist. As in the present invention, a process in which a pattern is formed by utilizing laser ablation is referred to as a laser ablation patterning process (LAPP) in this specification. In the present invention, an opening pattern is formed by utilizing laser ablation.

Note that ablation (also referred to as laser ablation) is a phenomenon that a part or all of an irradiated region of an irradiation object is removed by laser beam irradiation, in this specification. Here, ablation includes both sublimation in which a part or all of an irradiated region of an irradiation object is changed from a solid state to a gas state by laser beam irradiation, and evaporation in which the phase of a part or all of the irradiated region is changed from a solid state to a gas state through a liquid state.

The irradiation object is a stacked body formed by sequentially forming a first material layer and a second material layer over a substrate. In addition, another material layer (for example, a conductive layer, an insulating layer, a semiconductor layer, or the like) may be formed under the first material layer.

The irradiation object is irradiated with a first laser beam which is absorbed by the first material layer and a second laser beam which is absorbed by the second material layer so that the first laser beam and the second laser beam overlap with each other. A part or all of the region irradiated with an overlap part of the laser beams is ablated to form an opening.

In the present invention, the opening can be formed by utilizing laser ablation, without using a lithography step that uses a photoresist.

The first laser beam has a wavelength that is absorbed by at least the first material layer. That is, the oscillation wavelength of the first laser beam is preferably in an absorption wavelength range of the first material layer. More preferably, the first laser beam has an oscillation wavelength of 400 nm or longer.

The second laser beam has a wavelength that is absorbed by at least the second material layer. That is, the oscillation wavelength of the second laser beam is preferably in an absorption wavelength range of the second material layer. More preferably, the second laser beam has an oscillation wavelength of 400 nm or shorter.

One aspect of the present invention is to include the steps of forming a first material layer, forming a second material layer over the first material layer, and irradiating the first material layer and the second material layer with a first laser beam which is absorbed by the first material layer and a second laser beam which is absorbed by the second material layer so that the first laser beam and the second laser beam overlap, thereby removing a region of the second material layer irradiated with an overlap part of the first laser beam and the second laser beam to form an opening in the second material layer.

Another aspect of the present invention is to include the steps of forming a first material layer, forming a second material layer over the first material layer, and irradiating the first material layer and the second material layer with a first laser beam an oscillation wavelength of which is in an absorption wavelength range of the first material layer and a second laser beam an oscillation wavelength of which is in an absorption wavelength range of the second material layer so that the first laser beam and the second laser beam overlap, thereby removing a region of the second material layer irradiated with an overlap part of the first laser beam and the second laser beam to form an opening in the second material layer.

Still another aspect of the present invention is to include the steps of forming a first material layer, forming a second material layer over the first material layer, and irradiating the first material layer and the second material layer with a first laser beam having an oscillation wavelength of 400 nm or longer and a second laser beam having an oscillation wavelength of 400 nm or shorter so that the first laser beam and the second laser beam overlap, thereby removing a region of the second material layer irradiated with an overlap part of the first laser beam and the second laser beam to form an opening in the second material layer.

A laser beam having a wavelength longer than the second laser beam is preferably used as the first laser beam.

A second harmonic wave emitted from a YAG laser can be used as the first laser beam and a third harmonic wave emitted from the YAG laser can be used as the second laser beam.

In the above structure, an area S1 of a beam spot, which is formed on the irradiation object, of the first laser beam and an area S2 of a beam spot, which is formed on the irradiation object, of the second laser beam preferably satisfy a relation S1<S2 in the irradiation with the first laser beam and the second laser beam.

In the above structure, a beam diameter W1 of the first laser beam and a beam diameter W2 of the second laser beam preferably satisfy a relation W1<W2 in the irradiation with the first laser beam and the second laser beam.

Further, the present invention provides a laser processing apparatus which can directly process an irradiation object.

A feature of a laser processing apparatus of the present invention is to include a first laser having an oscillation wavelength of 400 nm or longer, a second laser having an oscillation wavelength of 400 nm or shorter, an optical system which controls a laser beam emitted from the first laser and a laser beam emitted from the second laser so that the laser beams overlap with each other on an irradiation object in irradiation, and a stage which is movable while holding the irradiation object. A part of the irradiation object is removed by irradiation of the irradiation object with the laser beam emitted from the first laser and the laser beam emitted from the second laser which is conducted so that the laser beams overlap on the irradiation object.

Another feature of the laser processing apparatus of the present invention is to include a first laser having an oscillation wavelength of 400 nm or longer, a second laser having an oscillation wavelength of 400 nm or shorter, a first optical system which controls a laser beam emitted from the first laser so that an irradiation object is irradiated with the laser beam emitted from the first laser, a second optical system which controls a laser beam emitted from the second laser so that the laser beam emitted from the second laser overlaps with the laser beam emitted from the first laser at the irradiation object in irradiation, and a stage which is movable while holding the irradiation object. A part of the irradiation object is removed by irradiation of the irradiation object with the laser beam emitted from the first laser and the laser beam emitted from the second laser which is conducted so that the laser beams overlap at the irradiation object. At this time, irradiation with the laser beam emitted from the first laser and irradiation with the laser beam emitted from the second laser can be conducted from opposite directions.

The first laser is preferably a visible laser and the second laser is preferably an ultraviolet laser.

Still another feature of the laser processing apparatus of the present invention is to include a solid-state laser, a beam splitter which separates a wavelength of a laser beam emitted from the solid-state laser, an optical system which controls a second harmonic laser beam of the solid-state laser which is separated by the beam splitter and a third harmonic laser beam of the solid-state laser which is separated by the beam splitter so that the laser beams overlap with each other on an irradiation object in irradiation, and a stage which is movable while holding the irradiation object. A part of the irradiation object is removed by irradiation of the irradiation object with the second harmonic laser beam of the solid-state laser and the third harmonic laser beam of the solid-state laser which is conducted so that the laser beams overlap on the irradiation object.

The solid-state laser is preferably a YAG laser, a $Y_2O_3$ laser, a $YVO_4$ laser, a $YAlO_3$ laser, or a $GdVO_4$ laser.

The optical system can have a structure including a mirror or a condenser lens.

By using the present invention, an opening can be formed in a thin film such as an insulating layer without using a photoresist. Therefore, a process of forming an opening can be simplified in a manufacturing process of a semiconductor device, which enables reduction in manufacturing cost and improvement in throughput.

BRIEF DESCRIPTION OF THE DRAWINGS

In the accompanying drawings:

FIGS. 27A and 27B show an example of a display device of the present invention;

FIG. 28 shows a structural example of a display module of the present invention;

DETAILED DESCRIPTION OF THE INVENTION

Figure 1A:
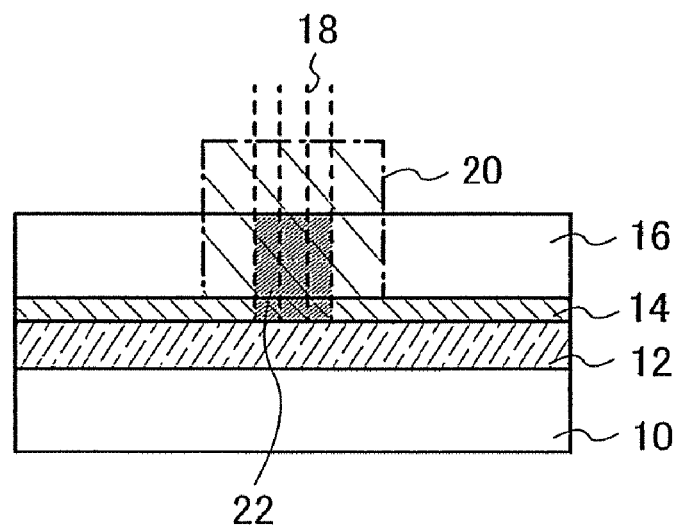
FIGS. 1A to 1C are conceptual diagrams for explaining the present invention.

Embodiment modes of the present invention will be described below with reference to the drawings. It is easily understood by those skilled in the art that various changes may be made in forms and details without departing from the spirit and the scope of the invention. Therefore, the present invention should not be limited to the descriptions of the embodiment modes below. In addition, in the following structures of the present invention, the same reference numerals are commonly given to the same components or components having a similar function throughout the drawings.

Embodiment Mode 1

One feature of the present invention is to form an opening in a desired region without using a lithography technique that uses a photoresist. In Embodiment Mode 1, an opening for electrically connecting conductive layers to each other is formed in an irradiation object. Hereinafter, one mode of a method for forming an opening in an irradiation object by application of the present invention will be described with reference to FIGS. 1A to 3C.

FIG. 1A shows an example of a structure of an irradiation object in which an opening is formed using the present invention. The irradiation object has a structure where a conductive layer 12, a first material layer 14, and a second material layer 16 are sequentially stacked over a substrate 10. The irradiation object is irradiated with a first laser beam 18 and a second laser beam 20 from the second material layer 16 side so that the first laser beam 18 and the second laser beam 20 overlap. In the irradiation object, a region irradiated with an overlap part of the first laser beam 18 and the second laser beam 20 is referred to as an overlap irradiation region 22 (FIG. 1A).

As the substrate 10, a glass substrate, a quartz substrate, a sapphire substrate, a ceramic substrate, a semiconductor substrate, or the like is used. A base insulating layer may be formed over the substrate 10. In that case, the base insulating layer is formed using an insulating material such as silicon oxide (SiOx), silicon nitride (SiNx), silicon oxynitride (SiOxNy) (x>y), or silicon nitride oxide (SiNxOy) (x>y).

The conductive layer 12 is formed using a conductive material such as, for example, a metal element of silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu) or an alloy material or a compound material containing the element as its main component. A compound material such as a nitride compound, an oxygen compound, a carbon compound, or a halogen compound can be used for the conductive layer 12, and specifically, aluminum nitride, tungsten nitride, tantalum nitride, or the like can be used. The conductive layer 12 may have a single layer structure or a stack structure including one or more of the conductive materials, which can be formed by a sputtering method, a CVD method, or the like.

The first material layer 14 is formed using a material which can absorb the first laser beam 18. For example, a metal element such as chromium (Cr), molybdenum (Mo), nickel (Ni), titanium (Ti), cobalt (Co), copper (Cu), or aluminum (Al); or an alloy material or a compound material containing the element as its main component can be used. As the compound material, a nitrogen compound, an oxygen compound, a carbon compound, a halogen compound, or the like may be used. Alternatively, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Alternatively, zinc sulfide, silicon nitride, mercury sulfide, aluminum chloride, or the like can be used. The first material layer 14 is formed to have a single layer structure or stack structure including one or more of these materials by an evaporation method, a sputtering method, a CVD method, or the like. In addition, hydrogen or an inert gas (a rare gas such as helium (He), argon (Ar), krypton (Kr), neon (Ne), or xenon (Xe)) can be added to the first material layer 14. By addition of hydrogen or an inert gas into the first material layer 14, release or evaporation of a gas from the first material layer 14 can become easier to be caused when laser beam irradiation is performed later. The first material layer 14 is preferably formed using a material having a boiling point or a sublimation point lower than a melting point of the conductive layer 12 which is below the first material layer 14. Formation of the first material layer 14 using such a material can prevent damage to the conductive layer 12 positioned below in laser ablation.

The second material layer 16 is formed using a material which can absorb the second laser beam 20 and which can transmit the first laser beam 18. For example, an inorganic insulating material such as silicon oxide, silicon nitride, silicon oxynitride, or silicon nitride oxide; an organic insulating material such as polyimide, acrylic, polyamide, polyimide-amide, benzocyclobutene, or epoxy resin; or the like can be used. The second material layer 16 is formed using a single layer structure or stack structure including one or more of the materials by a sputtering method, a CVD method, a coating method, or the like.

The first laser beam 18 has characteristics of having a wavelength that is absorbed by the first material layer 14 and also having energy with such a level that can ablate a part or all of the region irradiated with an overlap part of the first laser beam 18 and the second laser beam 20. The oscillation wavelength of the first laser beam 18 is preferably in an absorption wavelength range of the first material layer 14. The oscillation wavelength of the first laser beam 18 is more preferably longer than the wavelength of visible light (here, including the wavelength of visible light), and specifically a wavelength of 400 nm or longer is desirable.

As mentioned above, the wavelength of the first laser beam 18 is determined in consideration of the material which forms the first material layer 14. The following lasers can be used for producing the first laser beam 18, for example: an excimer laser such as a KrF, ArF, or XeCl laser; a gas laser such as a He, He—Cd, Ar, or He—Ne laser; a solid-state laser using, as a medium, single crystalline YAG, YVO$_4$, forsterite (Mg$_2$SiO$_4$), YAlO$_3$, or GdVO$_4$, or polycrystalline (ceramic) YAC, Y$_2$O$_3$, YVO$_4$, YAlO$_3$, or GdVO$_4$, which is doped with one or more of Nd, Yb, Cr, Ti, Ho, Er, Tm, and Ta as a dopant; a semiconductor laser such as a GaN, GaAs, GaAlAs, or InGaAsP laser; a picosecond laser; or a femtosecond laser. By appropriately setting the oscillation wavelength of these lasers, the first laser beam 18 with a desired wavelength can be obtained. Here, the picosecond laser is a laser oscillator with a pulse width of picoseconds ($10^{-12}$ seconds to $10^{-10}$ seconds). The femtosecond laser is a laser oscillator with a pulse width of femtoseconds ($10^{-15}$ seconds to $10^{-13}$ seconds). In the case where the first laser beam 18 is set to have a wavelength of 400 nm or longer, a He—Cd laser beam (440 nm); a He—Ne laser beam (632.8 nm); an Ar laser beam (488 nm, 514.5 nm); a fundamental wave (1054 nm to 1064 nm) of a solid-state laser such as a YAG laser, a $Y_2O_3$ laser, a $YVO_4$ laser, a $YAlO_3$ laser, or a $GdVO_4$ laser; a second harmonic wave of the solid-state laser (527 nm to 532 nm); a GaAlAs laser beam (780 nm); or the like which has a long oscillation wavelength in a region of 400 nm or longer is preferably used. Note that any of a continuous wave laser beam or a pulsed laser beam may be used for the first laser beam 18.

The second laser beam 20 has characteristics of having a wavelength that is absorbed by the second material layer 16 and also having energy with such a level that does not cause an irreversible change of the irradiation object. The oscillation wavelength of the second laser beam 20 is preferably in the absorption wavelength range of the second material layer 16. The oscillation wavelength of the second laser beam 20 is more preferably at a level of a wavelength of ultraviolet rays, which is shorter than the wavelength of visible light (here, not including the wavelength of visible light), and specifically a wavelength of 400 nm or shorter is desirable.

The wavelength of the second laser beam 20 is determined in consideration of the material which forms the second material layer 16. The following lasers can be used for producing the second laser beam 20, for example: an excimer laser such as a KrF, ArF, XeCl, or XeF laser; a gas laser such as a He, He—Cd, Ar, or He—Ne laser; a solid-state laser using, as a medium, single crystalline YAG, $YVO_4$, YLF, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, which is doped with one or more of Nd, Yb, Cr, Ti, Ho, Er, Tm, and Ta as a dopant; a semiconductor laser such as a GaN, GaAs, GaAlAs, or InGaAsP laser; a picosecond laser; or a femtosecond laser. By appropriately setting the oscillation wavelength of these lasers, the second laser beam 20 with a desired wavelength can be obtained. Here, the picosecond laser is a laser oscillator with a pulse width of picoseconds ($10^{-12}$ seconds to $10^{-10}$ seconds). The femtosecond laser is a laser oscillator with a pulse width of femtoseconds ($10^{-15}$ seconds to $10^{-13}$ seconds). In the case where the second laser beam 20 is set to have a wavelength of 400 nm or shorter, an ultraviolet laser having a long oscillation wavelength in a region of 400 nm or shorter is preferably used, and a XeF excimer laser beam (351 nm), a XeCl excimer laser beam (308 nm), a KrF excimer laser beam (248 nm), a ArF excimer laser beam (193 nm), a third harmonic wave of a YAG laser (355 nm), or the like is preferably used. Note that any of a continuous wave laser beam or a pulsed laser beam may be used for the second laser beam 20.

Figure 1B:
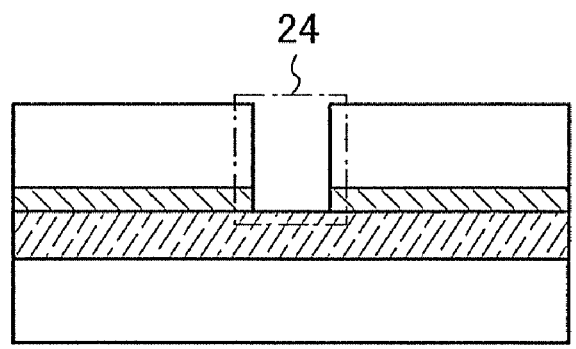

The irradiation object is irradiated with the first laser beam 18 and the second laser beam 20, the first laser beam 18 is absorbed by the first material layer 14, and the second laser beam 20 is absorbed by the second material layer 16. Irradiation is conducted so that the first laser beam 18 and the second laser beam 20 overlap. Note that the overlap irradiation region 22 includes a region in the second material layer 16 irradiated with an overlap part of the first laser beam 18 and the second laser beam 20 and a region in the first material layer 14, which corresponds to the region irradiated with the overlap part of the first laser beam 18 and the second laser beam 20 in the second material layer 16 (FIG. 1A). The overlap irradiation region 22 of the first material layer 14 is ablated and removed together with the overlap irradiation region 22 of the upper second material layer 16. Thus, an opening 24 is formed. At a bottom of the opening 24, the conductive layer 12 is exposed (FIG. 1B).

By irradiation of the irradiation object with the second laser beam 20, the second material layer 16 is heated. Then, irradiation with the first laser beam 18 is conducted so that the first laser beam 18 overlaps with the second laser beam 20, and a part of the irradiation object (overlap irradiation region 22) is ablated to form an opening. At this time, since the region irradiated with the second laser beam 20 in the second material layer 16 is heated beforehand, bonding (including chemical bonding) of the material which forms the heated region of the second material layer 16 is weak and the heated region is in a state of being ablated easily. Therefore, when irradiation of the first laser beam 18 is conducted so that the first laser beam 18 overlaps with the second laser beam 20, a part of the irradiation object can be easily ablated.

In addition, since bonding of the material which forms the second material layer 16 can be weakened in the region irradiated with the second laser beam 20, energy of the first laser beam 18 can be made low. Accordingly, damage to a layer or substrate below the first material layer 14 owing to laser beam irradiation can be prevented.

Irradiation of the first laser beam 18 and the second laser beam 20 may take either way of (1) and (2): (1) irradiation with the first laser beam 18 is conducted while irradiation with the second laser beam 20 is conducted, (2) irradiation with the first laser beam 18 is conducted simultaneously with irradiation with the second laser beam 20.

Figure 3A:
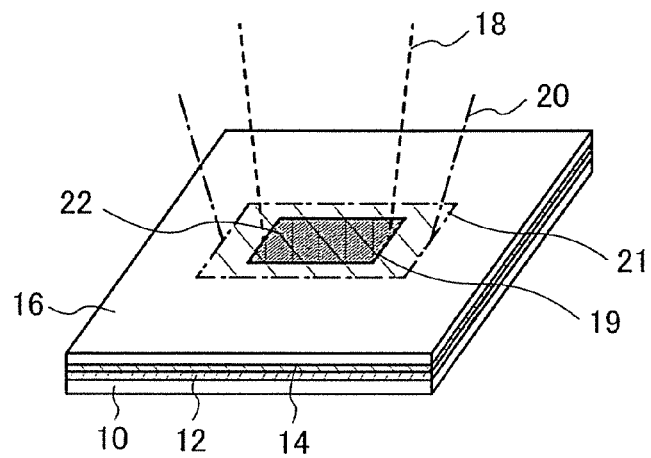
FIGS. 3A to 3C are conceptual diagrams for explaining the present invention.

Here, a perspective view of FIG. 1A is shown in FIG. 3A. In FIG. 3A, a first beam spot 19 is formed by the first laser beam 18 and a second beam spot 21 is formed by the second laser beam 20 on the irradiation object. Here, an area S1 of the first beam spot 19 is smaller than an area S2 of the second beam spot 21. That is, irradiation with the first laser beam 18 and the second laser beam 20 is appropriately adjusted to make S1<S2. In the irradiation object, the region (overlap irradiation region 22) irradiated with the overlap part of the first laser beam 18 and the second laser beam 20 is ablated. In FIG. 3A, the state of S1<S2 can be made easily when a beam diameter W1 of the first laser beam 18 is shorter than a beam diameter W2 of the second laser beam 20. The beam diameter in this specification is defined as a diameter of a beam having a beam intensity of $1/e^2$ level of a peak value when the energy intensity distribution of a cross section in a perpendicular direction with respect to the traveling direction of a laser beam (optical axis) is seen.

Irradiation is acceptable as long as the first laser beam and the second laser beam partially overlap, and is not limited to FIG. 1A. For example, laser beam irradiation may be conducted as shown in FIGS. 2A and 2B.

The description will be made of FIG. 2A. The irradiation object is the same as the one shown in FIG. 1A and has a structure where the conductive layer 12, the first material layer 14, and the second material layer 16 are sequentially stacked over the substrate 10. The irradiation object is irradiated with a first laser beam 30 and a second laser beam 32 from the second material layer 16 side so that the first laser beam 30 and the second laser beam 32 overlap. The region of the irradiation object irradiated with an overlap part of the first laser beam 30 and the second laser beam 32 is referred to as an overlap irradiation region 34.

The first laser beam 30 satisfies similar conditions to those of the first laser beam 18 of FIG. 1A. In other words, the first laser beam 30 has characteristics of having a wavelength that is absorbed by the first material layer 14 and also having energy with such a level that can ablate a part or all of the region irradiated with an overlap part of the first laser beam 30 and the second laser beam 32. Further, the second laser beam 32 also satisfies similar conditions to those of the second laser beam 20 of FIG. 1A, and has characteristics of having a wavelength that is absorbed by the second material layer 16 and also having energy with such a level that does not cause an irreversible change of the irradiation object. The irradiation object is irradiated with the first laser beam 30 and the second laser beam 32, the first laser beam 30 is absorbed by the first material layer 14, and the second laser beam 32 is absorbed by the second material layer 16.

Figure 2A:
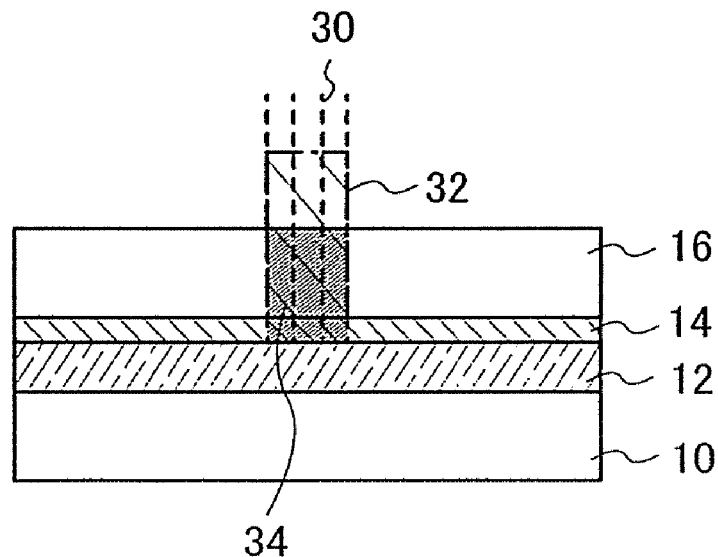
FIGS. 2A and 2B are conceptual diagrams for explaining the present invention.
Figure 2B:
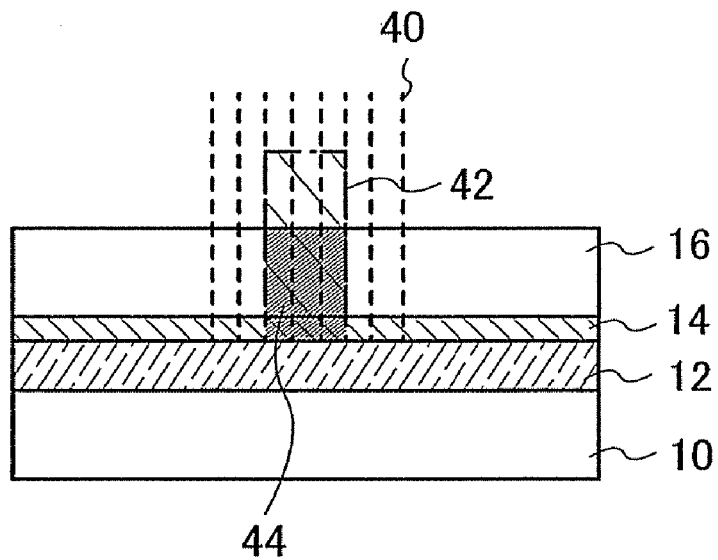
Figure 3B:
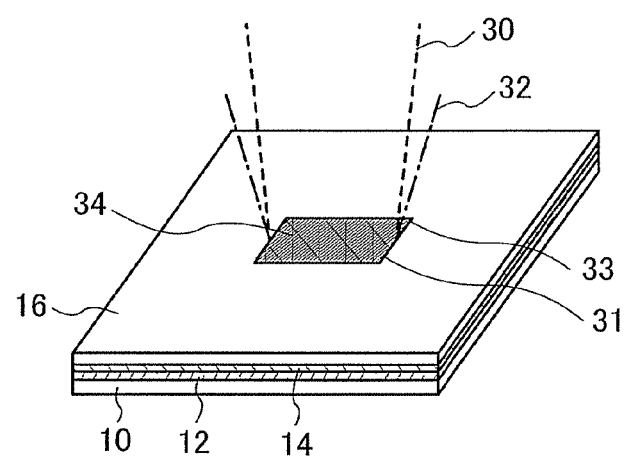

FIG. 3B is a perspective view of FIG. 2A. In FIG. 3B, a first beam spot 31 is formed by the first laser beam 30 and a second beam spot 33 is formed by the second laser beam 32 on the irradiation object. Here, an area S1 of the first beam spot 31 is almost equal to an area S2 of the second beam spot 33. That is, irradiation with the first laser beam 30 and the second laser beam 32 is appropriately adjusted to make S1≈S2. In the irradiation object, the region (overlap irradiation region 34) irradiated with an overlap part of the first laser beam 30 and the second laser beam 32 is ablated. In FIG. 3B, the state of S1≈S2 can be made easily when a beam diameter W1 of the first laser beam 30 is made equal to a beam diameter W2 of the second laser beam 32.

The irradiation object in FIG. 2B is also the same as the one shown in FIG. 1A, and has a structure where the conductive layer 12, the first material layer 14, and the second material layer 16 are sequentially stacked over the substrate 10. The irradiation object is irradiated with a first laser beam 40 and a second laser beam 42 from the second material layer 16 side so that the first laser beam 40 and the second laser beam 42 overlap. The region of the irradiation object irradiated with the overlap part of the first laser beam 40 and the second laser beam 42 is referred to as an overlap irradiation region 44.

The first laser beam 40 satisfies similar conditions to those of the first laser beam 18 of FIG. 1A. In other words, the first laser beam 40 has characteristics of having a wavelength that is absorbed by the first material layer 14 and also having energy with such a level that can ablate a part or all of the region irradiated with the overlap part of the first laser beam 40 and the second laser beam 42. Further, the second laser beam 42 also satisfies similar conditions to those of the second laser beam 20 of FIG. 1A, and has characteristics of having a wavelength that is absorbed by the second material layer 16 and also having energy with such a level that does not cause an irreversible change of the irradiation object. The irradiation object is irradiated with the first laser beam 40 and the second laser beam 42, the first laser beam 40 is absorbed by the first material layer 14, and the second laser beam 42 is absorbed by the second material layer 16.

Figure 3C:
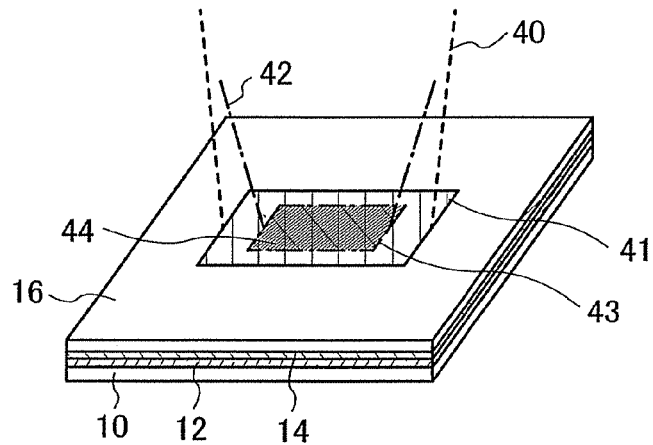

FIG. 3C is a perspective view of FIG. 2B. In FIG. 3C, a first beam spot 41 is formed by the first laser beam 40 and a second beam spot 43 is formed by the second laser beam 42 on the irradiation object. Here, an area S1 of the first beam spot 41 is larger than an area S2 of the second beam spot 43. That is, irradiation with the first laser beam 40 and the second laser beam 42 is appropriately adjusted to make S1>S2. In the irradiation object, the region (overlap irradiation region 44) irradiated with the overlap part of the first laser beam 40 and the second laser beam 42 is ablated. In FIG. 3C, the state of S1>S2 can be made easily when a beam diameter W1 of the first laser beam 40 is made larger than a beam diameter W2 of the second laser beam 42.

Although the beam spots formed on the irradiation objects are emphasized in FIGS. 3A to 3C, they are in fact formed to be much more minute with respect to the irradiation object.

In this embodiment mode, irradiation with the first laser beam and the second laser beam is preferably conducted in the state of S1<S2. The region of the irradiation object irradiated with the overlap part of the first laser beam and the second laser beam is ablated. In the irradiation object, the region of the second material layer 16 irradiated with the second laser beam is in a state of being ablated easily. When irradiation with the first laser beam and the second laser beam is conducted to make S1<S2, the first material layer and the second material layer in S1 is all ablated. When irradiation with the first laser beam and the second laser beam is conducted to make S1>S2, the first material layer and the second material layer in S2 is all ablated, but a region which is not ablated is left in S1. In consideration of damage to a layer or substrate below the first material layer 14, the region irradiated with the first laser beam is preferably as small as possible. Hence, the condition of S1<S2, where the region in the beam spot area S1 by the first laser beam can all ablated, is preferable since the first laser beam and the second laser beam can be used efficiently.

Figure 1C:
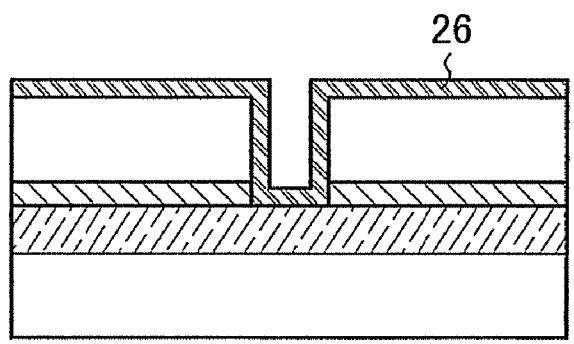

Next, a conductive layer 26 is formed in the opening 24. The conductive layer 26 is electrically connected to the conductive layer 12 (FIG. 1C). Further, in the case of forming the first material layer 14 using a conductive material, the conductive layer 26 is also electrically connected to the first material layer 14. Through the above-described process, an opening which electrically connects a conductive layer to another conductive layer can be formed in the irradiation object (the second material layer 16 and the first material layer 14, in this embodiment mode) without using a lithography technique that uses a photoresist.

By the present invention, an opening can be formed in a desired region without using a lithography step that uses a photoresist. Therefore, the lithography steps can be reduced or simplified; loss of a material such as a resist material or a developer can be prevented; and the number of photomasks that are necessary can be reduced. By irradiation with two kinds of laser beams that are absorbed by different layers (a layer ablated (first material layer) and a layer stacked thereover (second material layer)) which form an irradiation object so that the laser beams overlap, damage to another layer can be prevented and an opening can be formed easily. Accordingly, reduction in manufacturing cost and improvement in throughput can be achieved in manufacture of a semiconductor device. In addition, improvement in reliability of a semiconductor device can be achieved.

Embodiment Mode 2

Embodiment Mode 2 will describe a method of forming an opening which electrically connects conductive layers to each other or connects a conductive layer to a semiconductor layer in an irradiation object. Embodiment Mode 1 shows an example where an opening is formed to penetrate the first material layer and the second material layer stacked over the conductive layer and the conductive layer is exposed at the bottom of the opening. In this embodiment mode, another example of forming an opening which reaches a conductive layer is shown. In addition, an example of forming an opening which reaches a semiconductor layer is also shown.

Figure 7A:
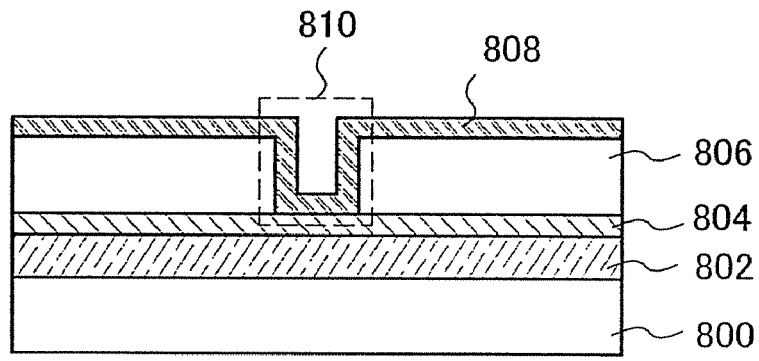
FIGS. 7A to 7C are conceptual diagrams for explaining the present invention.
Figure 7B:
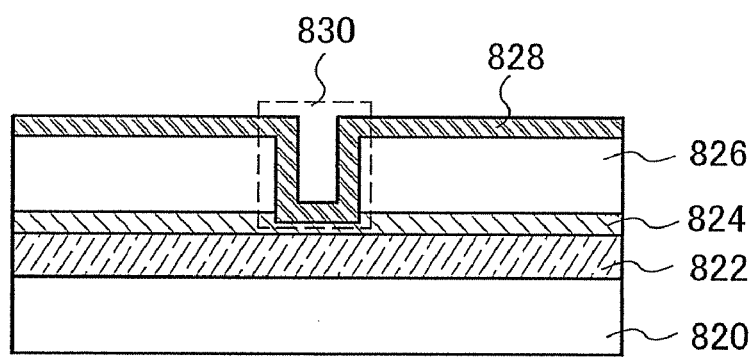
Figure 7C:
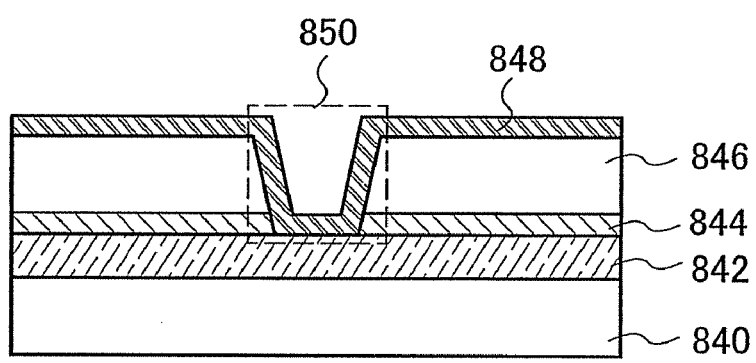

FIGS. 7A to 7C show structures, in each of which an opening reaching a conductive layer or a first material layer is formed in an irradiation object which is formed by sequentially stacking the conductive layer, the first material layer, and a second material layer over a substrate. In addition, a conductive layer is formed in the opening, and the conductive layer formed in the opening is electrically connected to the conductive layer formed over the substrate.

In FIGS. 7A to 7C, the opening is formed in the irradiation object by ablation using laser beam irradiation as described in Embodiment Mode 1. In more detail, the irradiation object is irradiated with a first laser beam having a wavelength absorbed by the first material layer that is stacked over the conductive layer and a second laser beam having a wavelength absorbed by the second material layer that is an uppermost surface layer of the irradiation object so that the first laser beam and the second laser beam overlap, and a part or all of the region irradiated with an overlap part of the laser beams is ablated to form an opening. The first laser beam has energy with such a level that can ablate a part or all of the region irradiated with the overlap part of the first laser beam and the second laser beam. The second laser beam has energy with such a level that does not cause an irreversible change of the irradiation object. Energy levels of the first laser beam and the second laser beam, materials which form the first material layer and the second material layer, and the like are appropriately selected, so that a portion of the irradiation object which is removed by ablation can be selected.

As described above, the irradiation objects in FIGS. 7A to 7C each have a structure where the conductive layer, the first material layer, and the second material layer are sequentially stacked over the substrate. The substrate may be a glass substrate, a quartz substrate, a sapphire substrate, a ceramic substrate, a semiconductor substrate, or the like. The conductive layer stacked over the substrate may be formed using a conductive material. For example, the conductive layer can be formed using a metal element such as silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu) or an alloy material or a compound material containing the metal element as its main component. A base insulating layer serving as a protective layer may be formed between the substrate and the conductive layer. The base insulating layer may be formed using an insulating material such as silicon oxide, silicon nitride, silicon oxynitride, or silicon nitride oxide. Formation of the base insulating layer can prevent damage to the substrate owing to laser beam irradiation.

The first material layer is formed using a material that can absorb the first laser beam. For example, a conductive material containing chromium (Cr), molybdenum (Mo), nickel (Ni), titanium (Ti), cobalt (Co), copper (Cu), aluminum (Al), or the like; or a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. The first material layer is preferably formed using a material having a boiling point or a sublimation point lower than a melting point of the conductive layer which is positioned below the first material layer. Formation of the first material layer using such a material can prevent damage to the conductive layer positioned below in laser ablation.

The second material layer is formed using a material which can absorb the second laser beam and which is a light-transmitting inorganic insulating material or a light-transmitting organic insulating material capable of transmitting the first laser beam. Hereinafter, specific description is made with reference to the drawings.

FIG. 7A shows an example where in the first material layer and the second material layer which are stacked over the conductive layer, only the second material layer is removed by laser ablation. The irradiation object shown in FIG. 7A has a structure where a conductive layer 802, a first material layer 804, and a second material layer 806 are sequentially stacked over a substrate 800, and an opening 810 is formed to penetrate only the second material layer 806. At a bottom of the opening 810, the first material layer 804 is exposed. In the opening 810, a conductive layer 808 is formed and in contact with the first material layer 804. In the case of FIG. 7A, the first material layer 804 is formed using a conductive material. Thus, the first material layer 804 is electrically connected to the conductive layer 808.

FIG. 7B shows an example where in the first material layer and the second material layer which are stacked over the conductive layer, the second material layer and an upper portion of the first material layer are removed by laser ablation. The irradiation object shown in FIG. 7B has a structure where a conductive layer 822, a first material layer 824, and a second material layer 826 are sequentially stacked over a substrate 820, and an opening 830 is formed to penetrate the second material layer 826 and to remove the upper portion of the first material layer 824 and leave the lower portion thereof. At a bottom of the opening 830, the first material layer 824 is exposed. In the first material layer 824, the thickness of the region where the opening 830 is formed is thinner than that of other regions. A conductive layer 828 is formed in the opening 830 and in contact with the first material layer 824. In the case of FIG. 7B, similarly to FIG. 7A, the first material layer 824 is formed using a conductive material. Thus, the first material layer 824 is electrically connected to the conductive layer 828.

FIG. 7C shows an example where an opening formed in the irradiation object has a side surface with a tapered shape. The irradiation object shown in FIG. 7C has a structure where a conductive layer 842, a first material layer 844, and a second material layer 846 are sequentially stacked over a substrate 840. An opening 850 is formed in the irradiation object. Here, an example where the opening 850 is formed to penetrate the second material layer 846 and the first material layer 844 is shown. Note that the opening 850 may be formed so as to penetrate only the second material layer 846 or so as to penetrate the second material layer 846 and remove an upper portion of the first material layer 844 and leave a lower portion thereof.

In FIG. 7C, the opening 850 formed in the irradiation object has a tapered shape, and the side surface of the opening 850 is tapered to the bottom. A conductive layer 848 is formed in the opening 850 and in contact with the conductive layer 842. In addition, the conductive layer 848 is also in contact with the first material layer 844 at the side surface of the opening 850. Thus, the conductive layer 842 is electrically connected to the conductive layer 848. In the case where the first material layer 844 is formed using a conductive material, the conductive layer 848 is also electrically connected to the first material layer 844.

Next, an example where an opening reaching a conductive layer or an opening reaching a semiconductor layer is formed in the irradiation object will be described. FIGS. 8A to 8D each show an irradiation object, in which a first material layer and a second material layer are sequentially stacked over a substrate, with a structure where a opening reaching the first material layer is formed. In addition, a structure where a conductive layer is formed in the opening and is electrically connected to the first material layer is shown.

The openings in the irradiation object in FIGS. 8A to 8D are also formed by ablation using laser beam irradiation as described in Embodiment Mode 1. In more detail, the irradiation object is irradiated with a first laser beam having a wavelength that is absorbed by the first material layer and a second laser beam having a wavelength that is absorbed by the second material layer that is an uppermost surface layer of the irradiation object so that the first laser beam and the second laser beam overlap, and a part or all of the region irradiated with an overlap part of the laser beams is ablated to form an opening. The first laser beam has energy with such a level that can ablate a part or all of the region irradiated with the overlap part of the first laser beam and the second laser beam. The second laser beam has energy with such a level that does not cause an irreversible change of the irradiation object. Energy levels of the first laser beam and the second laser beam, materials which form the first material layer and the second material layer, and the like are appropriately selected, so that a portion of the irradiation object which is removed by ablation can be selected.

The irradiation objects in FIGS. 8A to 8D each have a structure where the first material layer and the second material layer are sequentially stacked over the substrate. The substrate, the first material layer, and the second material layer described in FIGS. 7A to 7C can be used for those in FIGS. 8A to 8D. The substrate may be a glass substrate, a quartz substrate, a sapphire substrate, a ceramic substrate, a semiconductor substrate, or the like. The first material layer may be formed using a conductive material, a semiconductor material, or the like which can absorb the first laser beam. The first material layer is preferably formed using a material having a boiling point or a sublimation point lower than a melting point of the conductive layer which is positioned below the first material layer. For example, a conductive material containing chromium (Cr), molybdenum (Mo), nickel (Ni), titanium (Ti), cobalt (Co), copper (Cu), aluminum (Al), or the like; or a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. The second material layer is formed using an insulating material that can absorb the second laser beam and transmit the first laser beam. For example, a light-transmitting inorganic insulating material such as silicon oxide or silicon nitride, or a light-transmitting organic insulating material such as acrylic resin or epoxy resin can be used for the second material layer.

In the case where a light-transmitting substrate is used as the substrate in FIGS. 8A to 8D, the first material layer can be irradiated with the first laser beam from the substrate side. In this case, the second material layer need not be the material that transmits the first laser beam. Further, a base insulating layer may be formed using an inorganic insulating material such as silicon oxide or silicon nitride between the substrate and the first material layer. The base insulating layer serves as a protective layer and can prevent damage to the substrate owing to laser ablation. Hereinafter, specific explanation will be made.

Figure 8A:
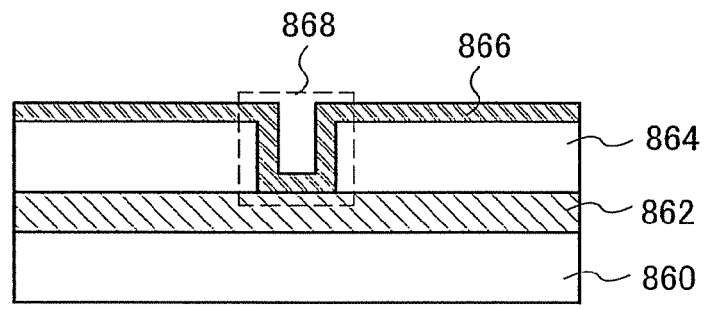
FIGS. 8A to 8D are conceptual diagrams for explaining the present invention.

FIG. 8A shows an example where in the first material layer and the second material layer which are stacked over the substrate, only the second material layer is removed by laser ablation. The irradiation object shown in FIG. 8A has a structure where a first material layer 862 and a second material layer 864 are sequentially stacked over a substrate 860, and an opening 868 is formed to penetrate only the second material layer 864. At a bottom of the opening 868, the first material layer 862 is exposed. Then, a conductive layer 866 is formed in the opening 868 and in contact with the first material layer 862. When the first material layer 862 is formed using a conductive material, a structure in which the conductive layers are electrically connected to each other in the opening 868 is formed. When the first material layer 862 is formed using a semiconductor material, a structure in which the conductive layer is electrically connected to the semiconductor layer in the opening 868 is formed.

Figure 8B:
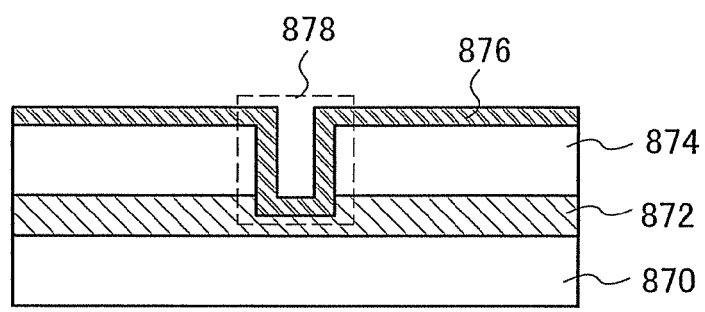

FIG. 8B shows an example where in the first material layer and the second material layer which are stacked over the substrate, the second material layer and an upper portion of the first material layer are removed by laser ablation. The irradiation object shown in FIG. 8B has a structure where a first material layer 872 and a second material layer 874 are sequentially stacked over a substrate 870, and an opening 878 is formed to penetrate the second material layer 874 and to remove the upper portion of the first material layer 872 and leave the lower portion thereof. At a bottom of the opening 878, the first material layer 872 is exposed. In the first material layer 872, the thickness of the region where the opening 878 is formed is thinner than that of other regions. A conductive layer 876 is formed in the opening 878 and in contact with the first material layer 872 at the bottom and a side surface of the opening 878. At this time, when the first material layer 872 is formed using a conductive material, a structure where the conductive layers are electrically connected to each other in the opening 878 is formed. When the first material layer 872 is formed using a semiconductor material, a structure where the conductive layer is electrically connected to the semiconductor layer in the opening 878 is formed.

Figure 8C:
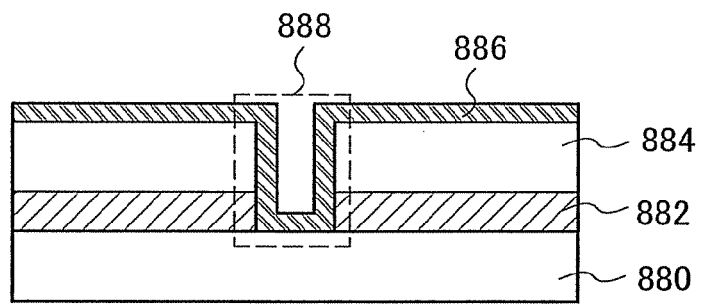

FIG. 8C shows an example where in the first material layer and the second material layer which are stacked over the substrate, the second material layer and the first material layer are removed by laser ablation. The irradiation object shown in FIG. 8C has a structure where a first material layer 882 and a second material layer 884 are sequentially stacked over a substrate 880, and an opening 888 is formed to penetrate the second material layer 884 and the first material layer 882. At a side surface of the opening 888, the first material layer 882 is exposed. A conductive layer 886 is formed in the opening 888 and in contact with the first material layer 882 at the side surface of the opening 888. At this time, if the first material layer 882 is formed using a conductive material, a structure where the conductive layers are electrically connected to each other in the opening 888 is formed. When the first material layer 882 is formed using a semiconductor material, a structure where the conductive layer is electrically connected to the semiconductor layer in the opening 888 is formed.

Figure 8D:
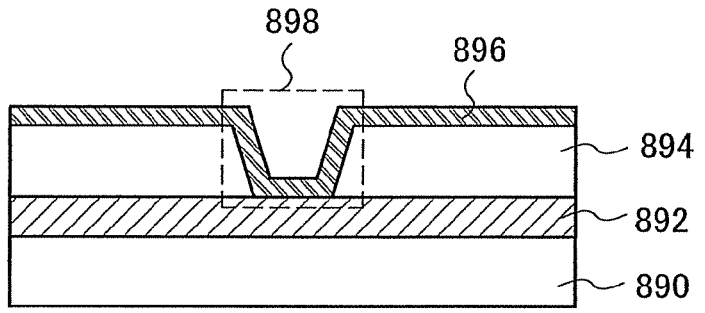

FIG. 8D shows an example where an opening formed in the irradiation object has a side surface with a tapered shape. The irradiation object shown in FIG. 8D has a structure where a first material layer 892 and a second material layer 894 are sequentially stacked over a substrate 890. An opening 898 is formed in the irradiation object. Here, the opening 898 is formed to penetrate the second material layer 894. Note that the opening 898 may be formed so as to penetrate the second material layer 894 and to remove an upper portion of the first material layer 892 and leave a lower portion thereof, or so as to penetrate both the second material layer 894 and the first material layer 892.

In FIG. 8D, the opening 898 formed in the irradiation object has a tapered shape, and the side surface of the opening 898 is tapered to the bottom. A conductive layer 896 is formed in the opening 898 and in contact with the first material layer 892. When the first material layer 892 is formed using a conductive material, a structure where the conductive layers are electrically connected to each other in the opening 898 is formed. When the first material layer 892 is formed using a semiconductor material, a structure where the conductive layer is electrically connected to the semiconductor layer in the opening 898 is formed.

By the present invention, an opening with a desired pattern can be formed in a desired region without using a lithography step that uses a photoresist. By irradiation of an irradiation object including stacked layers with two kinds of laser beams that are absorbed by the different layers so that the laser beams overlap, processing of the irradiation object by laser ablation can be easily conducted without damage to another layer. Accordingly, reduction in manufacturing cost and improvement in throughput can be achieved in manufacture of a semiconductor device. In addition, a semiconductor device with high reliability can be manufactured.

In the present invention, the structure of the irradiation object, materials which form the first material layer and the second material layer, energy levels of the first laser beam and the second laser beam, and the like are appropriately selected, so that openings with various patterns can be formed.

This embodiment mode can be freely combined with the above-described Embodiment Mode 1.

Embodiment Mode 3

Embodiment Mode 3 will describe a structural example of a laser processing apparatus of the present invention.

Figure 11:
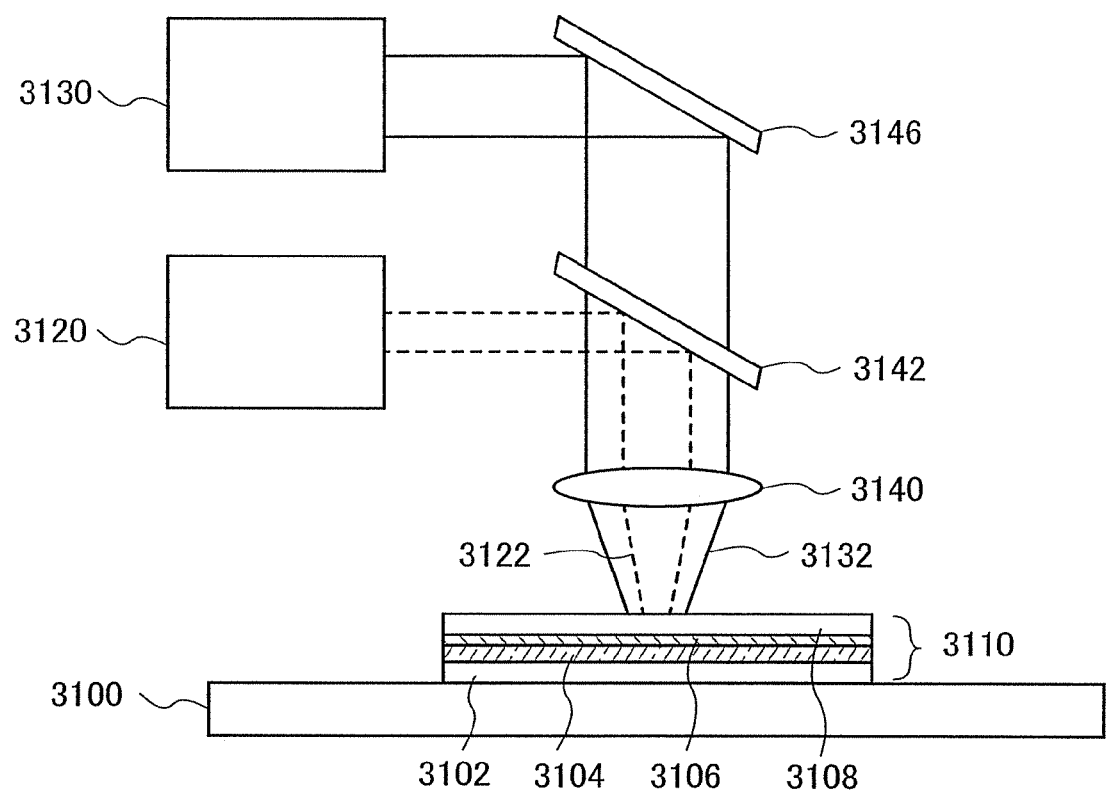
FIG. 11 explains a laser processing apparatus of the present invention.

FIG. 11 is a pattern diagram showing a structure of a laser processing apparatus according to the present invention. The laser processing apparatus according to the present invention includes a first laser 3120 and a second laser 3130. A first laser beam 3122 is emitted from the first laser 3120. A second laser beam 3132 is emitted from the second laser 3130. The traveling direction, the polarization direction, and the like of the laser beams (first laser beam 3122 and second laser beam 3132) emitted from the lasers (first laser 3120 and second laser 3130) are controlled by an optical system which is a combination of mirrors and a condenser lens, so that an irradiation object is irradiated with the overlapping laser beams. Specifically, the traveling direction, polarization direction, and the like of the first laser beam 3122 emitted from the first laser 3120 and the second laser beam 3132 emitted from the second laser 3130 are controlled by a mirror 3142 and a mirror 3146; the laser beams are condensed by a condenser lens 3140; and an irradiation object 3110 is irradiated with the laser beams. At this time, the first laser beam 3122 and the second laser beam 3132 are controlled by the mirrors and the condenser lens so as to irradiate the irradiation object 3110 in a state where the first laser beam 3122 and the second laser beam 3132 overlap each other. The irradiation object 3110 is held by a stage 3100 and moved to a desired position.

The irradiation object 3110 has a structure where a conductive layer 3104, a first material layer 3106, and a second material layer 3108 are sequentially stacked over a substrate 3102. It is acceptable that the conductive layer 3104 is not provided, and an insulating layer or the like serving as a protective layer may be provided on the substrate 3102. In this case, the insulating layer may be formed using silicon oxide, silicon nitride, silicon oxynitride, silicon nitride oxide, or the like.

The materials described in Embodiment Modes 1 and 2 for the substrate, the conductive layer, the first material layer, and the second material layer can be used for the substrate 3102, the conductive layer 3104, the first material layer 3106, and the second material layer 3108. For example, the substrate 3102 may be a glass substrate, a quartz substrate, a sapphire substrate, a ceramic substrate, a semiconductor substrate, or the like. The conductive layer 3104 can be formed using a conductive material containing silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu). The first material layer 3106 can be formed using a material that can absorb the first laser beam 3122. The second material layer 3108 can be formed using a material that can absorb the second laser beam and transmit the first laser beam. The first material layer 3106 is preferably formed using a material (for example, chromium having a relatively low melting point or the like) having a boiling point or a sublimation point lower than a melting point of the conductive layer 3104 which is positioned below the first material layer 3106. In this embodiment mode, a glass substrate is used as the substrate 3102. The conductive layer 3104 is formed using tungsten; the first material layer 3106 is formed using chromium; and the second material layer 3108 is formed using silicon oxide.

The first laser beam 3122 has a wavelength that is absorbed by the first material layer 3106. In addition, the first laser beam 3122 has energy with such a level that can ablate the region irradiated with an overlap part of the first laser beam 3122 and the second laser beam 3132. The oscillation wavelength of the first laser 3120 emitting the first laser beam 3122 is preferably in the absorption wavelength range of the first material layer 3106. The oscillation wavelength of the first laser 3120 is more preferably longer than the wavelength of visible light (here, including the wavelength of visible light), and specifically a wavelength of 400 nm or longer is desirable.

The following lasers can be used as the first laser 3120, for example: an excimer laser such as a KrF, ArF, or XeCl laser; a gas laser such as a He, He—Cd, Ar, or He—Ne laser; a solid-state laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, which is doped with one or more of Nd, Yb, Cr, Ti, Ho, Er, Tm, and Ta as a dopant; a semiconductor laser such as a GaN, GaAs, GaAlAs, or InGaAsP laser; a picosecond laser; or a femtosecond laser. By appropriately setting the oscillation wavelength of these lasers, the first laser beam 3122 with a desired wavelength can be obtained. A visible laser having a long oscillation wavelength in a region of 400 nm or longer is preferably used, and a He—Cd laser (440 nm); a He—Ne laser (632.8 nm); an Ar laser (488 nm, 514.5 nm); a solid-state laser such as a YAG laser, a Y$_2$O$_3$ laser, a YVO$_4$ laser, a YAlO$_3$ laser, or a GdVO$_4$ laser; a GaAlAs laser (780 nm); or the like is desirable. Note that the picosecond laser is a laser oscillator with a pulse width of picoseconds ($10^{-12}$ seconds to $10^{-10}$ seconds). The femtosecond laser is a laser oscillator with a pulse width of femtoseconds ($10^{-15}$ seconds to $10^{-13}$ seconds). Note that any of a continuous wave laser beam or a pulsed laser beam may be used for the first laser beam 3122. In this embodiment mode, a YAG laser is used as the first laser 3120.

The second laser beam 3132 has a wavelength that is absorbed by the second material layer 3108. In addition, the second laser beam 3132 has energy with such a level that does not cause an irreversible change of the irradiation object. The oscillation wavelength of the second laser 3130 emitting the second laser beam 3132 is preferably in the absorption wavelength range of the second material layer 3108. The oscillation wavelength of the second laser 3130 is more preferably at a level of a wavelength of ultraviolet rays, which is shorter than the wavelength of visible light (here, not including the wavelength of visible light), and specifically a wavelength of 400 nm or shorter is desirable.

As the second laser 3130, any of the lasers exemplified as the first laser 3120 can be used, and by appropriately setting the oscillation wavelength of the lasers, the second laser beam 3132 with a desired wavelength can be emitted. Preferably, an ultraviolet laser having a long oscillation wavelength in a region of 400 nm or shorter is used, and a XeF excimer laser beam (351 nm), a XeCl excimer laser beam (308 nm), a KrF excimer laser beam (248 nm), a ArF excimer laser beam (193 nm), a third harmonic wave of YAG laser (355 nm), or the like is preferable. In this embodiment mode, a KrF excimer laser is used as the second laser 3130.

The first laser beam 3122 emitted from the first laser 3120 is reflected by the mirror 3142 and then condensed by the condenser lens 3140, so that the irradiation object 3110 is irradiated and the first laser beam 3122 is absorbed by the first material layer 3106. The second laser beam 3132 emitted from the second laser 3130 is reflected by the mirror 3146, passes through the mirror 3142, and then is condensed by the condenser lens 3140, so that the irradiation object 3110 is irradiated and the second laser beam 3132 is absorbed by the second material layer 3108. The irradiation object 3110 is irradiated with the first laser beam 3122 and the second laser beam 3132 so that the first laser beam 3122 and the second laser beam 3132 overlap on the irradiation object 3110. A part or all of the region irradiated with an overlap part of the first laser beam 3122 and the second laser beam 3132 in the irradiation object 3110 is ablated to form an opening. At this time, the irradiation object 3110 is moved by the stage 3100 for processing a desired region.

Figure 32:
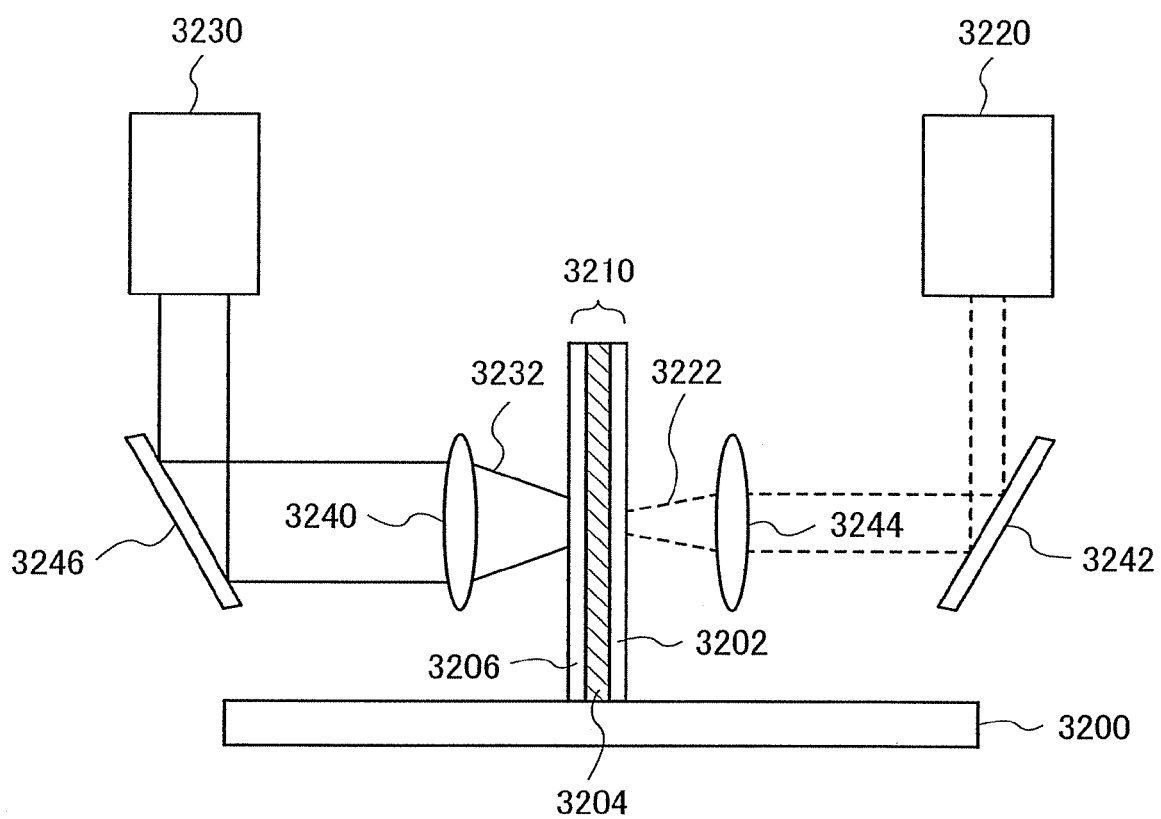
FIG. 32 explains a laser processing apparatus of the present invention.

The structure shown by the pattern diagram in FIG. 32 can be employed as the structure of the laser processing apparatus according to the present invention. The laser processing apparatus shown in FIG. 32 includes a first laser 3220 and a second laser 3230. A first laser beam 3222 is emitted from the first laser 3220. A second laser beam 3232 is emitted from the second laser 3230. The traveling direction, the polarization direction, and the like of the laser beams (first laser beam 3222 and second laser beam 3232) emitted from the lasers (first laser 3220 and second laser 3230) are controlled by optical systems each of which is a combination of a mirror and a condenser lens (first optical system in which a mirror 3242 and a condenser lens 3244 are combined, and a second optical system in which a mirror 3246 and a condenser lens 3240 are combined), so that an irradiation object is irradiated with the overlapping laser beams. Specifically, the traveling direction, polarization direction, and the like of the first laser beam 3222 emitted from the first laser 3220 and the second laser beam 3232 emitted from the second laser 3230 are controlled by the mirror 3242 and the mirror 3246; the laser beams are condensed by the condenser lens 3244 and the condenser lens 3240; and an irradiation object 3210 is irradiated with the laser beams. At this time, the first laser beam 3222 and the second laser beam 3232 are controlled by the mirrors and the condenser lenses so as to irradiate the irradiation object 3210 in a state where the first laser beam 3222 and the second laser beam 3232 overlap each other. The irradiation object 3210 is held by a stage 3200 and moved to a desired position.

The irradiation object 3210 has a structure where a first material layer 3204 and a second material layer 3206 are sequentially stacked over a substrate 3202. As the substrate 3202, a substrate which can transmit the first laser beam 3222 is used. For example, a light-transmitting substrate such as a glass substrate or a quartz substrate is used. A light-transmitting insulating layer serving as a protective layer may be provided in contact with the substrate 3202. For example, the insulating layer may be formed using an inorganic insulating material such as silicon oxide or silicon nitride.

For the first material layer 3204, the same material as that of the first material layer 3106 shown in FIG. 11 may be used, and the first material layer 3204 is formed using a material that can absorb the first laser beam 3222. For the second material layer 3206, the same material as that of the second material layer 3108 shown in FIG. 11 may be used, and the second material layer 3206 is formed using a material that can absorb the second laser beam 3232. Since the irradiation object 3210 is irradiated with the first laser beam 3222 from the substrate 3202 side in FIG. 32, a material that does not transmit the first laser beam 3222 can be used for the second material layer 3206.

The same laser beam and laser as the first laser beam 3122 and the first laser 3120 shown in FIG. 11 may be used for the first laser beam 3222 and the first laser 3220 that emits the first laser beam 3222, and description thereof is omitted. Similarly, the same laser beam and laser as the second laser beam 3132 and the second laser 3130 shown in FIG. 11 may be used for the second laser beam 3232 and the second laser 3230 that emits the second laser beam 3232.

The first laser beam 3222 emitted from the first laser 3220 is reflected by the mirror 3242 and then condensed by the condenser lens 3244; the irradiation object 3210 is irradiated with the first laser beam 3222 from the substrate 3202 side; and the first laser beam 3222 is absorbed by the first material layer 3204. On the other hand, the second laser beam 3232 emitted from the second laser 3230 is reflected by the mirror 3246 and then condensed by the condenser lens 3240; the irradiation object 3210 is irradiated with the second laser beam 3232 from the second material layer 3206 side; and the second laser beam 3232 is absorbed by the second material layer 3206. The irradiation is conducted so that the first laser beam 3222 and the second laser beam 3232 overlap at the irradiation object 3210. A part or all of the region irradiated with an overlap part of the first laser beam 3222 and the second laser beam 3232 in the irradiation object 3210 is ablated to form an opening. At this time, the irradiation object 3210 is held perpendicular to the stage 3200 and moved to a desired position by the stage 3200 for processing a desired region.

A big difference between FIGS. 11 and 32 is that whether irradiation with the first laser beam is conducted from the substrate side or the second material layer side. In other words, in the structure of the laser processing apparatus shown in FIG. 32, the irradiation with the first laser beam and irradiation with the second laser beam are conducted from opposing directions. In the case of irradiation with the first laser beam from the substrate side, the substrate needs to transmit the first laser beam. On the other hand, in the case of irradiation with the first laser beam from the second material layer side, the second material layer needs to transmit the first laser beam.

Figure 33:
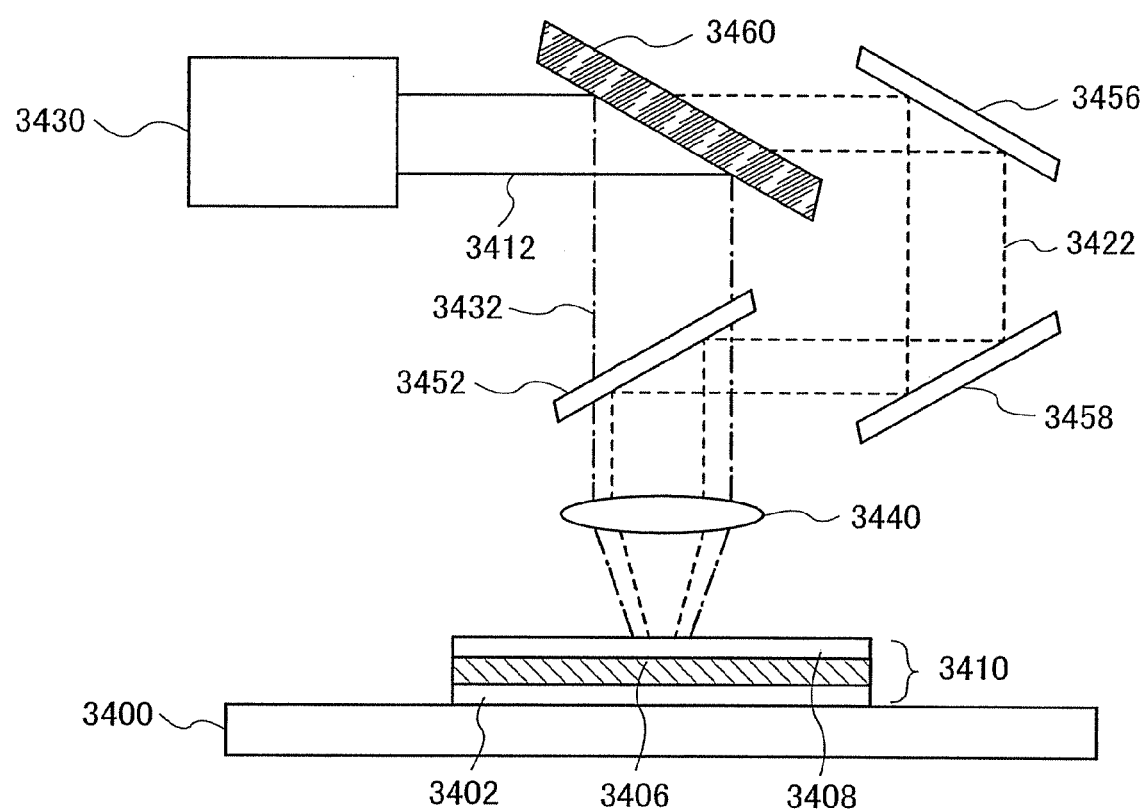
FIG. 33 explains a laser processing apparatus of the present invention.

For the structure of the laser processing apparatus according to the present invention, the structure shown in the pattern diagram of FIG. 33 can also be employed. The laser processing apparatus shown in FIG. 33 includes a solid-state laser 3430. A laser beam 3412 with a fundamental wave is emitted from the solid-state laser 3430. The laser beam 3412 is separated into a laser beam 3422 with a second harmonic wave and a laser beam 3432 with a third harmonic wave by a beam splitter 3460. Hereinafter, the laser beam 3412 with a fundamental wave is referred to as a fundamental wave laser beam 3412; the laser beam 3422 with a second harmonic wave is referred to as a first laser beam 3422; and the laser beam 3432 with a third harmonic wave is referred to as a second laser beam 3432. The traveling direction, polarization direction, and the like of the laser beams (first laser beam 3422 and second laser beam 3432) separated by the beam splitter 3460 are controlled by an optical system which is a combination of mirrors and a condenser lens, and the irradiation object is irradiated with the laser beams so that the laser beams overlap with each other. Specifically, the traveling direction, polarization direction, and the like of the first laser beam 3422 and the second laser beam 3432, which are emitted from the solid-state laser 3430 and separated by the beam splitter 3460, are controlled by a mirror 3452, a mirror 3456, and a mirror 3458; the laser beams are condensed by a condenser lens 3440; and an irradiation object 3410 is irradiated. At this time, the first laser beam 3422 and the second laser beam 3432 are controlled by the mirrors and the condenser lens so that the irradiation object 3410 is irradiated in the state where the first laser beam 3422 and the second laser beam 3432 overlap with each other. The irradiation object 3410 is held by the stage 3400 and moved to a desired position.

As the solid-state laser 3430, a solid-state laser such as a YAG laser, a $Y_2O_3$ laser, a $YVO_4$ laser, a $YAlO_3$ laser, or a $GdVO_4$ laser is used. A fundamental wave of these solid-state lasers (1054 nm to 1062 nm) can be separated into a second harmonic wave (527 nm to 532 nm) and a third harmonic wave (351 nm to 355 nm) by the beam splitter. In this embodiment mode, a YAG laser is used as the solid-state laser 3430.

The irradiation object 3410 has a structure where a first material layer 3406 and a second material layer 3408 are sequentially stacked over a substrate 3402. Between the substrate 3402 and the first material layer 3406, a conductive layer may be provided as shown in FIG. 11 or an insulating layer and a conductive layer may be provided. In FIG. 33, a glass substrate, a quartz substrate, a sapphire substrate, a ceramic substrate, a semiconductor substrate, or the like can be used as the substrate 3402. The first material layer 3406 is formed using a material that can absorb the first laser beam 3422. The second material layer 3408 is formed using a material that can absorb the second laser beam 3432.

For example, in the case of using a YAG laser as the solid-state laser 3430, the first laser beam 3422 is a second harmonic wave (532 nm) of the YAG laser, and the second laser beam 3432 is a third harmonic wave (355 nm) of the YAG laser. In this case, the first material layer 3406 is formed using molybdenum (Mo). In addition, the second material layer 3408 is formed using silicon nitride.

The fundamental wave laser beam 3412 emitted from the solid-state laser 3430 is separated into the first laser beam 3422 and the second laser beam 3432 by the beam splitter 3460. The first laser beam 3422 is reflected by the mirror 3456, the mirror 3458, and the mirror 3452 and condensed by the condenser lens 3440; the irradiation object 3410 is irradiated; and the first laser beam 3422 is absorbed by the first material layer 3406. The second laser beam 3432 passes through the mirror 3452 and is condensed by the condenser lens 3440; the irradiation object 3410 is irradiated; and the second laser beam 3432 is absorbed by the second material layer 3408. The irradiation is conducted so that the first laser beam 3422 and the second laser beam 3432 overlap on the irradiation object 3410. A part or all of the region irradiated with an overlap part of the first laser beam 3422 and the second laser beam 3432 in the irradiation object 3410 is ablated to form an opening. At this time, the irradiation object 3410 is moved by the stage 3400 for processing a desired region.

As shown in FIG. 33, by incorporating a beam splitter in a laser processing apparatus, laser beams with two kinds of wavelengths (second harmonic wave and third harmonic wave) can be obtained from one solid-state laser. Accordingly, the number of lasers equipped can be reduced, and cost of the apparatus can be reduced. In addition, miniaturization of the apparatus can be achieved.

The structures of the laser processing apparatuses of this embodiment mode shown in FIGS. 11, 32, and 33 are examples, and the number of mirrors, condenser lenses, and the like provided in an optical path of a laser beam, a positional relation, and the like are not particularly limited to these examples. Further, a beam expander, a homogenizer, a polarizer, a slit, and the like can be used as well as the mirror and the condenser lens, and a combination of these may also be used.

By using the laser processing apparatus as shown in this embodiment mode, an opening can be formed in a desired region of an irradiation object without using a photoresist. An irradiation object is irradiated with two kinds of laser beams so that the laser beams overlap and the laser beams are absorbed by different layers to cause ablation; accordingly, an opening can be formed. By using such a laser processing apparatus in a manufacturing process of a semiconductor device, the number of lithography steps can be reduced or simplified, and reduction in manufacturing cost and improvement in throughput can be achieved.

This embodiment mode can be freely combined with any of Embodiment Modes 1 and 2.

Embodiment Mode 4

Embodiment Mode 4 will describe a manufacturing method of a display device including a transistor and a display element using the present invention. As the transistor, an inversely staggered transistor is formed as an example. As the display element, a light emitting element is formed as an example.

Figure 9A:
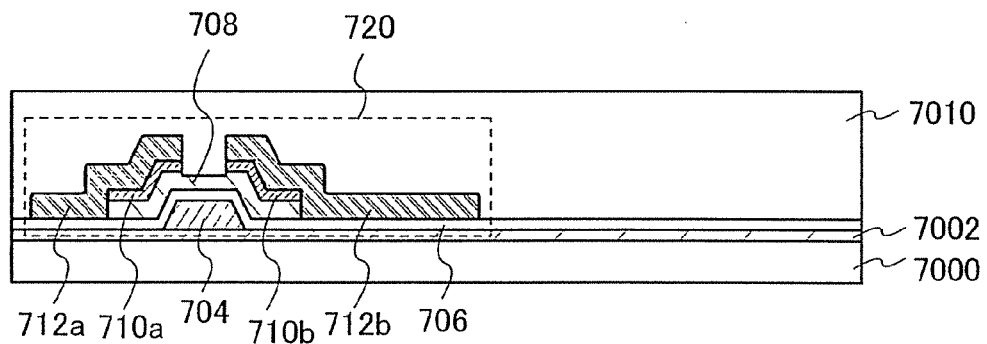
FIGS. 9A to 9C show an example of a manufacturing method of a semiconductor device of the present invention.

As shown in FIG. 9A, a transistor 720 is formed over a substrate 7000 with a base insulating layer 7002 interposed therebetween. Hereinafter, a specific manufacturing method of the transistor 720 is described with reference to FIGS. 4A to 6B.

Figure 4A:
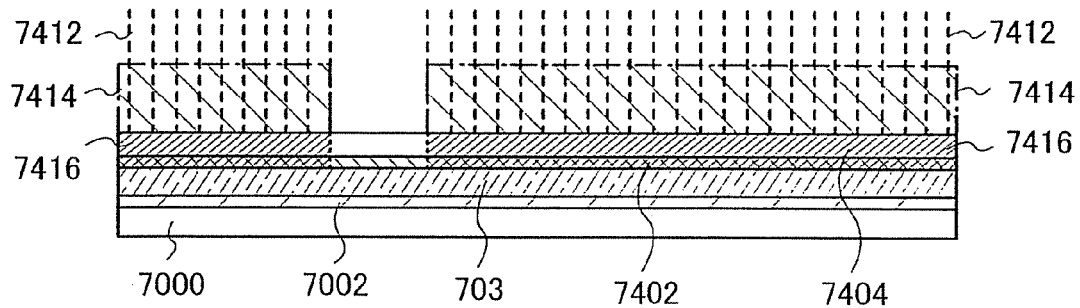
FIGS. 4A to 4D show an example of a manufacturing method of a semiconductor device of the present invention.

The base insulating layer 7002 is formed over the substrate 7000, and a conductive layer 703 is formed over the base insulating layer 7002 (FIG. 4A). As the substrate 7000, a glass substrate of barium borosilicate glass, aluminoborosilicate glass, or the like; a quartz substrate; a sapphire substrate; a ceramic substrate; or a plastic substrate having heat resistance which can withstand processing temperature in the present manufacturing process is used. Further, in order to planarize a surface of the substrate 7000, the substrate may be polished by a CMP method or the like.

The base insulating layer 7002 is formed with a single layer structure or a stack structure using an insulating material such as silicon oxide, silicon nitride, silicon oxynitride, or silicon nitride oxide by various methods such as a CVD method, a sputtering method, and a spin coating method. It is not always necessary to form the base insulating layer 7002, but it has an effect of blocking a contamination substance or the like from the substrate 7000. In addition, the base insulating layer 7002 has an effect of preventing damage to the substrate in subsequent laser beam irradiation.

The conductive layer 703 may be formed using a conductive material such as a metal element of silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), copper (Cu), or the like or an alloy material or a compound material containing the above element as its main component. Alternatively, a semiconductor material typified by polycrystalline silicon doped with an impurity element such as phosphorus (P), or an AgPdCu alloy may be used. Either a single layer structure or a stack structure may be used. For example, a two-layer structure of a tungsten nitride film and a molybdenum (Mo) film or a three-layer structure in which a tungsten film having a thickness of 50 nm, an alloy film of aluminum and silicon (Al—Si) having a thickness of 500 nm, and a titanium nitride film having a thickness of 30 nm are sequentially stacked may be used. Further, in the case of the three-layer structure, tungsten nitride may be used instead of tungsten for a first conductive layer, an alloy film of aluminum and titanium (Al—Ti) may be used instead of the alloy film of aluminum and silicon (Al—Si) for a second conductive layer, and a titanium film may be used instead of the titanium nitride film for a third conductive layer.

The conductive layer 703 is formed by a sputtering method, a physical vapor deposition (PVD) method, a chemical vapor deposition (CVD) method such as a low pressure CVD (LPCVD) method or a plasma CVD method, or the like.

A first material layer 7402 and a second material layer 7404 are sequentially stacked over the conductive layer 703. Irradiation with a first laser beam 7412 and a second laser beam 7414 is selectively conducted from the second material layer 7404 side. At this time, irradiation is conducted so that the first laser beam 7412 and the second laser beam 7414 overlap at least partially. The region irradiated with an overlap part of the first laser beam 7412 and the second laser beam 7414 is referred to as an overlap irradiation region 7416 (FIG. 4A).

The first material layer 7402 is formed using a material that can absorb the first laser beam 7412. The first material layer 7402 is preferably formed using a material having a boiling point or a sublimation point lower than a melting point of the conductive layer 703 which is positioned below the first material layer 7402. For example, a conductive material such as a metal element of chromium (Cr), molybdenum (Mo), nickel (Ni), titanium (Ti), cobalt (Co), copper (Cu), aluminum (Al), or the like or an alloy material or a compound containing the element as its main component; or a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further alternatively, zinc sulfide, silicon nitride, mercury sulfide, aluminum chloride, or the like can be used. The first material layer 7402 may be formed with either a single layer structure or a stack structure including one or more of these materials by an evaporation method, a sputtering method, a CVD method, or the like, and for example, a chromium film, zinc oxide film, or aluminum nitride film having a thickness of 20 nm can be used. If the conductive layer 703 is a layer formed using a material that absorbs the first laser beam 7412 to be ablated, it is not absolutely necessary to provide the first material layer 7402.

The second material layer 7404 is formed using a material that can absorb the second laser beam 7414 and that can transmit the first laser beam 7412. For example, an inorganic insulating material such as silicon oxide, silicon nitride, silicon oxynitride, or silicon nitride oxide; an organic insulating material such as polyimide, acrylic resin, polyamide, polyimideamide, benzocyclobutene, or epoxy resin; or the like can be used. The second material layer 7404 may be formed using a single layer structure or stack structure including one or more of the materials by a sputtering method, a CVD method, a coating method, or the like, and for example, a silicon nitride oxide film or a polyimide film having a thickness of 50 nm can be used.

For the first laser beam 7412, a laser beam having a wavelength that is absorbed by the first material layer 7402 and also having energy with such a level that can ablate a part or all of the overlap irradiation region 7416 when irradiation is conducted so that the first laser beam 7412 and the second laser beam 7414 overlap with each other, is used. The oscillation wavelength of the first laser beam 7412 is preferably in an absorption wavelength range of the first material layer 7402. The oscillation wavelength of the first laser beam 7412 is more preferably longer than the wavelength of visible light, and specifically a wavelength of 400 nm or longer is desirable. The laser beam like this can be obtained by using various lasers such as a gas laser, a solid-state laser, a semiconductor laser, a picosecond laser, and a phemtosecond laser and by appropriately setting the oscillation wavelength of these lasers. Note that any of a continuous wave laser beam or a pulsed laser beam may be used for the first laser beam 7412.

For the second laser beam 7414, a laser beam having a wavelength that is absorbed by the second material layer 7404 and also having energy with such a level that does not cause an irreversible change of the irradiation object (here, corresponding to stack layers from the substrate 7000 to the conductive layer 703) is used. The oscillation wavelength of the second laser beam 7414 is preferably in an absorption wavelength range of the second material layer 7404. The oscillation wavelength of the second laser beam 7414 is more preferably at a level of a wavelength of ultraviolet rays, which is shorter than the wavelength of visible light, and specifically a wavelength of 400 nm or shorter is desirable. The laser beam like this can be obtained by using various lasers such as an excimer laser, a gas laser, a solid-state laser, and a semiconductor laser and by appropriately setting the oscillation wavelength of these lasers. Note that any of a continuous wave laser beam or a pulsed laser beam may be used for the second laser beam 7414.

Figure 4B:
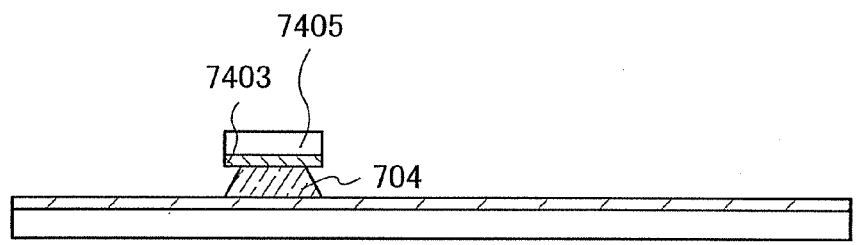

The first laser beam 7412 is absorbed by the first material layer 7402, and the second laser beam 7414 is absorbed by the second material layer 7404. A region in the first material layer 7402 and the second material layer 7404 which is irradiated with an overlap part of the first laser beam 7412 and the second laser beam 7414 (overlap irradiation region 7416) is ablated. The conductive layer 703 is selectively etched using a remaining first material layer 7403 and a remaining second material layer 7405 as masks, so that a gate electrode layer 704 is formed (FIG. 4B).

The gate electrode layer 704 may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. By these methods, a conductive layer can be formed selectively in a desired place. The gate electrode layer 704 may be formed by forming a mask with the use of a photoresist over the conductive layer 703 and selectively etching the conductive layer 703 using the mask.

Figure 4C:
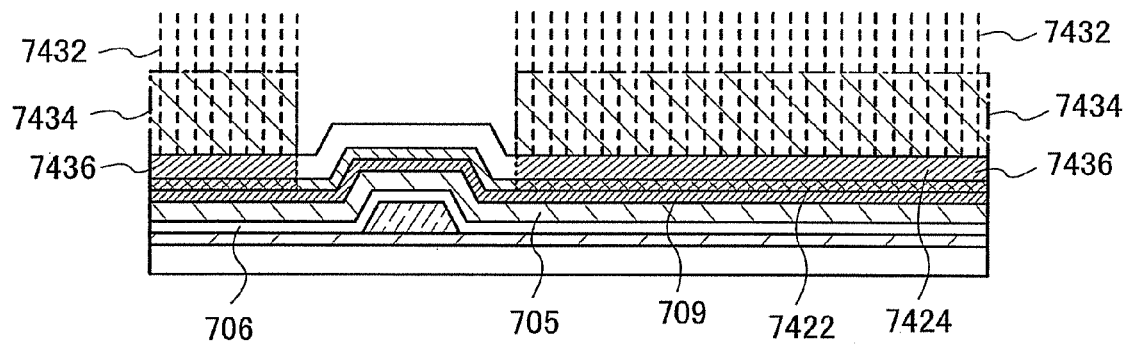

After the first material layer 7403 and the second material layer 7405 are removed by utilizing etching or laser ablation, a gate insulating layer 706 is formed over the gate electrode layer 704. A semiconductor layer is formed over the gate insulating layer 706 (FIG. 4C).

The gate insulating layer 706 is formed using an insulating material such as silicon oxide, silicon nitride, silicon oxynitride, or silicon nitride oxide by a CVD method, a sputtering method, or the like. The gate insulating layer 706 may have either a single layer structure or a stack structure. For example, the gate insulating layer 706 may have a single layer structure of a silicon oxynitride layer or a two-layer structure of a silicon nitride layer and a silicon oxide layer. Alternatively, a stack structure of three or more layers including the materials may be used. Preferably, silicon nitride, with which a dense film can be formed, is used. In the case where the underlayer gate electrode layer 704 is formed using silver or copper by a droplet discharge method, the gate insulating layer 706 is preferably formed using silicon nitride or NiB. A film including silicon nitride or NiB has effects of preventing impurity diffusion and planarizing a surface. Note that a rare gas element such as argon may be included in a reaction gas when forming the gate insulating layer 706. By including a rare gas element in a reaction gas, a dense insulating layer with low leakage current can be obtained at a low film formation temperature.

For the semiconductor layer, a stack structure of a semiconductor layer 705 and a semiconductor layer 709 having one conductivity type is formed. The semiconductor layer can be formed by using a crystalline semiconductor such as an amorphous semiconductor (hereinafter also referred to as "AS") formed by a vapor deposition method using a semiconductor source gas typified by silane or germane or a sputtering method, a polycrystalline semiconductor formed by crystallizing the amorphous semiconductor using light energy or thermal energy, or a semi-amorphous semiconductor (also referred to as microcrystal and hereinafter also referred to as "SAS"). The semiconductor layer can be formed by various methods (a sputtering method, an LPCVD method, a plasma CVD method, and the like).

An SAS is a semiconductor having an intermediate structure between amorphous and crystalline (including single crystalline and polycrystalline) structures and a third state which is stable in terms of free energy. Moreover, an SAS includes a crystalline region with a short-distance order and lattice distortion. A crystal region having a diameter of 0.5 to 20 nm can be observed at least in a portion of the film. In a case where silicon is contained as a main component, Raman spectrum is shifted to the low wave number side that is lower than 520 cm$^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and alternatively, $Si_2H_6$, $SiH_2Cl_2$, $SiHCl_3$, $SiCl_4$, $SiF_4$, or the like can also be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, the pressure is approximately 0.1 to 133 Pa, and the power source frequency is 1 to 120 MHz, preferably, 13 to 60 MHz. The temperature for heating the substrate is preferably less than or equal to 300° C., and an SAS can also be formed at 100 to 200° C. It is preferable that the concentration of impurities of atmospheric components such as oxygen, nitrogen, and carbon as impurity elements entering the film in forming the film be less than or equal to $1 \times 10^{20}$ cm$^{-3}$. In particular, the oxygen concentration is preferably less than or equal to $5 \times 10^{19}$ cm$^{-3}$, and more preferably, less than or equal to $1 \times 10^{19}$ cm$^{-3}$. Further, when a rare gas element such as helium, argon, krypton, or neon is contained to further promote the lattice distortion, stability can be enhanced, and a favorable SAS can be obtained. Further, as the semiconductor layer, an SAS layer formed by using a hydrogen-based gas may be stacked over an SAS layer formed by using a fluorine-based gas.

As an example of a typical amorphous semiconductor, hydrogenated amorphous silicon can be given while polysilicon or the like can be given as an example of a typical crystalline semiconductor. Polysilicon (polycrystalline silicon) includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon crystallized by being provided with an element which promotes crystallization or the like, and the like. Of course, as described above, a semi-amorphous semiconductor or a semiconductor which includes a crystalline phase in a portion of the film can also be used.

When a crystalline semiconductor such as a polycrystalline semiconductor or a semi-amorphous semiconductor is used for the semiconductor layer, the semiconductor layer may be formed by various methods (a laser crystallization method, a thermal crystallization method, and a thermal crystallization method using an element such as nickel which promotes crystallization). Further, a microcrystalline semiconductor that is an SAS may be crystallized by laser irradiation to enhance crystallinity. In a case where silicon is used and an element which promotes crystallization is not added for forming a semiconductor layer, before the amorphous silicon layer is irradiated with a laser beam, the amorphous silicon layer is heated at 700° C. for one hour in a nitrogen atmosphere to discharge hydrogen so that the hydrogen concentration in the amorphous silicon layer becomes less than or equal to $1 \times 10^{20}$ atoms/cm$^3$. This is because, if the amorphous silicon layer contains much hydrogen, the amorphous silicon layer may be broken by laser beam irradiation.

A method for introducing a metal element into the amorphous semiconductor layer is not particularly limited as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film on the surface of the amorphous semiconductor layer by UV light irradiation in an oxygen atmosphere, a thermal oxidation method, treatment with ozone water containing hydroxyl radical or a hydrogen peroxide solution, or the like to improve wettability of the surface of the amorphous semiconductor layer so that an aqueous solution can be diffused on the entire surface of the amorphous semiconductor layer.

In order to crystallize the amorphous semiconductor layer, heat treatment may be combined with crystallization by laser beam irradiation, or one of heat treatment and laser beam irradiation may be carried out multiple times.

Moreover, the crystalline semiconductor layer may be directly formed over the substrate by a plasma method. Furthermore, the crystalline semiconductor layer may be selectively formed over the substrate by a linear plasma method.

The semiconductor layer can be formed of an organic semiconductor material. As the organic semiconductor material, a low-molecular material, a high-molecular material, or the like can be used. In addition, a material such as a conductive high-molecular material can also be used. For example, a π-electron conjugated high-molecular material of which skeletal structure includes a conjugated double bond can be used and specifically, a soluble material such as polythiophene, polyfluorene, poly(3-alkylthiophene), a polythiophene derivative, or pentacene can be used. In addition, there is a material which can be used as the organic semiconductor material. In this case, the semiconductor layer can be formed by depositing a soluble precursor of the material and then performing treatment thereon. As the organic semiconductor material, polythienylenevinylene, poly(2,5-thienylenevinylene), polyacetylene, a polyacetylene derivative, polyallylenevinylene, or the like can be used.

The precursor is changed into the organic semiconductor not only by heat treatment but also by addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, ybutyllactone, butylcellosolve, cyclohexane, N-methyl-2-pyrrolidone (NMP), cyclohexanone, 2-butanon, dioxane, dimethylformamide (DMF), tetrahydrofuran (THF), or the like can be used.

In this embodiment mode, amorphous semiconductor layers are formed for the semiconductor layer 705 and the semiconductor layer 709 having one conductivity type. As the semiconductor layer 709 having one conductivity type, an n-type semiconductor layer, which contains phosphorus (P) that is an impurity element imparting n-type conductivity, is formed. The semiconductor layer 709 having one conductivity type functions as a source region and a drain region, and favorable ohmic contact between the semiconductor layer 705 and the conductive layer functioning as a source electrode or a drain electrode can be obtained because of the semiconductor layer 709. The semiconductor layer 709 having one conductivity type may be formed according to need, and an n-type semiconductor layer containing an impurity element imparting n-type conductivity (P, As) or a p-type semiconductor layer containing an impurity element imparting p-type conductivity (B) can be formed.

A first material layer 7422 and a second material layer 7424 are sequentially stacked over a semiconductor layer 709 having one conductivity type. Irradiation is selectively conducted with a first laser beam 7432 and a second laser beam 7434 from the second material layer 7424 side. At this time, irradiation is conducted so that the first laser beam 7432 and the second laser beam 7434 overlap at least partially. The region irradiated with an overlap part of the first laser beam 7432 and the second laser beam 7434 is referred to as an overlap irradiation region 7436 (FIG. 4C).

The first material layer 7422 and the second material layer 7424 may be formed similarly to the above-described first material layer 7402 and the second material layer 7404. For the first laser beam 7432, similar to the above-described first laser beam 7412, a laser beam having a wavelength that is absorbed by the first material layer 7422 and also having energy with such a level that can ablate a part or all of the overlap irradiation region 7436 may be used. For the second laser beam 7434, similar to the above-described second laser beam 7414, a laser beam having a wavelength that is absorbed by the second material layer 7424 and also having energy with such a level that does not cause an irreversible change of the irradiation object (here, stack layers from the substrate 7000 to the semiconductor layer 709 having one conductivity type) may be used.

Figure 4D:
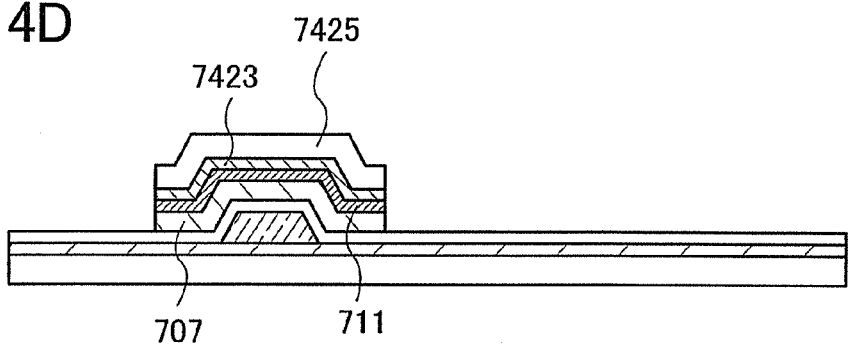

The first laser beam 7432 is absorbed by the first material layer 7422, and the second laser beam 7434 is absorbed by the second material layer 7424. A region in the first material layer 7422 and the second material layer 7424 which is irradiated with an overlap part of the first laser beam 7432 and the second laser beam 7434 (overlap irradiation region 7436) is ablated. The semiconductor layer 705 and the semiconductor layer 709 having one conductivity type are selectively etched using a remaining first material layer 7423 and a remaining second material layer 7425 as masks, so that a semiconductor layer 707 and a semiconductor layer 711 having one conductivity type are formed (FIG. 4D).

Figure 5A:
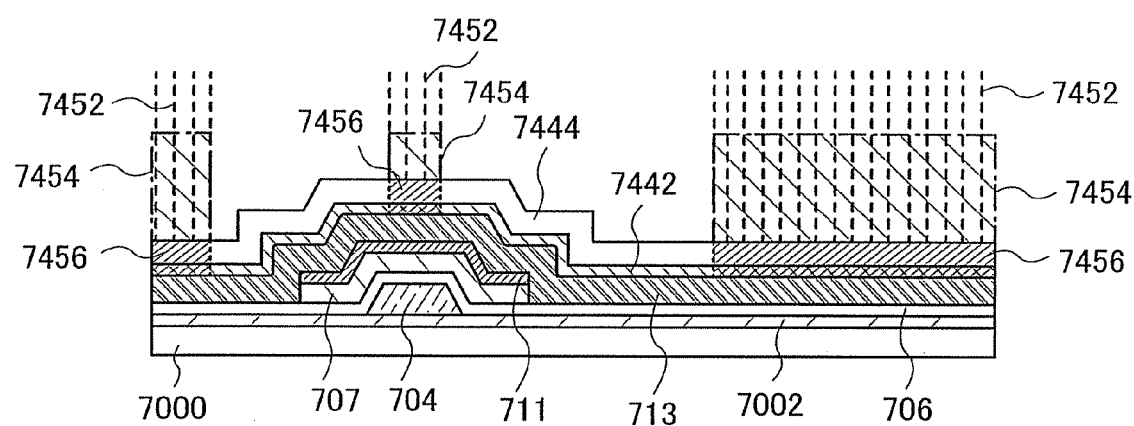
FIGS. 5A and 5B show an example of a manufacturing method of a semiconductor device of the present invention.

After removing the first material layer 7423 and the second material layer 7425 by utilizing etching or laser ablation, a conductive layer 713 is formed over the semiconductor layer 711 having one conductivity type (FIG. 5A).

The conductive layer 713 may be formed using a conductive material such as a metal element of silver (Ag), gold (Au), nickel (Ni), platinum (Pt), palladium (Pd), iridium (Ir), rhodium (Rh), tantalum (Ta), tungsten (W), chromium (Cr), molybdenum (Mo), titanium (Ti), cobalt (Co), copper (Cu), aluminum (Al), or the like or an alloy material or a compound containing the above element as its main component, for example. In addition, the conductive layer 713 may have either a single layer structure or a stack structure.

The conductive layer 713 may be formed by a sputtering method, a physical vapor deposition (PVD) method, a chemical vapor deposition (CVD) method such as a low pressure CVD (LPCVD) method or a plasma CVD method, or the like.

A first material layer 7442 and a second material layer 7444 are sequentially stacked over the conductive layer 713. Irradiation is selectively conducted with a first laser beam 7452 and a second laser beam 7454 from the second material layer 7444 side. At this time, irradiation is conducted so that the first laser beam 7452 and the second laser beam 7454 overlap at least partially. The region irradiated with an overlap part of the first laser beam 7452 and the second laser beam 7454 is referred to as an overlap irradiation region 7456 (FIG. 5A).

The first material layer 7442 and the second material layer 7444 may be formed similarly to the above-described first material layer 7402 and the second material layer 7404. For the first laser beam 7452, similar to the above-described first laser beam 7412, a laser beam having a wavelength that is absorbed by the first material layer 7442 and also having energy with such a level that can ablate a part or all of the overlap irradiation region 7456 may be used. For the second laser beam 7454, similar to the above-described second laser beam 7414, a laser beam having a wavelength that is absorbed by the second material layer 7444 and also having energy with such a level that does not cause an irreversible change of the irradiation object (here, stack layers from the substrate 7000 to the conductive layer 713) may be used. Note that when the conductive layer 713 is formed using a material that absorbs the first laser beam 7452 to be ablated, it is not absolutely necessary to provide the first material layer 7442.

Figure 5B:
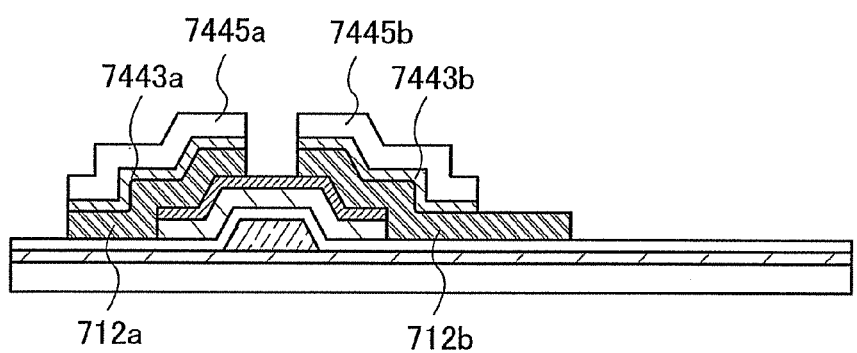

The first laser beam 7452 is absorbed by the first material layer 7442, and the second laser beam 7454 is absorbed by the second material layer 7444. A region in the first material layer 7442 and the second material layer 7444 which is irradiated with an overlap part of the first laser beam 7452 and the second laser beam 7454 (overlap irradiation region 7456) is ablated. The conductive layer 713 is selectively etched using a first material layer 7443a, a first material layer 7443b, a second material layer 7445a, and a second material layer 7445b, which remain, as masks, so that a conductive layer 712a and a conductive layer 712b, which serve as a source electrode layer and a drain electrode layer, are formed (FIG. 5B).

The conductive layers 712a and 712b may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. By these methods, a conductive layer can be formed selectively in a desired place. The conductive layers 712a and 712b may be formed by forming a mask with the use of a photoresist over the conductive layer 713 and selectively etching the conductive layer 713 using the mask.

Figure 6A:
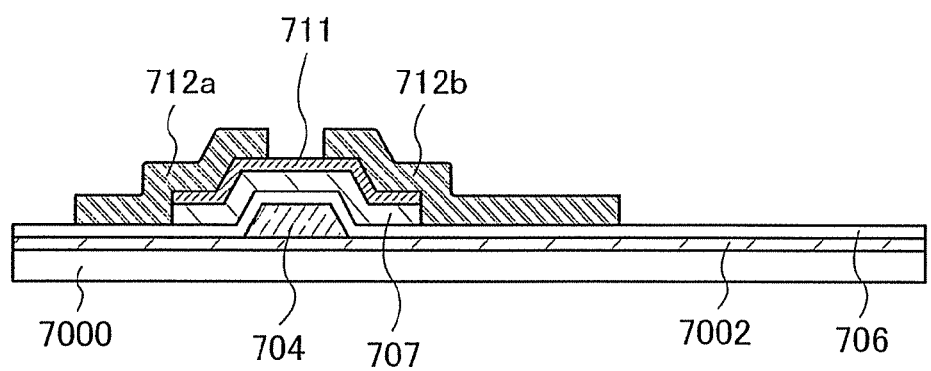
FIGS. 6A and 6B show an example of a manufacturing method of a semiconductor device of the present invention.
Figure 6B:
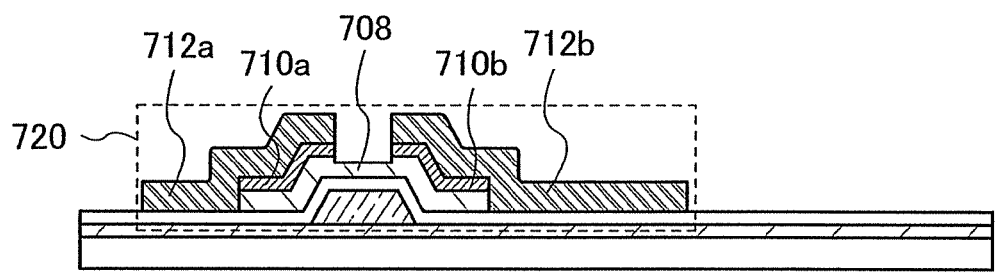

The first material layers 7443a and 7443b and the second material layers 7445a and 7445b are removed by utilizing etching or laser ablation (FIG. 6A). Then, the semiconductor layer 711 having one conductivity type is selectively etched by using the conductive layers 712a and 712b as masks to expose the semiconductor layer 707. The semiconductor layers are separated into a semiconductor layer 710a having one conductivity type, a semiconductor layer 710b having one conductivity type, and a semiconductor layer 708 (FIG. 6B). After selectively etching the semiconductor layer 711 having one conductivity type, the exposed part of the semiconductor layer 708, which is positioned below, is depressed than other portions of the semiconductor layer 708 in some cases.

The semiconductor layer 708, and the semiconductor layers 710a and 710b each having one conductivity type may be formed by forming a semiconductor layer by a sputtering method, an LPCVD method, a plasma CVD method, or the like, forming a mask over the semiconductor layer using a photoresist, and selectively etching the semiconductor layer using the mask.

Further, the semiconductor layer 708 and the semiconductor layers 710a and 710b each having one conductivity type may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. By these methods, a semiconductor layer can be formed selectively in a desired place.

Through the above-described process, the transistor 720, which is an inversely staggered transistor (also called a bottom gate type transistor), can be manufactured.

Next, an insulating layer 7010 is formed to cover the transistor 720 (FIG. 9A).

The insulating layer 7010 can also be formed with a single layer structure or a stack structure including a material such as silicon oxide, silicon nitride, silicon oxynitride, aluminum oxide, aluminum nitride, aluminum oxynitride, diamond-like carbon (DLC), nitrogen-containing carbon, polysilazane, or other substances containing an inorganic insulating material. A material containing siloxane may also be used. Further, an organic insulating material such as polyimide, acrylic resin, polyamide, polyimide amide, resist, or benzocyclobutene can also be used. In addition, an oxazole resin can be used, and for example, photo-curable type polybenzoxazole or the like can be used.

The insulating layer 7010 may be formed by a sputtering method, a physical vapor deposition (PVD) method, a chemical vapor deposition (CVD) method such as a low pressure CVD (LPCVD) method or a plasma CVD method, a spin coating method, or the like.

Figure 9B:
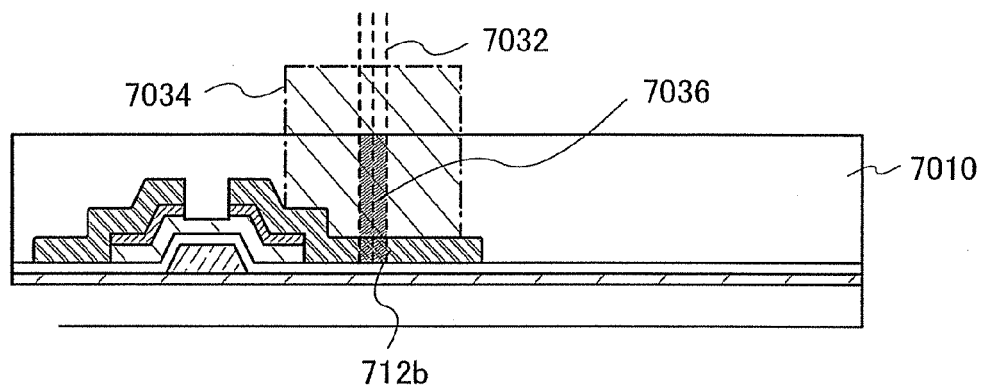
Figure 9C:
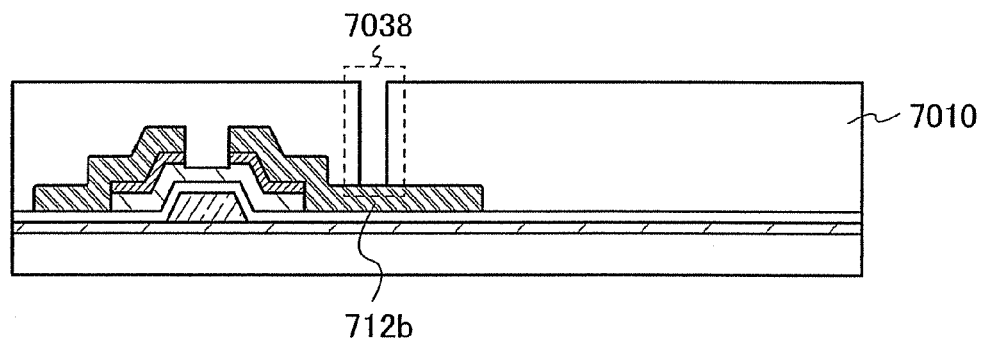

Then, laser beam irradiation is conducted (FIG. 9B), and an opening 7038 reaching the conductive layer 712b is formed in the insulating layer 7010 (FIG. 9C).

In FIG. 9C, the opening 7038 formed in the insulating layer 7010 is formed by ablation using laser beam irradiation as described in Embodiment Modes 1 to 3.

In more detail, as shown in FIG. 9B, irradiation with a first laser beam 7032 having a wavelength that is absorbed by the conductive layer 712b and a second laser beam 7034 having a wavelength that is absorbed by the insulating layer 7010 from the insulating layer 7010 side is conducted so that the first laser beam 7032 and the second laser beam 7034 overlap, and a part or all of the region irradiated with an overlap part of the first laser beam 7032 and the second laser beam 7034 is ablated to form the opening 7038. The first laser beam 7032 has energy with such a level that can ablate a part or all of the region irradiated with an overlap part of the first laser beam 7032 and the second laser beam 7034. The second laser beam 7034 has energy with such a level that does not cause an irreversible change of the stacked layers from the substrate 7000 to the insulating layer 7010. As specific laser beams, the laser beams described in the above embodiment modes can be used, and explanation thereof is omitted. In this embodiment mode, only the insulating layer 7010 is removed by ablation by irradiation with the first laser beam 7032 and the second laser beam 7034 to form an opening. The present invention is not particularly limited to this, and an opening can be formed so as to remove an upper portion of the conductive layer 712b and leave a lower portion thereof or so as to penetrate the conductive layer 712b, by appropriately selecting energy or the like of the first laser beam 7032 and the second laser beam 7034.

In the case where the substrate 7000, the base insulating layer 7002, and the gate insulating layer 706 are formed by using light-transmitting materials, irradiation with the first laser beam from the substrate 7000 side is possible. Irradiation with the second laser beam that is absorbed by the insulating layer 7010 is conducted from the insulating layer 7010 side. Irradiation with the first laser beam absorbed by the conductive layer 712b is conducted from the substrate 7000 side. At this time, irradiation is conducted so that the first laser beam and the second laser beam overlap. A part or all of the region irradiated with an overlap part of the laser beams is ablated to form the opening 7038 in the insulating layer 7010 (or the insulating layer 7010 and the conductive layer 712b). In this case, since the insulating layer 7010 need not transmit the first laser beam, the range of options for the material of the insulating layer 7010 can be widened.

Further, the opening 7038 may be formed by forming a mask over the insulating layer 7010 using a photoresist and selectively etching the mask. Alternatively, the opening 7038 may be formed by formation of a mask by a droplet discharge method and selective etching with the use of the mask.

Next, a light emitting element 7020 electrically connected to the transistor 720 is formed. As the light emitting element 7020, an element which emits light of red (R), green (G), or blue (B) may be formed. Alternatively, an element which emits light of white (W) may be formed as the light emitting element 7020 and combined with a color filter to obtain light of R, Q or B. Hereinafter, a method for forming the light emitting element 7020 will be described.

Figure 10A:
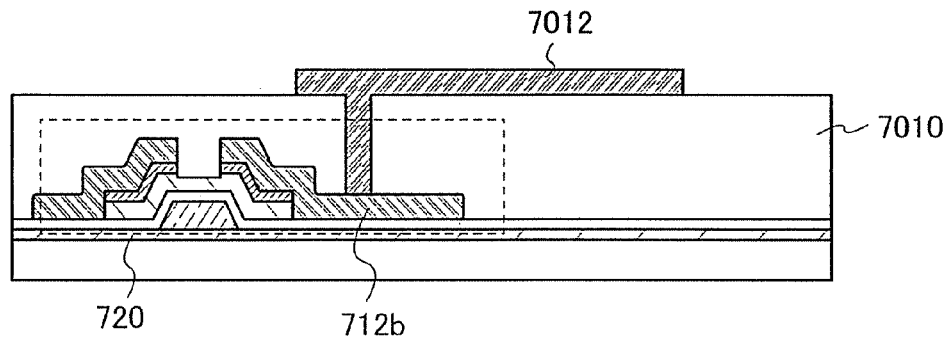
FIGS. 10A to 10C show an example of a manufacturing method of a semiconductor device of the present invention.

First, a first electrode layer 7012 of a light emitting element functioning as a pixel electrode is formed in the opening 7038 where the conductive layer 712b is exposed. The conductive layer 712b and the first electrode layer 7012 are electrically connected (FIG. 10A).

The first conductive layer 7012 can be formed using a conductive material such as indium tin oxide (ITO), indium tin oxide containing silicon oxide (ITSO), or zinc oxide (ZnO). For example, a film of indium tin oxide containing silicon oxide can be formed by a sputtering method using a target of ITO containing silicon oxide at 2 wt % to 10 wt %. Alternatively, a conductive material obtained by doping ZnO with gallium (Ga), or indium zinc oxide (IZO) that is an oxide conductive material formed by using a target in which indium oxide containing silicon oxide is mixed with zinc oxide (ZnO) at 2 wt % to 20 wt % may be used for the first electrode layer 7012.

A conductive layer formed by a sputtering method, a physical vapor deposition (PVD) method, a chemical vapor deposition (CVD) method such as a low pressure CVD (LPCVD) method or a plasma CVD method, or the like is selectively etched, so that the first electrode layer 7012 is formed.

In addition, the first electrode layer 7012 can be selectively formed in a desired place by a droplet discharge method, a printing method (a method for forming a pattern, such as screen printing or offset printing), a dipping method, a dispenser method, or the like.

The first electrode layer 7012 may be cleaned or polished by a CMP method or with the use of a polyvinyl alcohol based porous material so that the surface thereof is planarized. In addition, after polishing using a CMP method, ultraviolet ray irradiation, oxygen plasma treatment, or the like may be performed on the surface of the first electrode layer 7012.

Figure 10B:
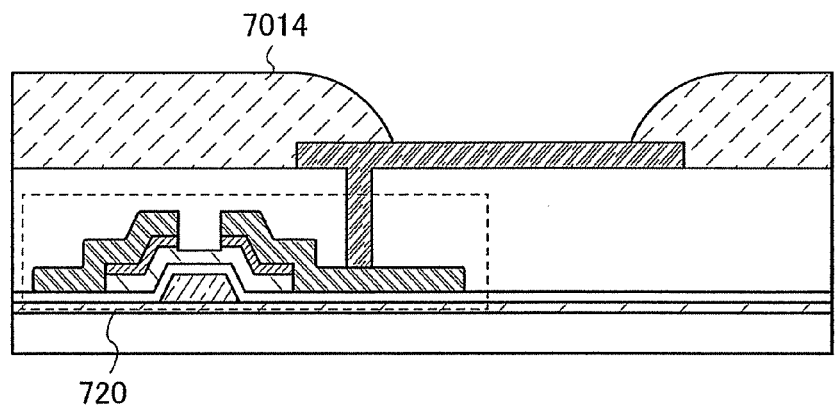

Next, a partition layer 7014 is formed so as to have an opening over the first electrode layer 7012 (FIG. 10B). The partition layer 7014 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds which are formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used.

The partition layer 7014 can be selectively formed using a droplet discharge method, a printing method, a disperser method, or the like. Alternatively, the partition layer may be formed over the entire surface using an insulating material, a resist mask or the like may be formed using a lithography step, and the partition layer may be etched to form the partition layer 7014 having a desired shape. Alternatively, the partition layer 7014 having a desired shape can also be formed by the steps of forming the partition layer over the entire surface using a photosensitive material and exposing the partition layer formed of the photosensitive material to light to develop it. It is preferable that the partition layer 7014 have a shape of which a radius of curvature continuously changes. By such a shape of the partition layer, coverage by a layer 7016 and a second electrode layer 7018 to be formed thereover is improved.

After the partition layer 7014 is formed by discharging a composition by a droplet discharge method, its surface may be planarized by pressing with pressure to enhance a level of planarity. As a pressing method, unevenness of the surface may be reduced by scanning the surface by a roller-shaped object, or the surface may be pressed perpendicularly by a flat plate-shaped object. Alternatively, surface unevenness may be removed with an air knife after the surface is softened or melted with a solvent or the like. A CMP method may also be used for polishing the surface. This process can be employed for planarizing the surface when the surface becomes uneven by a droplet discharge method. When the level of planarity is enhanced by this process, display unevenness of the display device can be prevented, and thus, a high definition image can be displayed.

Figure 10C:
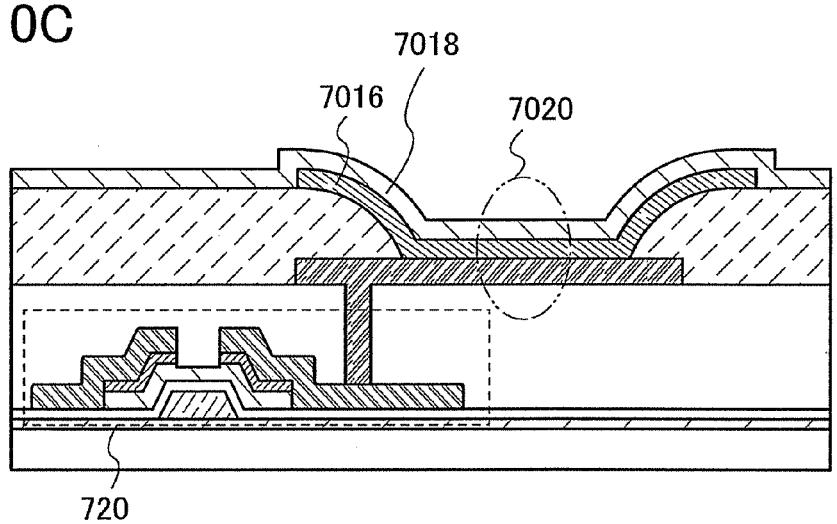

Next, the layer 7016 and the second electrode layer 7018 are stacked over the first electrode layer 7012 and the partition layer 7014. Then, the light emitting element 7020 having a structure in which the layer 7016 is interposed between the first electrode layer 7012 and the second electrode layer 7018 is obtained (FIG. 10C). The layer 7016 includes at least a layer containing a light emitting material by which a desired emission wavelength can be obtained (hereinafter referred to as a light emitting layer). Specifically, the layer 7016 includes a layer containing an organic compound, a layer containing an inorganic compound, or a layer containing both organic and inorganic compounds.

Through the above process, a display device including the light emitting element 7020 can be obtained.

By the present invention, an opening can be formed in a desired region without using a lithography step that uses a photoresist. Therefore, the lithography step can be reduced or simplified; loss of a material such as a resist material or a developer can be prevented; and the number of photomasks that are necessary can be reduced. By irradiation with two kinds of laser beams that are absorbed by different layers so that the laser beams overlap, damage to another layer can be reduced and an opening can be formed easily. Accordingly, reduction in manufacturing cost and improvement in throughput can be achieved in manufacture of a display device. In addition, a semiconductor device with high reliability can be manufactured.

This embodiment mode can be freely combined with any of Embodiment Modes 1 to 3.

Embodiment Mode 5

Embodiment Mode 5 will describe a structure of a display panel according to the present invention.

Figure 15A:
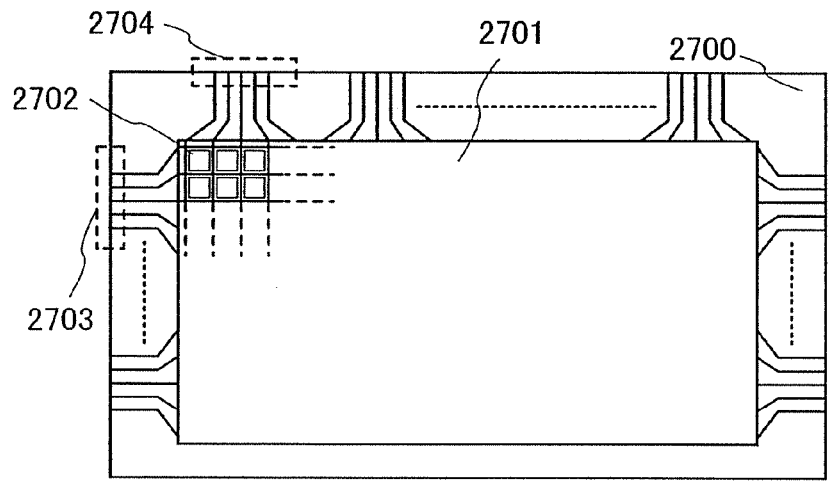
FIGS. 15A to 15C are top views of display devices of the present invention.

FIG. 15A is a top view showing a structure of a display panel according to the present invention. A pixel portion 2701 in which pixels 2702 are arranged in a matrix, a scanning line input terminal 2703, and a signal line input terminal 2704 are formed over a substrate 2700 having an insulating surface. The number of pixels may be determined in accordance with various standards. In the case of XGA full-color display using RGB, the number of pixels may be 1024×768×3 (RGB). In the case of UXGA full-color display using RGB, the number of pixels may be 1600×1200×3 (RGB), and in the case of full-spectrum, high-definition, and full-color display using RGB, the number of pixels may be 1920×1080×3 (RGB).

The pixels 2702 are arranged in a matrix by intersections of scanning lines extended from the scanning line input terminal 2703 and signal lines extended from the signal line input terminal 2704. Each pixel 2702 is provided with a switching element and a pixel electrode connected to the switching element. A typical example of the switching element is a transistor. A gate electrode side of the transistor is connected to the scanning line, and a source or drain electrode side of the transistor is connected to the signal line, which enables each pixel to be independently controlled by a signal inputted from an external portion.

Figure 16A:
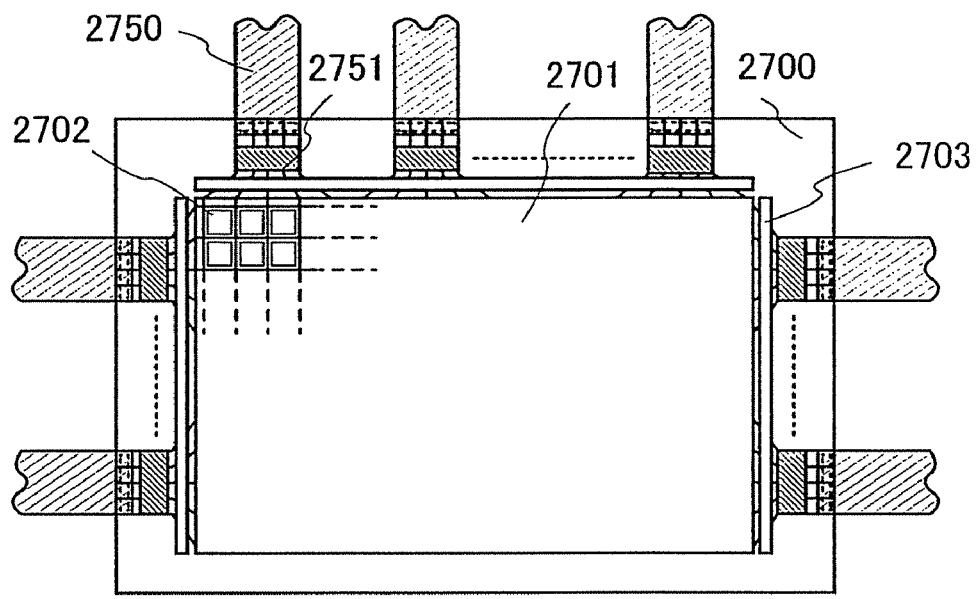
FIGS. 16A and 16B are top views of display devices of the present invention.
Figure 16B:
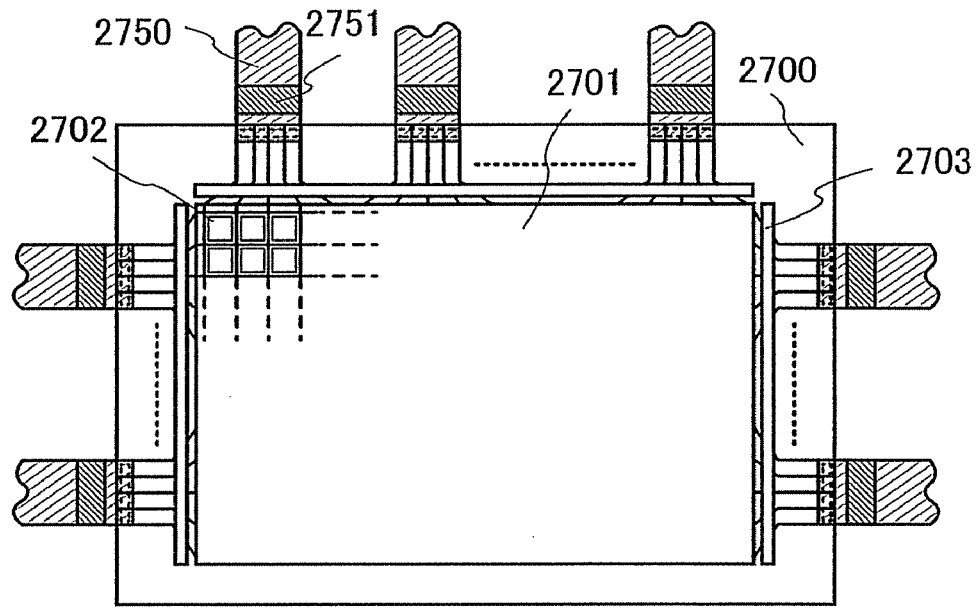

FIG. 15A shows a structure of a display device in which a signal to be input to the scanning line and the signal line is controlled by an external driver circuit. Alternatively, a driver IC 2751 may be mounted on the substrate 2700 by a COG (Chip On Glass) method as shown in FIG. 16A. As another mounting mode, a TAB (Tape Automated Bonding) method may be used as shown in FIG. 16B. The driver IC may be formed using a single crystalline semiconductor substrate or may be formed using a transistor over a glass substrate. In each of FIGS. 16A and 16B, the driver IC 2751 is connected to an FPC (Flexible Printed Circuit) 2750.

Figure 15B:
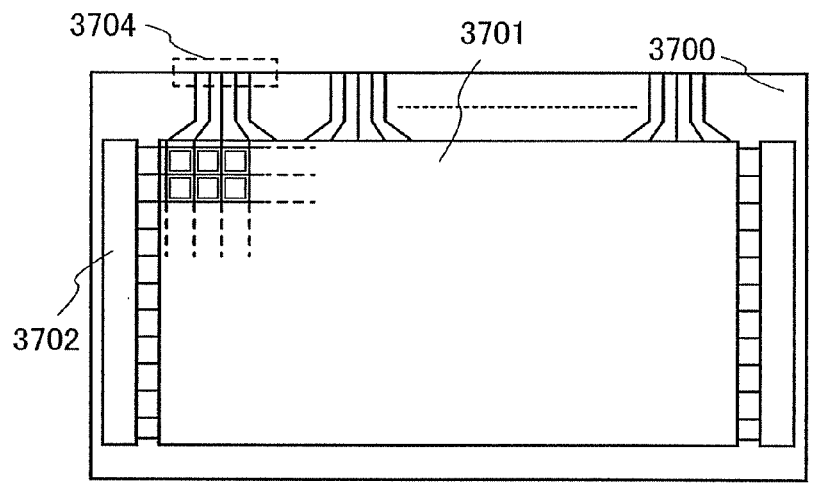
Figure 15C:
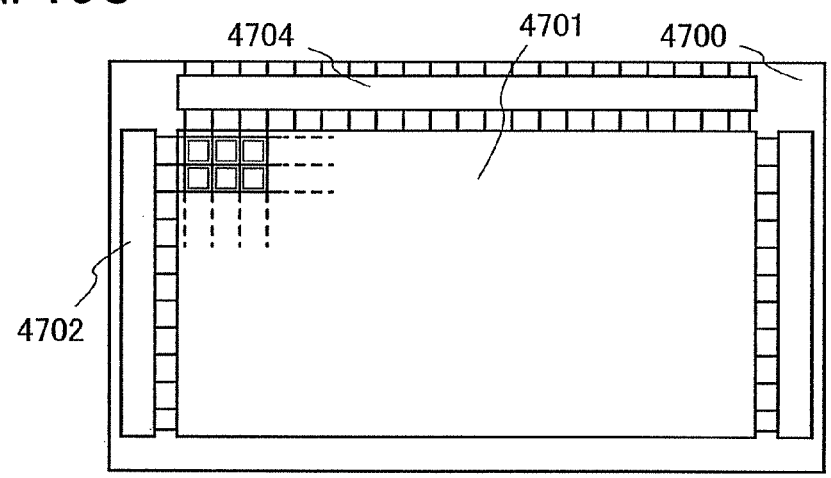

When a transistor provided in a pixel is formed of a polycrystalline (microcrystalline) semiconductor with high crystallinity, a scanning line driver circuit 3702 can be formed over a substrate 3700 as shown in FIG. 15B. In FIG. 15B, reference numeral 3701 denotes a pixel portion, and a signal line driver circuit is controlled by an external driver circuit, similarly to FIG. 15A. When the transistor provided in a pixel is formed of a polycrystalline (microcrystalline) semiconductor, a single crystalline semiconductor, or the like having a high mobility, a pixel portion 4701, a scanning line driver circuit 4702, and a signal line driver circuit 4704 can all be formed over a glass substrate 4700 as shown in FIG. 15C.

In this embodiment mode, the present invention that utilizes laser ablation as described in Embodiment Modes 1 to 4 can be applied to an opening in which a wiring (conductive layer) for connecting the switching element to the pixel electrode is formed, an opening in which a wiring (conductive layer) for connecting the gate electrode of the transistor to the scanning line is formed, an opening in which a wiring (conductive layer) for connecting the source electrode or drain electrode to the signal line is formed, and the like.

By employing the present invention, a lithography step that uses a photoresist can be reduced or simplified. In the present invention, an opening is formed by utilizing laser ablation which is caused by irradiation with two kinds of laser beams that are absorbed by different layers so that the laser beams overlap. With this manner, damage to another layer or a substrate can be prevented, and laser ablation can be easily caused. Accordingly, reduction in manufacturing cost and improvement in throughput can be achieved in manufacture of a display panel.

This embodiment mode can be freely combined with any of Embodiment Modes 1 to 4.

Embodiment Mode 6

Embodiment Mode 6 will describe an example of a display device according to the present invention with reference to FIGS. 27A and 27B.

FIG. 27A is a top schematic view of a display device shown in this embodiment mode. In addition, FIG. 27B is a cross-sectional view of FIG. 27A taken along a line Q-R.

A display device 900 shown in FIGS. 27A and 27B includes, over a substrate 901, a pixel portion 902 and a driver circuit portion 904. A sealing substrate 908 is provided over the substrate 901 with a sealant 910 interposed therebetween. Moreover, a terminal portion 906 is provided over the substrate 901. Signals and power source potentials for controlling operations of plural elements included in the pixel portion 902 are input from an external portion through the terminal portion 906.

The pixel portion 902 is provided with a light emitting element 930, a driving transistor 924, a switching transistor 922, and a capacitor 920. In the light emitting element 930, at least a layer including a light emitting layer is interposed between a pair of electrode layers. The light emitting element 930 is electrically connected to the driving transistor 924.

Edge portions of an electrode layer in a lower part of the light emitting element 930 (the electrode layer electrically connected to the driving transistor 924) are covered with a partition layer 918. The partition layer 918 is formed of an inorganic insulating material such as silicon oxide or silicon nitride; an organic insulating material such as acrylic, polyimide, or resist; a siloxane material; or the like. The partition layer 918 can separate light emitting elements provided adjacent to each other. When the partition layer 918 has an edge portion with a rounded shape of which a radius of curvature continuously changes as shown in this embodiment mode, coverage by a film stacked thereover is improved, which is preferable.

The driver circuit portion 904 is provided with a plurality of transistors 926, which form a driver circuit for controlling operation of the pixel portion 902. The driver circuit portion 904 is provided with, for example, a shift register, a decoder, a buffer, a sampling circuit, a latch, and the like.

The substrate 901 and the sealing substrate 908 are attached to each other with the sealant 910 interposed therebetween so as to seal the pixel portion 902 and the driver circuit portion 904. The sealing substrate 908 is provided with a color filter 942 and a light-blocking layer 944. The present invention is not particularly limited thereto, and the color filter 942 or the light-blocking layer 944 may be omitted.

A great difference between this embodiment mode and the above Embodiment Mode 4 is that a gate electrode layer of the transistor is provided below or over the semiconductor layer. Other structures are based on those in Embodiment Mode 4.

Next, an example of a specific manufacturing method will be described.

As a base insulating layer over the substrate 901, a base insulating layer 903a is formed using silicon nitride oxide with a thickness of 10 nm to 200 nm (preferably 50 nm to 150 nm), and a base insulating layer 903b is stacked thereover using silicon oxynitride with a thickness of 50 nm to 200 nm (preferably 100 nm to 150 nm), by a sputtering method, a PVD (Physical Vapor Deposition) method, a CVD (Chemical Vapor Deposition) method such as a low-pressure CVD (LPCVD) method or a plasma CVD method, or the like. Alternatively, an acrylic acid, a methacrylic acid, or a derivative thereof; a heat-resistant high molecular material such as polyimide, aromatic polyamide, or polybenzimidazole; or a siloxane resin may be used. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide; a composition material containing a water-soluble homopolymer and a water-soluble copolymer; or the like may be used. Moreover, an oxazole resin can be used, and for example, photo-curing polybenzoxazole or the like can be used.

A droplet discharge method, a printing method (a method for forming a pattern such as screen printing or offset printing), a coating method such as a spin coating method, a dipping method, a dispenser method, or the like can also be used. In this embodiment mode, the base insulating layers 903a and 903b are formed by a plasma CVD method. As the substrate 901, a glass substrate, a quartz substrate, a silicon substrate, a metal substrate, or a stainless steel substrate provided with an insulating layer on the surface may be used. In addition, a plastic substrate having heat resistance sufficient to withstand the process temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used.

The base insulating layer can be formed using silicon oxide, silicon nitride, silicon oxynitride, silicon nitride oxide, or the like and may have either a single layer structure or a stack structure such as a two-layer or three-layer structure.

Next, a semiconductor layer is formed over the base insulating layer. The semiconductor layer may be formed with a thickness of 25 nm to 200 nm (preferably, 30 nm to 150 nm) by any of various methods (such as a sputtering method, an LPCVD method, or a plasma CVD method). In this embodiment mode, it is preferable to use a crystalline semiconductor layer which is obtained by crystallizing an amorphous semiconductor layer with a laser beam.

The semiconductor layer obtained in this manner may be doped with a slight amount of an impurity element (boron or phosphorus) to control a threshold voltage of a transistor. This doping with an impurity element may be performed to the amorphous semiconductor layer before the step of crystallizing the semiconductor layer. When the doping with an impurity element is performed to the amorphous semiconductor layer, activation of the impurity element can be performed by heat treatment which will be performed later for crystallization. In addition, defects and the like caused by doping can be improved.

The semiconductor layer may be selectively etched to be processed into a desired shape. Alternatively, the semiconductor layer may also be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

At this time, a lower electrode layer forming a capacitor is also formed in the same process as the semiconductor layer. The lower electrode layer is formed in the same layer as the semiconductor layer forming the transistor.

A gate insulating layer is formed to cover the semiconductor layer. The gate insulating layer is formed using an insulating layer containing silicon with a thickness of 10 nm to 150 nm by a plasma CVD method, a sputtering method, or the like. The gate insulating layer may be formed using an inorganic insulating material such as silicon nitride, silicon oxide, silicon oxynitride, or silicon nitride oxide with a single layer structure or a stack structure. The gate insulating layer may be formed to have a three-layer structure of a silicon nitride layer, a silicon oxide layer, and a silicon nitride layer. Alternatively, a single layer structure or a two-layer structure including a silicon oxynitride layer may be used.

Next, a gate electrode layer is formed over the gate insulating layer. The gate electrode layer can be formed by the steps of forming a conductive layer by a sputtering method, an evaporation method, a CVD method, or the like and selectively etching the conductive layer. The gate electrode layer may be formed using an element such as tantalum (Ta), tungsten (W), titanium (Ti), molybdenum (Mo), aluminum (Al), copper, (Cu), chromium (Cr), or neodymium (Nd), or an alloy material or a compound material containing the above element as its main component. Alternatively, the gate electrode layer may be formed using a semiconductor layer typified by a polycrystalline silicon film doped with an impurity element such as phosphorus, or an AgPdCu alloy. The gate electrode layer may have a single layer structure or a stack structure. At this time, an upper electrode layer of a capacitor completed later is also formed. The upper electrode layer is formed using the same material as that of the gate electrode layer.

The gate electrode layer is formed to have a tapered side surface in this embodiment mode. The gate electrode layer can be formed into a tapered shape by using a wet etching method in an etching step. Alternatively, a wet etching method may be sequentially performed after a dry etching method. The gate electrode layer having a perpendicular side surface may be formed. Further, the gate electrode layer may have a two-layer structure in which the layers have different taper angles. When the gate electrode layer has a tapered side surface, coverage thereof by a film to be stacked thereover can be improved.

Alternatively, the gate electrode layer may also be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

In the etching for forming the gate electrode layer, there is a case where a portion of the gate insulating layer is etched to some extent and the thickness thereof is reduced (so-called film reduction).

An impurity element is added to the semiconductor layer to form a pair of impurity regions. The impurity regions formed in the semiconductor layer function as a source region and a drain region. As the impurity element to be added, an impurity element which imparts n-type conductivity or an impurity element which imparts p-type conductivity may be appropriately used. As the impurity element which imparts n-type conductivity, phosphorus (P), arsenic (As), or the like can be used. As the impurity element which imparts p-type conductivity, boron (B), aluminum (Al), gallium (Ga), or the like can be used. At this time, a channel formation region is formed between a pair of impurity regions.

It is to be noted that, in the semiconductor layer, an impurity region called an LDD (Lightly Doped Drain) region may be formed between an impurity region functioning as a source region or a drain region and a channel formation region. The LDD region is an impurity region with a low concentration of impurities than a source region or a drain region. The LDD region may overlap with the gate electrode layer or may not overlap with the gate electrode layer.

Heat treatment, intense light irradiation, or laser beam irradiation may be performed to activate the impurity element. At the same time as the activation, plasma damage to the gate insulating layer and the interface between the gate insulating layer and the semiconductor layer can be repaired.

Then, a first interlayer insulating layer is formed to cover the gate electrode layer and the gate insulating layer. In this embodiment mode, the first interlayer insulating layer has a stack structure of insulating layers 913 and 914. The insulating layers 913 and 914 can be formed using a silicon nitride layer, a silicon nitride oxide layer, a silicon oxynitride layer, a silicon oxide layer, or the like by a sputtering method or a plasma CVD method, or another insulating layer containing silicon may be used in a single layer structure or a stack structure of three or more layers.

In addition, heat treatment is performed in a nitrogen atmosphere at 300° C. to 550° C. for 1 to 12 hours to hydrogenate the semiconductor layer. Preferably, it is performed at 400° C. to 500° C. This step is a step of terminating dangling bonds of the semiconductor layer with hydrogen which is contained in the insulating layer 913 that is the interlayer insulating layer. In this embodiment mode, heat treatment is performed at 410° C.

The insulating layers 913 and 914 can be formed using a material such as aluminum nitride, aluminum oxynitride, aluminum nitride oxide having a higher content of nitrogen than that of oxygen, aluminum oxide, diamond-like carbon (DLC), nitrogen-containing carbon, polysilazane, or other substances including an inorganic insulating material. Alternatively, a material containing siloxane may be used. An organic insulating material may also be used, and polyimide, acrylic, polyamide, polyimide amide, resist, or benzocyclobutene can be used. Moreover, an oxazole resin can be used, and for example, photo-curing polybenzoxazole or the like can be used.

Next, an opening which reaches the source region or the drain region formed in the semiconductor layer is formed in the insulating layers 913 and 914 and the gate insulating layer.

The opening can be formed by utilizing ablation with laser beam irradiation as described in Embodiment Modes 1 to 4. Specifically, by conducting irradiation with two kinds of laser beams that are absorbed by different layers (a layer ablated and a layer stacked thereover) so that the laser beams overlap, a part or all of the region irradiated with an overlap part of the laser beams is ablated; accordingly, an opening is formed. In this embodiment mode, irradiation with a first laser beam having a wavelength that is absorbed by the semiconductor layer and a second laser beam having a wavelength that is absorbed by the gate insulating layer and the insulating layers 913 and 914 is conducted so that the laser beams overlap, and the region irradiated with the overlap part of the laser beams is ablated to remove a part of the gate insulating layer and the insulating layers 913 and 914. Thus an opening reaching the semiconductor layer is formed. Note that the first laser beam has energy with such a level that can ablate the region irradiated with an overlap part of the first laser beam and the second laser beam. The second laser beam has energy with such a level that does not cause an irreversible change of the irradiated region.

The opening reaching the source region or drain region of the semiconductor layer may also be formed by formation of a mask layer using a photoresist and etching with the use of the mask layer.

A source electrode layer or a drain electrode layer is formed in the opening reaching the source region or the drain region of the semiconductor layer. In the above-described manner, the source region or the drain region of the semiconductor layer is electrically connected to the source electrode layer or the drain electrode layer.

The source electrode layer or the drain electrode layer can be formed by the steps of forming a conductive layer by a PVD method, a CVD method, an evaporation method, or the like and then selectively etching the conductive layer. The source electrode layer or the drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or an alloy material or a metal nitride containing the element as its main component. In addition, the source electrode layer or the drain electrode layer may have a single layer structure or a stack structure.

Alternatively, the source electrode layer or the drain electrode layer may also be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place. It is to be noted that a terminal electrode layer 950 of the terminal portion 906 is also formed at the time of forming the source electrode layer or the drain electrode layer.

Through the above process, an active matrix substrate including the transistors 922 and 924 in the pixel portion 902 and plural transistors 926 in the driver circuit portion 904 can be manufactured.

The present invention is not particularly limited thereto, and a transistor may have a single-gate structure in which one channel formation region is formed, a double-gate structure in which two channel formation regions are formed, or a triple-gate structure in which three channel formation regions are formed.

Next, an insulating layer 916 is formed as a second interlayer insulating layer. The insulating layer 916 can be formed of a material such as silicon oxide, silicon nitride, silicon oxynitride, silicon nitride oxide, aluminum nitride, aluminum oxide containing nitrogen (also referred to as aluminum oxynitride), aluminum nitride containing oxygen (also referred to as aluminum nitride oxide), aluminum oxide, diamond-like carbon (DLC), a nitrogen-containing carbon film, PSG (phosphosilicate glass), BPSG (borophosphosilicate glass), alumina, or other substances including an inorganic insulating material. Alternatively, a siloxane resin may be used. Furthermore, an organic insulating material may be used; an organic material may be either photosensitive or non-photosensitive; and polyimide, acrylic, polyamide, polyimide amide, resist, benzocyclobutene, polysilazane, or a low-dielectric constant (Low-k) material can be used. Moreover, an oxazole resin can be used, and for example, photocuring polybenzoxazole or the like can be used. Since an interlayer insulating layer provided for planarization needs to have high heat resistance, a high insulating property, and a high level of planarity, the insulating layer 916 is preferably formed by a coating method typified by a spin coating method.

The insulating layer 916 can also be formed by a dipping method, spray coating, a doctor knife, a roll coater, a curtain coater, a knife coater, a CVD method, an evaporation method, or the like. The insulating layer 916 may also be formed by a droplet discharge method. In the case of using a droplet discharge method, a material liquid can be saved. Alternatively, a method like a droplet discharge method by which a pattern can be transferred or drawn, such as a printing method (a method for forming a pattern such as screen printing or offset printing), a dispenser method, or the like can be used.

An opening which reaches the source electrode layer or the drain electrode layer of the transistor 924 is formed in the insulating layer 916 of the pixel portion 902. The opening may be formed similarly to the opening for electrically connecting the source electrode layer or the drain electrode layer and the source region or the drain region of the semiconductor layer.

For example, by irradiation with two kinds of laser beams that are absorbed by different layers (a layer ablated and a layer stacked thereover) so that the laser beams overlap as described in Embodiment Modes 1 to 4, a part or all of the region irradiated with an overlap part of the laser beams is ablated to form an opening. Specifically, irradiation with a first laser beam having a wavelength that is absorbed by the source electrode layer or the drain electrode layer and a second laser beam having a wavelength that is absorbed by the insulating layer 916 is conducted so that the laser beams overlap, and the region irradiated with the overlap part of the laser beams is ablated to remove a part of the insulating layer 916; thus an opening can be formed. At this time, the first laser beam has energy with such a level that can ablate the region irradiated with the overlap part of the first laser beam and the second laser beam. The second laser beam has energy with such a level that does not cause an irreversible change of the irradiated region. In the case of forming an opening by utilizing ablation with laser beam irradiation, it is preferable to use a low melting metal (in this embodiment, chromium) that evaporates relatively easily, for the source electrode layer or the drain electrode layer. Without using laser ablation, an opening may be formed by formation of a mask layer using a photoresist and etching with the use of the mask layer.

A light emitting element 930 is formed over the insulating layer 916 in the pixel portion 902. The light emitting element 930 is electrically connected to the transistor 924.

First, a first electrode layer 932 is formed in the opening which is provided in the insulating layer 916 and exposes the source electrode layer or the drain electrode layer of the transistor 924.

Next, a partition layer 918 is formed so as to have an opening over the first electrode layer 932 and to cover end portions of the first electrode layer 932. The partition layer 918 can be formed using silicon oxide, silicon nitride, silicon oxynitride, silicon nitride oxide, or the like and may have a single layer structure or a stack structure of two or three layers. The partition layer 918 can alternatively be formed using a material such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon, or other substances including an inorganic insulating material. Alternatively, a material containing siloxane may be used. Furthermore, an organic insulating material may be used; an organic material may be either photosensitive or non-photosensitive; and polyimide, acrylic, polyamide, polyimide amide, resist, benzocyclobutene, or polysilazane can be used. Moreover, an oxazole resin can be used, and for example, photo-curing polybenzoxazole or the like can be used.

The partition layer 918 can be formed by a droplet discharge method by which a pattern can be selectively formed, a printing method by which a pattern can be transferred or drawn (a method for forming a pattern, such as screen printing or offset printing), a dispenser method, a coating method such as a spin coating method, a dipping method, or the like. Alternatively, the partition layer is formed over the entire surface using a photosensitive material, and the partition layer formed of the photosensitive material is exposed to light and developed, whereby the partition layer can be patterned into a desired shape. Further, the partition layer may be formed over the entire surface by a sputtering method, a PVD (Physical Vapor Deposition) method, a CVD (Chemical Vapor Deposition) method such as a low-pressure CVD (LPCVD) method or a plasma CVD method, or the like; a mask of a resist or the like is formed using a lithography technique; and the partition layer may be etched into a desired shape.

The etching into a desired shape may be performed by either a dry etching method or a wet etching method; however, plasma etching (one kind of a dry etching method) is suitable for treating a large-area substrate. As an etching gas, a fluorine-based gas such as $CF_4$, $CHF_3$, or $NF_3$ or a chlorine-based gas such as $Cl_2$ or $BCl_3$ is used, to which an inert gas such as He or Ar may be appropriately added. Alternatively, electric discharge machining can be performed locally when the etching process is performed using atmospheric pressure discharge, and in such a case, a mask of a resist or the like does not need to be formed over the entire surface of the substrate.

The partition layer 918 preferably has a shape of which a radius of curvature continuously changes. By such a shape of the partition layer, coverage by a layer stacked thereover is improved.

Next, a layer 934 and a second electrode layer 936 are stacked over the first electrode layer 932 and the partition layer 918, and the light emitting element 930 having a structure in which the layer 934 is interposed between the first electrode layer 932 and the second electrode layer 936 is obtained. The layer 934 includes a layer containing at least a light emitting material by which a desired emission wavelength can be obtained.

One of the first electrode layer 932 and the second electrode layer 936 functions as an anode and the other functions as a cathode. The first electrode layer 932 and the second electrode layer 936 can be formed using indium tin oxide (ITO), indium tin oxide containing silicon oxide, indium oxide including 2 wt % to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or the like. In addition, aluminum, an alloy of magnesium and silver, an alloy of aluminum and lithium, or the like can be used.

In order to take out light emitted from the layer 934 to an external portion, one or both of the first electrode layer 932 and the second electrode layer 936 are preferably formed using indium tin oxide or the like, or alternatively, silver, aluminum, or the like that is formed to have a thickness of several nm to several tens of nm so as to transmit visible light.

The first electrode layer 932 is formed by forming the above-described material over the entire surface and then selectively etching the material. Alternatively, the first electrode layer 932 may be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place.

The first electrode layer 932 may be cleaned or polished by a CMP method or with the use of a polyvinyl alcohol based porous material so that the surface thereof is planarized. In addition, after polishing using a CMP method, ultraviolet ray irradiation, oxygen plasma treatment, or the like may be performed on the surface of the first electrode layer 932.

After the first electrode layer 932 is formed, heat treatment may be performed. Through this heat treatment, moisture included in the first electrode layer 932 is released. Therefore, degasification or the like is not caused in the first electrode layer 932. Even when a light emitting material which is easily deteriorated by moisture is formed over the first electrode layer 932, the light emitting material is not deteriorated. Accordingly, a highly reliable display device can be manufactured.

The second electrode layer 936 can be formed by an evaporation method, a sputtering method, or the like. In addition, an insulating layer may be provided as a passivation layer (protective layer) over the second electrode layer 936. It is effective to provide a passivation layer to cover the second electrode layer 936 in this manner. The passivation layer can be formed using a single layer structure or a stack structure of an insulating layer including silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or a nitrogen-containing carbon film. Alternatively, the passivation layer may be formed using a siloxane resin.

In this case, a film providing good coverage is preferably used as the passivation layer. A carbon film, especially, a DLC film is effective. The DLC film can be formed at a temperature in the range of room temperature to 100° C.; therefore, the DLC film can be easily formed over the layer 934 even when the layer 934 has low heat resistance. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas for forming a DLC film. The reaction gas is ionized by glow discharge, and the ions are accelerated to collide with a negatively self-biased cathode; accordingly, a DLC film is formed. A nitrogen-containing carbon (CN) film may be formed using a $C_2H_4$ gas and an $N_2$ gas as a reaction gas. The DLC film has a high blocking effect on oxygen and can suppress oxidation of the layer 934. Accordingly, the layer 934 can be prevented from being oxidized during a subsequent sealing step.

The layer 934 formed over the first electrode layer 932 includes a light emitting layer containing at least a light emitting material. The light emitting layer includes a layer containing an organic compound, a layer containing an inorganic compound, or a layer containing both organic and inorganic compounds. The light emitting element 930 in which the layer 934 is provided between the first electrode layer 932 and the second electrode layer 936 can be obtained.

The substrate 901 provided with the light emitting element 930 and the sealing substrate 908 are firmly attached to each other with the sealant 910 to seal the light emitting element 930. As the sealant 910, it is typically preferable to use a visible light curable resin, an ultraviolet curable resin, or a thermosetting resin. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, a heterocyclic epoxy resin, a modified epoxy resin, or the like can be used. It is to be noted that a region 948 surrounded by the sealant may be filled with a filler, or nitrogen or the like may be enclosed by sealing the region in a nitrogen atmosphere. In a structure in which light is taken out through the filler, the filler needs to have a light-transmitting property. Typically, a visible light curable, ultraviolet curable, or thermosetting epoxy resin may be used. Through the above-described process, a display device having a display function with the use of a light emitting element is completed. Alternatively, the filler can be dropped in a liquid state to fill the inside of the display device. When a substance having a hygroscopic property such as a drying agent is used as the filler, a higher water-absorbing effect can be obtained, and deterioration of the light emitting element 930 can be prevented.

In order to prevent element deterioration due to moisture, a drying agent may be provided so as to surround the pixel portion 902. For example, the drying agent may be provided in a depressed portion formed in the sealing substrate, so that it does not interfere with reduction in thickness. Further, when the drying agent is formed in a region corresponding to a gate wiring layer so that a large water-absorbing area is provided, a high water-absorbing effect can be obtained. In addition, when the drying agent is formed over the gate wiring layer which does not emit light itself, reduction in light extraction efficiency can be prevented.

This embodiment mode describes the case where the light emitting element is sealed with a glass substrate. Sealing treatment is treatment for protecting the light emitting element from moisture. Therefore, any of the following methods can be used: a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above-mentioned light emitting element is formed, with a sealant such as a thermosetting resin or an ultraviolet curable resin, and a sealed space is formed by curing the resin by heat treatment or ultraviolet ray irradiation treatment. It is also effective to provide a moisture-absorbing material typified by barium oxide in the sealed space. The moisture-absorbing material may be provided on the sealant or over the partition layer or a peripheral portion so as not to block light emitted from the light emitting element. Further, a space between the cover material and the substrate over which the light emitting element is formed can also be filled with a thermosetting resin or an ultraviolet curable resin. In this case, it is effective to add a moisture-absorbing material typified by barium oxide in the thermosetting resin or the ultraviolet curable resin.

Further, the source electrode layer or the drain electrode layer and the first electrode layer 932 may be electrically connected through a wiring layer (conductive layer), without being in contact with each other directly.

In this embodiment mode, an FPC 954 is connected to the terminal electrode layer 950 through an anisotropic conductive layer 952 in the terminal portion 906 so as to have electrical connection to an external portion.

Moreover, as shown in FIG. 27A, the display device manufactured in this embodiment mode includes the driver circuit portion 904 over the same substrate as the pixel portion 902. It is to be noted that the present invention is not limited thereto and an IC chip may be mounted as a peripheral driver circuit by a COG method or a TAB method as described above.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal input to the source line of the display device may be either an analog signal or a digital signal. The driver circuit and the like may be appropriately designed in accordance with the video signal.

By employing the present invention, an opening can be formed in a desired region without using a lithography step that uses a photoresist. Accordingly, a lithography step can be reduced or simplified. In the present invention, an opening can be formed by laser ablation which is caused by conducting irradiation with two kinds of laser beams that are absorbed by different layers so that the laser beams overlap. With this manner, damage to another layer or a substrate can be prevented and laser ablation can be easily caused, so that an opening can be formed. Accordingly, reduction in manufacturing cost and improvement in throughput can be achieved in manufacture of a display device.

This embodiment mode can be freely combined with any of Embodiment Modes 1 to 5.

Embodiment Mode 7

Various element structures can be applied to a light emitting element that has a display function of a display device. The light emitting element is generally distinguished by whether a light emitting material is an organic compound or an inorganic compound. The former is referred to as an organic EL element, and the latter is referred to as an inorganic EL element. Here, examples of a light emitting element that can be applied to the present invention will be described with reference to FIGS. 12 to 14C.

Figure 12:
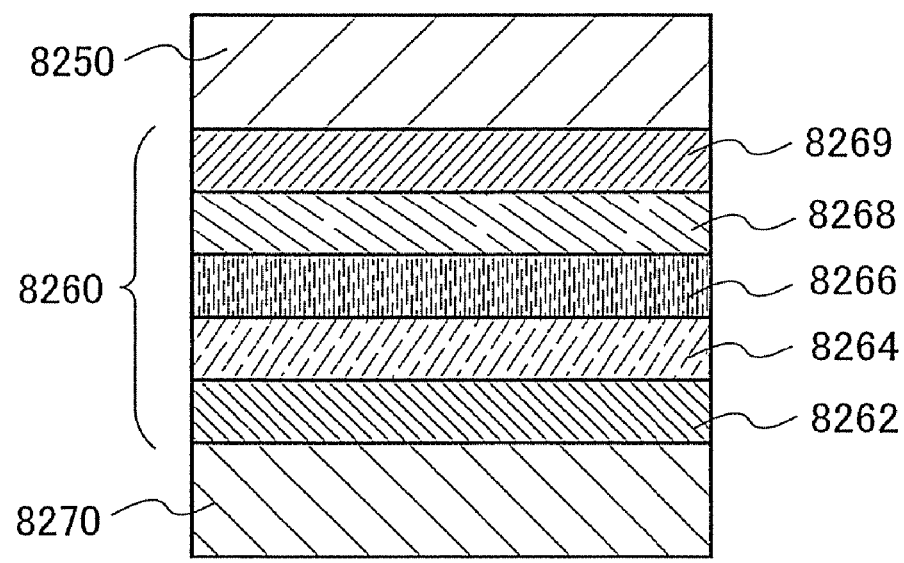
FIG. 12 shows a structure of a light emitting element which can be applied to the present invention.

FIG. 12 shows an organic EL element. In the light emitting element shown in FIG. 12, a layer 8260 is interposed between a first electrode layer 8270 and a second electrode layer 8250. Either the first electrode layer 8270 or the second electrode layer 8250 is an anode, and the other is a cathode. Note that the anode indicates an electrode for injecting holes to a light emitting layer, and the cathode indicates an electrode for injecting electrons to the light emitting layer. In this embodiment mode, the first electrode layer 8270 is an anode and the second electrode layer 8250 is a cathode. Further, the layer 8260 has a structure in which a hole injecting layer 8262, a hole transporting layer 8264, a light emitting layer 8266, an electron transporting layer 8268, and an electron injecting layer 8269 are sequentially stacked.

The first electrode layer 8270 and the second electrode layer 8250 can be formed using gold (Au), platinum (Pt), nickel (Ni), tungsten (W), chromium (Cr), molybdenum (Mo), iron (Fe), cobalt (Co), copper (Cu), palladium (Pd), or the like as well as indium tin oxide (ITO), indium tin oxide containing silicon oxide, indium oxide including 2 wt % to 20 wt % zinc oxide. Moreover, in addition to aluminum, an alloy of magnesium and silver, an alloy of aluminum and lithium, or the like can also be used for forming the first electrode layer 8270. A method for forming the first electrode layer 8270 is the same as that of the first electrode layer 7012 described in Embodiment Mode 4 and that of the first electrode layer 932 described in Embodiment Mode 6. A method for forming the second electrode layer 8250 is not particularly limited, and for example, a sputtering method, an evaporation method, or the like can be used.

Note that, in order to extract light emitted to the outside, it is preferable to form either the first electrode layer 8270 or the second electrode layer 8250, or both of them by using indium tin oxide or the like or by depositing silver, aluminum, or the like to have a thickness of several nm to several tens of nm so that visible light can be transmitted.

The hole injecting layer 8262 is a layer having a function for supporting injection of holes from the first electrode layer 8270 to the hole transporting layer 8264. When the hole injecting layer 8262 is provided, an ionization potential difference between the first electrode layer 8270 and the hole transporting layer 8264 is relieved; thus, holes are easily injected. The hole injecting layer 8262 is preferably formed using a substance ionization potential of which is lower than that of a substance forming the hole transporting layer 8264 and higher than that of a substance forming the first electrode layer 8270. The hole injecting layer 8262 is also preferably formed using a substance energy band of which is bent by being provided as a thin film having a thickness of 1 nm to 2 nm between the hole transporting layer 8264 and the first electrode layer 8270. As a specific example of a substance that can be used for forming the hole injecting layer 8262, a phthalocyanine-based compound such as phthalocyanine (abbreviation: H$_2$Pc) or copper phthalocyanine (CuPc), a high molecular material such as poly(ethylenedioxythiophene)/poly(styrenesulfonic acid) solution (PEDOT/PSS), and the like can be given. That is, a substance is selected from hole transporting substances so that ionization potential in the hole injecting layer 8262 is relatively lower than that in the hole transporting layer 8264; thus, the hole injecting layer 8262 can be formed. In the case of providing the hole injecting layer 8262, it is preferable to form the first electrode layer 8270 using a substance with a high work function such as indium tin oxide. Note that the present invention is not particularly limited, and the hole injecting layer 8262 may or may not be provided.

The hole transporting layer 8264 is a layer having a function for transporting holes that are injected from the first electrode layer 8270 to the light emitting layer 8266. The hole transporting layer 8264 is provided in this way, whereby a distance between the first electrode layer 8270 and the light emitting layer 8266 can be created. As a result, quenching of light emission caused by metal included in the first electrode layer 8270 and the like can be prevented. The hole transporting layer 8264 is preferably formed using a hole transporting substance, particularly using a substance that has a hole mobility of $1\times10^{-6}$ cm$^2$/Vs or more. Note that the hole transporting substance is a substance whose hole mobility is higher than electron mobility and whose value of a ratio of hole mobility with respect to electron mobility (=hole mobility/electron mobility) is preferably larger than 100. As a specific example of a substance that can be used for the hole transporting layer 8264, the following can be given: 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: H$_2$Pc), copper phthalocyanine (abbreviation: CuPc), vanadyl phthalocyanine (abbreviation: VOPc), 4,4'-bis[N-(4-biphenylyl)-N-phenylamino]biphenyl (abbreviation: BBPB), or the like. Note that the hole transporting layer 8264 may have a single layer structure or a stack structure.

The light emitting layer 8266 is a layer having a light emitting function, which contains a light emitting material formed of an organic compound. The light emitting layer 8266 may contain an inorganic compound. The organic compound contained in the light emitting layer 8266 is not particularly limited as long as it is an organic compound with a light emitting property. Various low molecular organic compounds and high molecular organic compounds can be used. Further, either a fluorescent light emitting material or a phosphorescent light emitting material may be used for the organic compound with a light emitting property. The light emitting layer 8266 may be a layer containing only an organic compound with a light emitting property or may be a layer that has a structure in which an organic compound with a light emitting property is dispersed in a host material having a larger energy gap than the organic compound. In a case where the light emitting layer 8266 is a layer in which a plurality of compounds are mixed as a layer containing a light emitting material formed of the organic compound and the host material, the light emitting layer 8266 can be formed by a co-evaporation method. Here, a co-evaporation method is an evaporation method in which materials are vaporized from a plurality of evaporation sources that are provided in one treatment chamber, and the vaporized materials are mixed in a vapor phase state and then deposited on the object to be processed.

The electron transporting layer 8268 is a layer having a function for transporting electrons that are injected from the second electrode layer 8250 to the light emitting layer 8266. The electron transporting layer 8268 is provided as described-above, whereby a distance between the second electrode layer 8250 and the light emitting layer 8266 can be created. As a result, quenching of light emission caused by metal included in the second electrode layer 8250 and the like can be prevented. The electron transporting layer 8268 is preferably formed using an electron transporting substance, particularly using a substance that has an electron mobility of $1\times10^{-6}$ cm$^2$/Vs or more. Note that the electron transporting substance is a substance whose electron mobility is higher than hole mobility and whose value of a ratio of electron mobility with respect to hole mobility (=electron mobility/hole mobility) is larger than 100. As a specific example of a substance that can be used for forming the electron transporting layer 8268, the following can be given: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), 4,4-bis(5-methylbenzoxazol-2-yl)stilbene (abbreviation: BzOs), or the like as well as a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$). The electron transporting layer 8268 may have a single layer structure or a stack structure.

The electron injecting layer 8269 is a layer having a function for supporting injection of electrons from the second electrode layer 8250 to the electron transporting layer 8268. The electron injecting layer 8269 can be formed using a substance having relatively higher electron affinity than that of a substance used for forming the electron transporting layer 8268, which is selected from substances that can be used for forming the electron transporting layer 8268 such as BPhen, BCP, p-EtTAZ, TAZ, and BzOs. When the electron injecting layer 8269 is formed in such a manner, a difference of electron affinity between the second electrode layer 8250 and the electron transporting layer 8268 is relieved, and electrons are injected easily. In addition, the electron injecting layer 8269 may contain an inorganic substance such as alkali metal like lithium (Li), cesium (Cs), or the like; oxide of alkali metal like lithium oxide, potassium oxide, sodium oxide, or the like; oxide of alkaline earth metal like calcium oxide, magnesium oxide, or the like; fluoride of alkali metal like lithium fluoride, cesium fluoride, or the like; fluoride of alkaline earth metal like calcium fluoride or the like; or alkaline earth metal like magnesium (Mg), calcium (Ca), or the like. In addition, the electron injecting layer 8269 may have a structure containing an organic compound such as BPhen, BCP, p-EtTAZ, TAZ, or BzOs or may have a structure containing an inorganic compound such as fluoride of alkali metal such as LiF or fluoride of alkaline earth metal such as $CaF_2$. By providing the electron injecting layer 8269 as a thin film having a thickness of 1 nm to 2 nm by using an inorganic compound such as fluoride of alkali metal such as LiF or fluoride of alkaline earth metal such as $CaF_2$, an energy band of the electron injecting layer 8269 is bent, or a tunnel current flows through the electron injecting layer 8269; accordingly, electrons are easily injected from the second electrode layer 8250 to the electron transporting layer 8268.

Note that a hole generating layer may be provided instead of the hole injecting layer 8262, or an electron generating layer may be provided instead of the electron injecting layer 8269.

Here, the hole generating layer is a layer for generating holes. The hole generating layer can be formed by mixing at least one substance selected from hole transporting substances and a substance showing an electron accepting property with respect to the hole transporting substance. As the hole transporting substance, a similar substance to the substance that can be used for forming the hole transporting layer 8264 can be used. As the substance showing an electron accepting property, metal oxide such as molybdenum oxide, vanadium oxide, ruthenium oxide, or rhenium oxide is preferably used.

The electron generating layer is a layer for generating electrons. The electron generating layer can be formed by mixing at least one substance selected from electron transporting substances and a substance showing an electron donating property with respect to the electron transporting substance. Here, as the electron transporting substance, a similar substance to the substance that can be used for forming the electron transporting layer 8268 can be used. As the substance showing an electron donating property, a substance selected from alkali metal or alkaline earth metal, specifically lithium (Li), calcium (Ca), sodium (Na), potassium (K), magnesium (Mg), or the like can be used.

The hole injecting layer 8262, the hole transporting layer 8264, the light emitting layer 8266, the electron transporting layer 8268, and the electron injecting layer 8269 may be each formed by an evaporation method, a droplet discharge method, a coating method, or the like. The first electrode layer 8270 or the second electrode layer 8250 may be formed by a sputtering method, an evaporation method, or the like.

In this embodiment mode, it is acceptable as long as the layer 8260 includes at least the light emitting layer 8266, and the layers having other functions (the hole injecting layer 8262, the hole transporting layer 8264, the electron transporting layer 8268, the electron injecting layer 8269, and the like) may be provided as appropriate.

Further, the first electrode layer 8270 may be a cathode, and the second electrode layer 8250 may be an anode. In that case, the layer 8260 has a structure in which an electron injecting layer, an electron transporting layer, a light emitting layer, a hole transporting layer, and a hole injecting layer are sequentially stacked from the first electrode layer 8270 side.

Next, an inorganic EL element will be described with reference to FIGS. 13A to 13C and FIGS. 14A to 14C. The inorganic EL element is classified into a dispersion-type inorganic EL element and a thin-film-type inorganic EL element, depending on its element structure. The former and the latter are different in that the former has a light emitting layer in which particles of a light emitting material are dispersed in a binder, whereas the latter has a light emitting layer formed of a thin film of a light emitting material. However, the former and the latter are in common in that they need electrons accelerated by a high electric field. Note that, as a mechanism of light emission that is obtained, there are donor-acceptor recombination-type light emission that utilizes a donor level and an acceptor level, and localized-type light emission that utilizes inner-shell electron transition of a metal ion. In general, a dispersion-type inorganic EL exhibits donor-acceptor recombination-type light emission and a thin-film-type inorganic EL element exhibits localized-type light emission.

A light emitting material that can be used in the present invention includes a base material and an impurity element. The impurity element serves as a luminescent center. By the change of the impurity element to be contained, light emission of various colors can be obtained. Various methods such as a solid-phase method or a liquid-phase method (a coprecipitation method) can be used for forming the light emitting material. In addition, an evaporative decomposition method, a double decomposition method, a method by heat decomposition reaction of a precursor, a reverse micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, and the mixture is heated and baked in an electric furnace to be reacted, so that the impurity element is contained in the base material. The baking temperature is preferably 700° C. to 1500° C. This is because the solid reaction does not progress when the temperature is too low, whereas the base material is decomposed when the temperature is too high. Note that, although the baking may be carried out in a powder state, it is preferable that the baking be carried out in a pellet state. Although the solid-phase method needs baking at a comparatively high temperature, the solid-phase method is easy; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light emitting material are distributed uniformly, and the reaction can progress even when the grain size is small and the baking temperature is low.

As a base material used for a light emitting material, sulfide, oxide, or nitride can be used. For the sulfide, for example, the following can be used: zinc sulfide, cadmium sulfide, calcium sulfide, yttrium sulfide, gallium sulfide, strontium sulfide, barium sulfide, or the like. For the oxide, for example, zinc oxide, yttrium oxide, or the like can be used. For the nitride, for example, aluminum nitride, gallium nitride, indium nitride, or the like can be used. Furthermore, zinc selenide, zinc telluride, or the like can also be used. Alternatively, a ternary mixed crystal such as calcium gallium sulfide ($CaGa_2S_4$), strontium gallium sulfide ($SrGa_2S_4$), or barium gallium sulfide ($BaGa_2S_4$) may also be used.

For an impurity element of the localized-type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added, which can serve as charge compensation.

On the other hand, for an impurity element of the donor-acceptor recombination-type light emission, a light emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light emitting material of the donor-acceptor recombination-type light emission is synthesized by a solid-phase method, a base material, a first impurity element or a compound containing a first impurity element, and a second impurity element or a compound containing a second impurity element are weighed and mixed in a mortar, and then heated and baked in an electric furnace. The above-described base material can be used for the base material. As the first impurity element or the compound containing the first impurity element, for example, fluorine (F), chlorine (Cl), aluminum sulfide, or the like can be used. As the second impurity element or the compound containing the second impurity element, for example, copper (Cu), silver (Ag), copper sulfide, silver sulfide, or the like can be used. The baking temperature is preferably 700° C. to 1500° C. This is because the solid reaction does not progress when the temperature is too low, whereas the base material is decomposed when the temperature is too high. Note that, although the baking may be carried out in a powder state, it is preferable that the baking be carried out in a pellet state.

As an impurity element in the case of utilizing solid-phase reaction, a compound including a first impurity element and a second impurity element may be used. In this case, the impurity element is easily diffused and solid-phase reaction easily progresses; thus, a uniform light emitting material can be obtained. Moreover, since an unnecessary impurity element does not enter, a light emitting material with high purity can be obtained. As the compound including the first impurity element and the second impurity element, for example, copper chloride, silver chloride, or the like can be used.

Note that these impurity elements may be contained at concentrations of 0.01 atom % to 10 atom %, preferably, 0.05 atom % to 5 atom % with respect to the base material.

In the case of the thin-film-type inorganic EL element, a light emitting layer, which contains the above-described light emitting material, can be formed by a vacuum evaporation method such as a resistance heating evaporation method or an electron beam evaporation (EB evaporation) method; a physical vapor deposition (PVD) method such as a sputtering method; a chemical vapor deposition (CVD) method such as a metal organic CVD method or a low-pressure hydride transport CVD method; an atomic layer epitaxy (ALE) method; or the like.

Figure 13A:
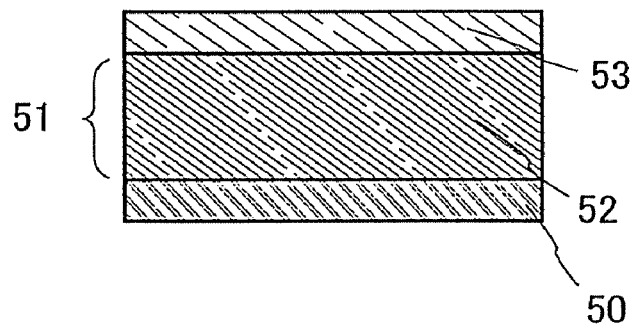
FIGS. 13A to 13C show structures of a light emitting element which can be applied to the present invention.
Figure 13B:
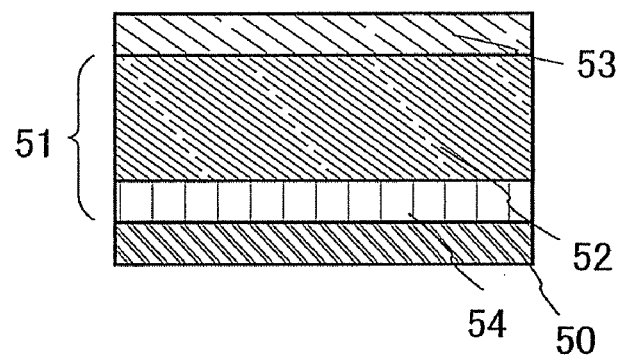
Figure 13C:
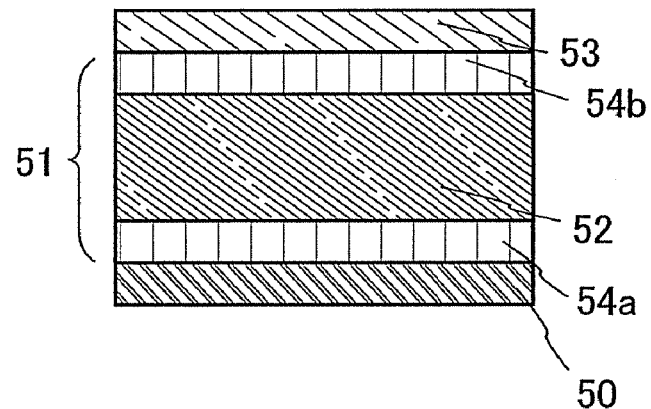

Examples of a thin-film-type inorganic EL element that can be used as a light emitting element are shown in FIGS. 13A to 13C. In FIGS. 13A to 13C, each light emitting element includes a first electrode layer 50, a layer 51, and a second electrode layer 53. The layer 51 includes at least a light emitting layer 52.

In the light emitting element shown in FIG. 13A, the layer 51 including only the light emitting layer 52 is interposed between the first electrode layer 50 and the second electrode layer 53. The light emitting elements shown in FIGS. 13B and 13C each has a structure where an insulating layer is provided between the light emitting layer 52 and the first electrode layer 50 and/or the second electrode layer 53 in the light emitting element of FIG. 13A. The light emitting element shown in FIG. 13B has a structure in which an insulating layer 54 is provided between the first electrode layer 50 and the light emitting layer 52. The light emitting element shown in FIG. 13C has a structure in which an insulating layer 54a is provided between the first electrode layer 50 and the light emitting layer 52 and an insulating layer 54b is provided between the second electrode layer 53 and the light emitting layer 52. As the above, an insulating layer may be provided between the light emitting layer and one of a pair of the electrode layers that sandwiches the light emitting layer. Alternatively, an insulating layer may be provided between a light emitting layer and one of a pair of electrode layers that sandwich the light emitting layer and another insulating layer may be provided between the light emitting layer and the other one of the pair of electrode layers. The insulating layer may have a single layer structure or a stack structure.

In FIG. 13B, the insulating layer 54 is provided to be in contact with the first electrode layer 50; however, the order of the insulating layer and the light emitting layer may be reversed so that the insulating layer 54 is provided to be in contact with the second electrode layer 53.

Next, a dispersion-type inorganic EL element will be described. In the case of the dispersion-type inorganic EL element, particulate light emitting materials are dispersed in a binder, so that a film-shaped light emitting layer is formed. When particles having a desired size cannot be sufficiently obtained by a formation method of a light emitting material, the light emitting materials may be processed into particles by crushing in a mortar or the like. The binder is a substance for fixing the particulate light emitting materials in a dispersion state and holding the light emitting materials in a form of a light emitting layer. The light emitting materials are uniformly dispersed in the light emitting layer by the binder and are fixed.

In the case of the dispersion-type inorganic EL element, as a formation method of a light emitting layer, a droplet discharge method capable of selectively forming a light emitting layer; a printing method (such as screen printing or offset printing); or a coating method such as a spin coating method; a dipping method; a dispenser method; or the like can be used. Although there is no particular limitation on the thickness of the light emitting layer, the thickness thereof is preferably in a range of 10 nm to 1000 nm. The ratio of the light emitting material in the light emitting layer containing the light emitting material and the binder may be greater than or equal to 50 wt % and less than or equal to 80 wt %.

Figure 14A:
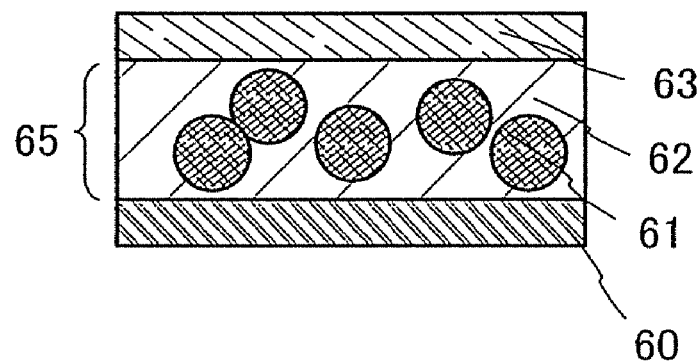
FIGS. 14A to 14C show structures of a light emitting element which can be applied to the present invention.
Figure 14B:
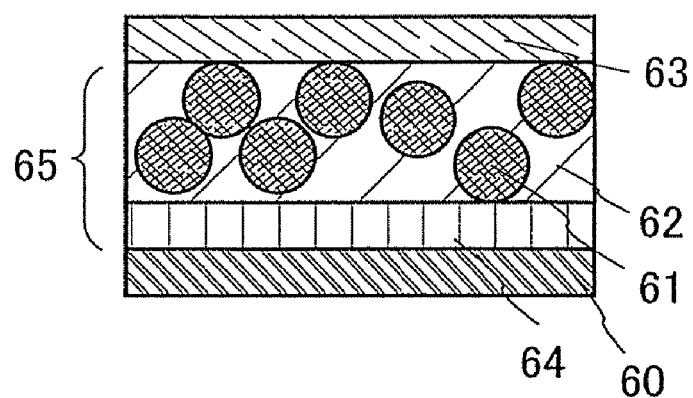
Figure 14C:
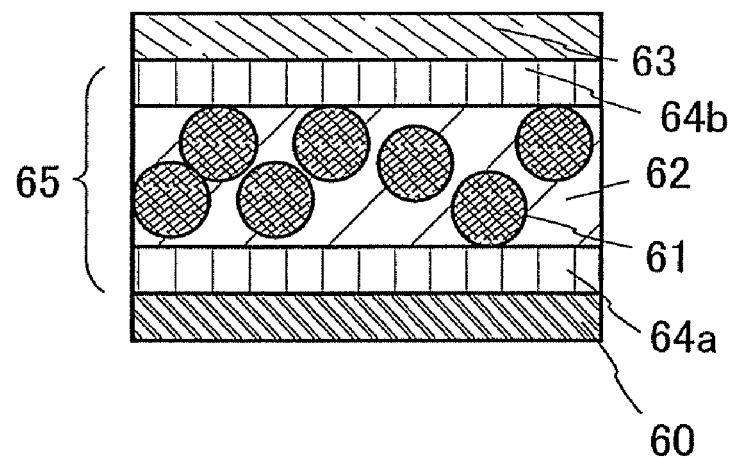

Examples of a dispersion-type inorganic EL element that can be used as a light emitting element are shown in FIGS. 14A to 14C. In FIGS. 14A to 14C, each light emitting element includes a first electrode layer 60, a layer 65, and a second electrode layer 63. The layer 65 includes at least a light emitting layer.

The light emitting element shown in FIG. 14A has a stack structure of the first electrode layer 60, a light emitting layer 62, and the second electrode layer 63. In the light emitting layer 62, light emitting materials 61 held by a binder are included.

As a binder that can be used in this embodiment mode, an insulating material can be used. Specifically, an organic insulating material or an inorganic insulating material can be used, and a mixed material of an organic insulating material and an inorganic insulating material may be used. As the organic insulating material, polymer that has relatively high dielectric constant like a cyanoethyl cellulose-based resin; or a resin such as polyethylene, polypropylene, a polystyrene-based resin, a silicone resin, an epoxy resin, or vinylidene fluoride can be used. Alternatively, a heat-resistant high molecular material such as aromatic polyamide or polybenzimidazole, or a siloxane resin may be used. Note that the siloxane resin corresponds to a resin having Si—O—Si bonds. Siloxane has a skeletal structure including a bond of silicon (Si) and oxygen (O). An organic group containing at least hydrogen (for example, an alkyl group or aromatic hydrocarbon) is used as a substituent. Alternatively, as the substituent, a fluoro group may be used. Further alternatively, as the substituent, an organic group containing at least hydrogen, and a fluoro group may be used. A vinyl resin such as polyvinyl alcohol or polyvinyl butyral, or another resin material such as a phenol resin, a novolac resin, an acrylic resin, a melamine resin, a urethane resin, or an oxazole resin (polybenzoxazole) may also be used. A dielectric constant can also be controlled by mixing these resins with microparticles having a high dielectric constant such as barium titanate or strontium titanate as appropriate.

As the inorganic insulating material contained in the binder, the following can be used: a material selected from silicon oxide (SiOx), silicon nitride (SiNx), silicon containing oxygen and nitrogen, aluminum nitride, aluminum containing oxygen and nitrogen, aluminum oxide, titanium oxide, $BaTiO_3$, $SrTiO_3$, lead titanate, potassium niobate, lead niobate, tantalum oxide, barium tantalate, lithium tantalate, yttrium oxide, zirconium oxide, and other substances containing an inorganic material. When an inorganic insulating material having high dielectric constant is mixed with an organic insulating material (by addition or the like), the dielectric constant of a light emitting layer including a light emitting material and a binder can be further controlled and increased. A mixed layer of an inorganic insulating material and an organic insulating material is used for a binder, and the high dielectric constant is obtained, whereby further high electric charge can be induced by the light emitting material.

In the manufacturing process, the light emitting materials are dispersed in a solution containing a binder. As a solvent of the solution containing a binder that can be used in this embodiment mode, a solvent, which dissolves a binder material and which can make a solution having a viscosity that is appropriate for a method of forming a light emitting layer (various wet processes) and for a desired thickness, is appropriately selected. When an organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light emitting elements shown in FIGS. 14B and 14C each have a structure where an insulating layer is provided between the light emitting layer 62 and the first electrode layer 60 and/or the second electrode layer 63 in the light emitting element of FIG. 14A. The light emitting element shown in FIG. 14B has an insulating layer 64 between the first electrode layer 60 and the light emitting layer 62. The light emitting element shown in FIG. 14C has an insulating layer 64a between the first electrode layer 60 and the light emitting layer 62 and also has an insulating layer 64b between the second electrode layer 63 and the light emitting layer 62. As described above, the insulating layer may be provided between the light emitting layer and one of a pair of electrode layers that sandwiches the light emitting layer. Alternatively, an insulating layer may be provided between the light emitting layer and one of a pair of electrode layers that sandwiches the light emitting layer and another insulating layer may be provided between the light emitting layer and the other one of the pair of electrode layers. The insulating layer may have a single layer structure or a stack structure.

In FIG. 14B, the insulating layer 64 is provided to be in contact with the first electrode layer 60; however, the order of the insulating layer and the light emitting layer may be reversed so that the insulating layer 64 is provided to be in contact with the second electrode layer 63.

Insulating layers such as the insulating layer 54 in FIGS. 13A to 13C and the insulating layer 64 in FIGS. 14A to 14C are not particularly limited; however, it is preferable that the insulating layer have high withstand voltage, be a dense film, and furthermore have a high dielectric constant. For example, the insulating layer can be formed using silicon oxide (SiOx), yttrium oxide, titanium oxide, aluminum oxide, hafnium oxide, tantalum oxide, barium titanate, strontium titanate, lead titanate, silicon nitride, zirconium oxide, or the like; a mixed layer thereof; or stacked layers containing two or more kinds of these. These insulating layers can be formed by a sputtering method, an evaporating method, a CVD method, or the like. Alternatively, the insulating layer may be formed in such a manner that particles of these insulating materials are dispersed in a binder. A binder material may be formed of a material that is similar to that of a binder contained in a light emitting layer and may be formed by a method that is similar thereto. Although there is no particular limitation on the thickness of the insulating layer, the thickness thereof is preferably in a range of 10 nm to 1000 nm.

The inorganic EL elements shown in FIGS. 13A to 13C and FIGS. 14A to 14C can obtain light emission by applying a voltage between a pair of electrode layers that sandwiches the light emitting layer. The light emitting element can operate by any of DC driving and AC driving.

The light emitting elements shown in this embodiment mode (FIG. 12, FIGS. 13A to 13C, and FIGS. 14A to 14C) can be provided as display elements in the display device shown in the above embodiment modes.

For example, in a case where the organic EL element shown in FIG. 12 is applied to the display device shown in FIGS. 10A to 10C, the first electrode layer 7012 and the second electrode layer 7018 correspond to the first electrode layer 8270 and the second electrode layer 8250, respectively. The layer 7016 corresponds to the layer 8260. In the case of the display device shown in FIGS. 27A and 27B, similarly, the first electrode layer 932 and the second electrode layer 936 correspond to the first electrode layer 8270 and the second electrode layer 8250, respectively. The layer 934 corresponds to the layer 8260.

Further, the case is similar to the above, in which the inorganic EL elements shown in FIGS. 13A to 14C are applied to the display device shown in FIGS. 10A to 10C. The first electrode layer 7012 and the second electrode layer 7018 correspond to the first electrode layer 50 and the second electrode layer 53, or the first electrode layer 60 and the second electrode layer 63. The layer 7016 corresponds to the layer 51 or the layer 65. In the case of the display device shown in FIGS. 27A and 27B, similarly, the first electrode layer 932 and the second electrode layer 936 correspond to the first electrode layer 50 and the second electrode layer 53, or the first electrode layer 60 and the second electrode layer 63. The layer 934 corresponds to the layer 51 or the layer 65.

The present invention can be applied to formation of an opening in order to connect the light emitting element shown in this embodiment mode to a transistor or the like. By using the present invention, throughput is improved in a manufacturing process of a display device including a light emitting element.

This embodiment mode can be freely combined with any of Embodiment Modes 4 to 6.

Embodiment Mode 8

Embodiment Mode 8 will describe a liquid crystal display device.

Figure 29A:
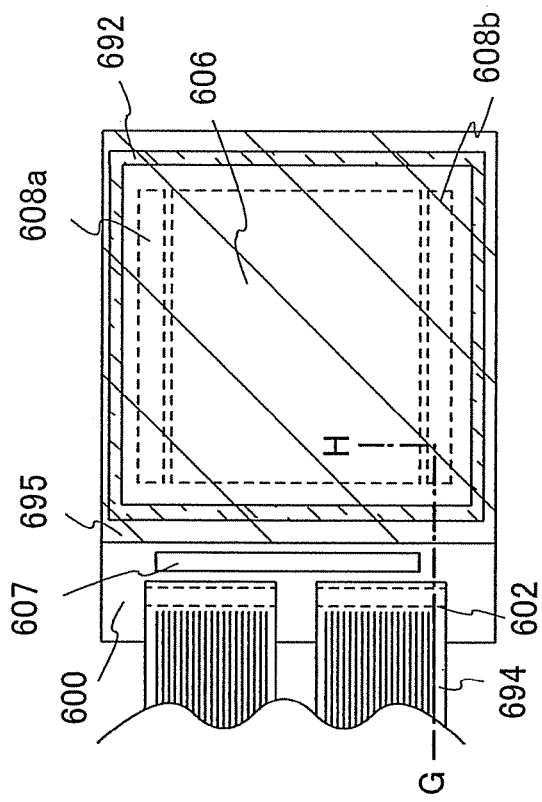
FIGS. 29A and 29B show an example of a display device of the present invention.
Figure 29B:
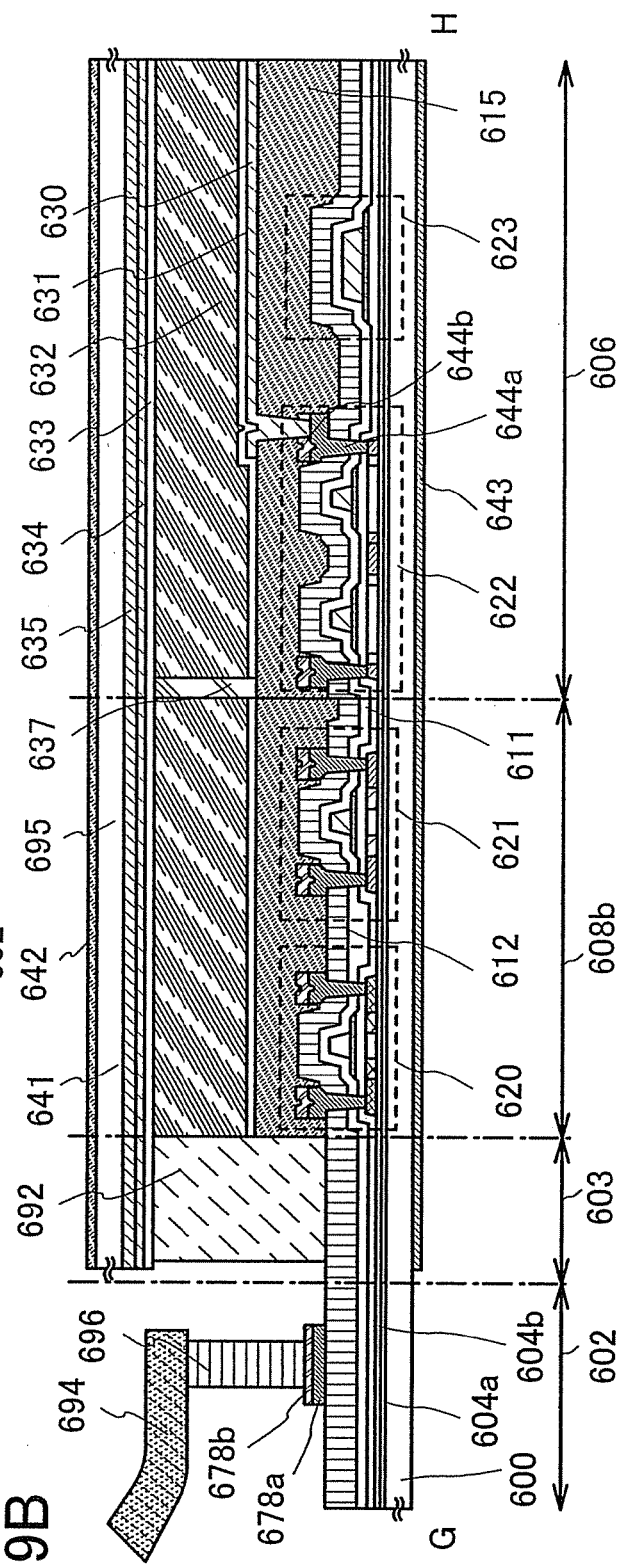

FIG. 29A is a top view of a liquid crystal display device, and FIG. 29B is a cross-sectional view of FIG. 29A taken along a line G-H.

As shown in FIG. 29A, a pixel region 606, a driver circuit region 608a that is a scanning line driver circuit, and a driver circuit region 608b that is a scanning line driver region are sealed between a substrate 600 and a sealing substrate 695 with a sealant 692. A driver circuit region 607 that is a signal line driver circuit formed using an IC driver is provided over the substrate 600. In the pixel region 606, a transistor 622 and a capacitor 623 are provided, and in the driver circuit region 608b, a driver circuit including a transistor 620 and a transistor 621 is provided. A substrate similar to that in the above embodiment mode can be used as the substrate 600. Although, in the case of using a substrate made of a synthetic resin as the substrate 600, there is concern that the substrate made of a synthetic resin generally has lower allowable temperature limit than other substrates, the substrate made of a synthetic resin can be employed by transfer after a manufacturing process using a high heat-resistant substrate.

In the pixel region 606, the transistor 622 functioning as a switching element is provided over the substrate 600 with a base insulating layer 604a and a base insulating layer 604b interposed therebetween. In this embodiment mode, the transistor 622 is a multi-gate thin film transistor, which includes a semiconductor layer including impurity regions that serve as a source region and a drain region, a gate insulating layer, a gate electrode layer having a two-layer structure, and a source electrode layer and a drain electrode layer. The source electrode layer or the drain electrode layer is electrically connected to the impurity region of the semiconductor layer. The source electrode layer or the drain electrode layer is electrically connected to a pixel electrode layer 630.

The source electrode layer and the drain electrode layer each have a stack structure. Each of the source electrode layer and the drain electrode layer is in contact with and electrically connected to the impurity region of the semiconductor layer by an opening formed in an insulating layer 612, an insulating layer 611, and the gate insulating layer which cover the gate electrode layer.

The openings reaching the impurity regions of the semiconductor layer can be formed by utilizing ablation using laser beam irradiation as described in Embodiment Modes 1 to 4. Specifically, by conducting irradiation with two kinds of laser beams that are absorbed by different layers (a layer ablated and a layer stacked thereover) so that the laser beams overlap, a part or all of the region irradiated with an overlap part of the laser beams is ablated: accordingly, the openings are formed. In this embodiment mode, irradiation with a first laser beam having a wavelength that is absorbed by the semiconductor layer and a second laser beam having a wavelength that is absorbed by the gate insulating layer and the insulating layers 611 and 612 is conducted so that the laser beams overlap, and the region irradiated with an overlap part of the laser beams is ablated to remove a part of the gate insulating layer and the insulating layers 611 and 612. Thus the openings reaching the semiconductor layer are formed. Note that the first laser beam has energy with such a level that can ablate the region irradiated with an overlap part of the first laser beam and the second laser beam. The second laser beam has energy with such a level that does not cause an irreversible change of the irradiated region.

The openings reaching the impurity regions of the semiconductor layer may be formed by formation of a mask layer using a photoresist and etching with the use of the mask layer.

In addition, source or drain electrode layers 644a and 644b are in contact with and electrically connected to the pixel electrode layer 630 at an opening formed in the insulating layer 615. The opening formed in the insulating layer 615 is formed in the following manner as described in Embodiment Modes 1 to 4: irradiation with two kinds of laser beams that are absorbed by different layers (a layer ablated and a layer stacked thereover) is conducted so that the laser beams overlap, and a part or all of the region irradiated with an overlap part of the laser beams is ablated to form an opening. Specifically, irradiation with a first laser beam having a wavelength that is absorbed by the source or drain electrode layer 644b and a second laser beam having a wavelength that is absorbed by the insulating layer 615 is conducted so that the laser beams overlap, and the region irradiated with the overlap part of the laser beams is ablated to remove a part of the source or drain electrode layer 644b and the insulating layer 615; thus an opening can be formed. At this time, the first laser beam has energy with such a level that can ablate the region irradiated with an overlap part of the first laser beam and the second laser beam. The second laser beam has energy with such a level that does not cause an irreversible change of the irradiated region. In this embodiment mode, a low melting metal (in this embodiment, chromium) that evaporates relatively easily is used for the source or drain electrode layer 644b. A high melting metal (in this embodiment mode, tungsten) that evaporates less easily than the source or drain electrode layer 644b is used for the source or drain electrode layer 644a. By appropriately selecting energy of the laser beams and the material of the source or drain electrode layer, only the insulating layer 615 can be removed by ablation to form an opening. Without using laser ablation, an opening may be formed by formation of a mask layer using a photoresist and etching with the use of the mask layer.

The pixel electrode layer 630 is formed in the opening in which the source or drain electrode layers 644a and 644b are exposed, so that the source or drain electrode layers 644a and 644b are electrically connected to the pixel electrode layer 630.

A thin film transistor (TFT) can be manufactured by various methods. For example, a crystalline semiconductor layer is employed as a semiconductor layer. A gate electrode layer is provided over the crystalline semiconductor layer with a gate insulating layer interposed therebetween. An impurity element can be added to the crystalline semiconductor layer using the gate electrode layer. By addition of an impurity element using the gate electrode layer in this manner, a mask layer does not need to be formed for addition of an impurity element. The gate electrode layer can have a single layer structure or a stack structure. The impurity region can be formed into a high-concentration impurity region or a low-concentration impurity region by controlling the concentration thereof. A thin film transistor having a low-concentration impurity region in this manner is referred to as an LDD (Lightly Doped Drain) structure. The low-concentration impurity region can be formed to overlap with the gate electrode, and such a thin film transistor is referred to as a GOLD (Gate Overlapped LDD) structure. The thin film transistor can be formed to have an n-type polarity by using phosphorus (P) in the impurity region. In a case of a p-type polarity, boron (B) or the like may be added. After that, an insulating film 611 and an insulating film 612 are formed to cover the gate electrode layer and the like. Dangling bonds of the crystalline semiconductor layer can be terminated by hydrogen mixed in the insulating layer 611 (and the insulating layer 612).

In order to further improve planarity, the insulating layer 615 may be formed as an interlayer insulating layer. The insulating layer 615 can be formed using an organic insulating material or an inorganic insulating material to have a single layer structure or a stack structure. For example, the insulating layer 615 can be formed of a material selected from substances including an inorganic insulating material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, a nitrogen-containing carbon (CN), phosphosilicate glass (PSG), borophosphosilicate glass (BPSG), or alumina, or the like. Alternatively, an organic insulating material may be used; an organic material may be either photosensitive or non-photosensitive; and polyimide, acrylic, polyamide, polyimide amide, a resist, benzocyclobutene, a siloxane resin, or the like can be used. Note that the siloxane resin corresponds to a resin having Si—O—Si bonds. Siloxane has a skeletal structure including a bond of silicon (Si) and oxygen (O). As a substituent, an organic group containing at least hydrogen (for example, an alkyl group or aromatic hydrocarbon) is used. A fluoro group may be used as the substituent. Alternatively, an organic group containing at least hydrogen and a fluoro group may be used as the substituent By using the crystalline semiconductor layer, the pixel region and the driver circuit region can be formed over the same substrate. In that case, the transistor in the pixel region and the transistor in the driver circuit region 608b are formed simultaneously. The transistor used in the driver circuit region 608b constitutes a part of a CMOS circuit. Although the thin film transistor included in the CMOS circuit has a GOLD structure, it may have an LDD structure like the transistor 622.

Without limitation to this embodiment mode, the thin film transistor in the pixel region 606 may have a single-gate structure in which a single channel formation region is formed, a double-gate structure in which two channel formation regions are formed, or a triple-gate structure in which three channel formation regions are formed. In addition, the thin film transistor of a peripheral driver circuit region may also have a single-gate structure, a double-gate structure, or a triple-gate structure.

Note that without limitation to the formation method of a thin film transistor described in this embodiment mode, the present invention can be used in a top-gate structure (such as a staggered structure), a bottom-gate structure (such as an inversely staggered structure), a dual-gate structure including two gate electrode layers provided above and below a channel region each with a gate insulating film interposed therebetween, or another structure.

Next, an insulating layer 631 called an orientation film is formed by a printing method or a droplet discharge method to cover the pixel electrode layer 630. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 serving as an orientation film is similar to the insulating layer 631. Then, the sealant 692 is formed by a droplet discharge method in a peripheral region of the pixel region.

After that, the sealing substrate 695 provided with the insulating layer 633 serving as an orientation film, a conductive layer 634 serving as an opposite electrode, a colored layer 635 serving as a color filter, a polarizer 641 (also referred to as a polarizing plate), and a polarizer 642 is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided on a side of the substrate 600 opposite to the side of having elements. The polarizer can be provided over the substrate using an adhesive layer. The sealant may be mixed with a filler, and further, the sealing substrate 695 may be provided with a shielding film (black matrix) or the like. Note that the color filters or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light emitting diodes (LEDs) of RGB or the like are arranged as a backlight and a successive additive color mixing method (field sequential method) in which color display is performed by time division is employed. The black matrix is preferably provided so as to overlap with a transistor and a CMOS circuit for the sake of reducing reflection of external light by wirings of the transistor and the CMOS circuit. Note that the black matrix may be provided so as to overlap with a capacitor. This is because reflection by a metal film forming the capacitor can be prevented.

The liquid crystal layer can be formed by a dispenser method (dropping method), or an injecting method by which liquid crystal is injected using a capillary phenomenon after attaching the substrate 600 including an element to the sealing substrate 695. The dropping method is preferably employed when using a large-area substrate to which an injecting method is difficult to be applied.

Although the spacer may be provided in such a way that particles each having a size of several micrometers are sprayed, the spacer in this embodiment mode is formed by a method in which a resin film is formed over an entire surface of the substrate and then etched. A material of the spacer is applied by a spinner and then subjected to light exposure and development to form a predetermined pattern. Moreover, the material is heated at 150° C. to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the opposite substrate is attached. The shape can be conical, pyramidal, or the like, and there is no particular limitation on the shape.

Then, terminal electrode layers 678$a$ and 678$b$ electrically connected to the pixel region are provided with an FPC 694 that is a wiring board for connection, through an anisotropic conductive layer 696. The FPC 694 functions to transmit external signals or potential. Through the above process, a liquid crystal display device having a display function can be manufactured.

A wiring layer (conductive layer) and a gate electrode layer which are included in the transistor, the pixel electrode layer 630, and the conductive layer 634 that is an opposite electrode layer can be formed using a material selected from indium tin oxide (ITO), indium zinc oxide (IZO) formed using a target in which indium oxide is mixed with zinc oxide (ZnO), a conductive material in which indium oxide is mixed with silicon oxide, organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy containing the above metal as its main component; or metal nitride thereof.

A retardation film may be stacked between the polarizer and the liquid crystal layer.

Although a TN liquid crystal panel is described in this embodiment mode, the above process can be similarly applied to a liquid crystal panel of another type. For example, this embodiment mode can be applied to a liquid crystal panel of a transverse electrical field type in which liquid crystal is orientated by applying an electric field parallel to a glass substrate. Further, this embodiment mode can be applied to a liquid crystal panel of a VA (Vertical Alignment) type.

Figure 17:
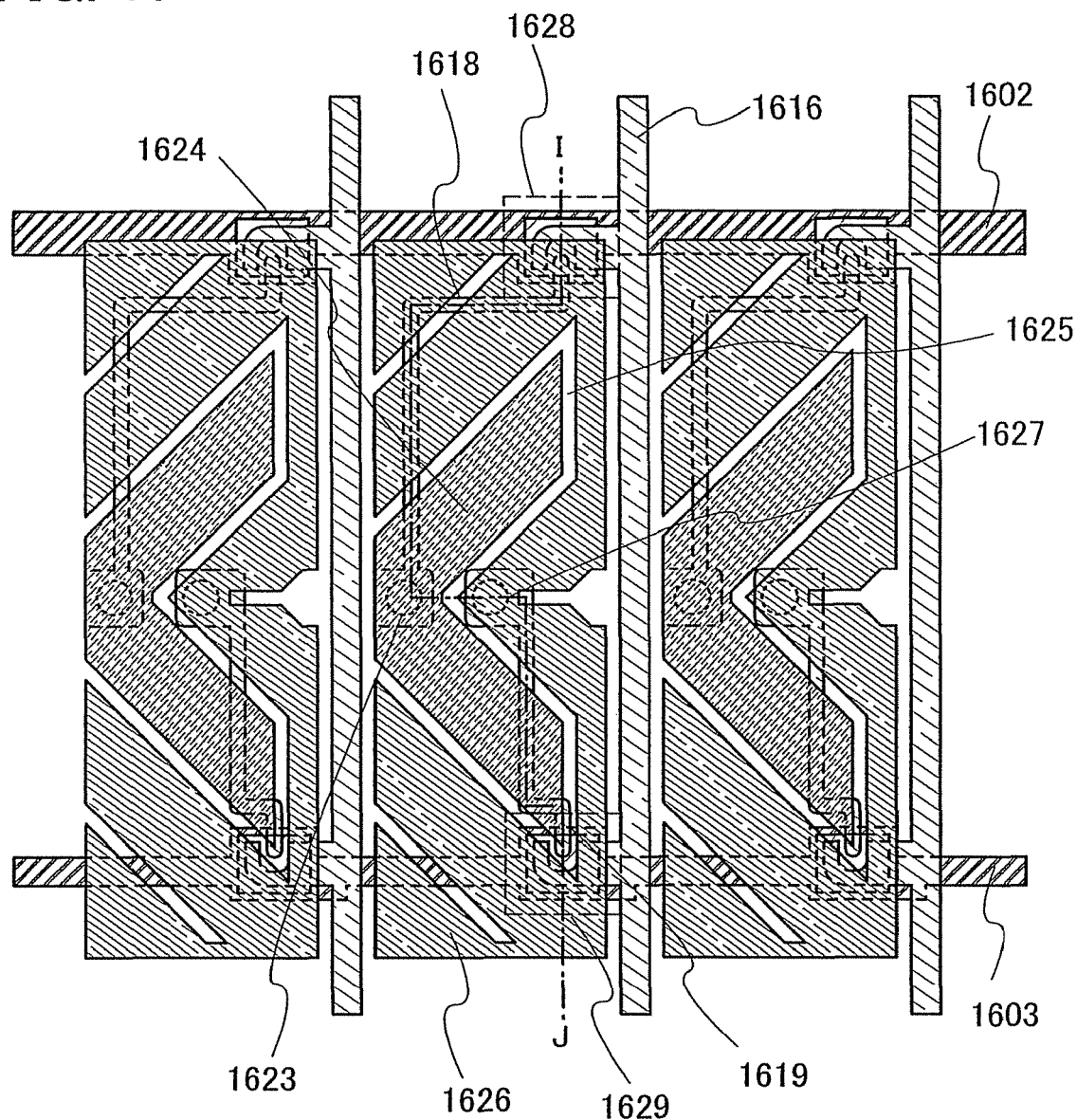
FIG. 17 shows an example of a display device of the present invention.
Figure 18:
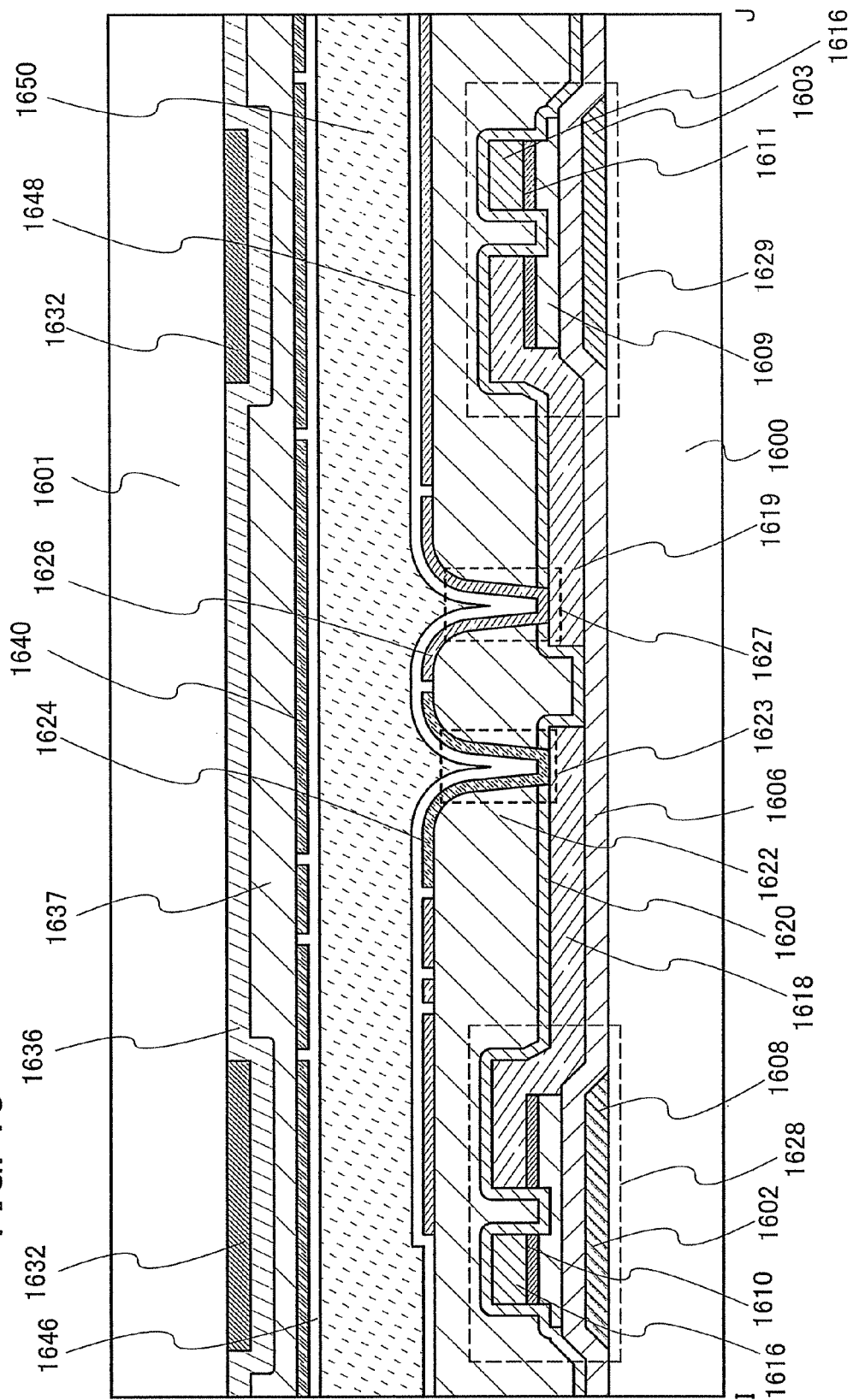
FIG. 18 shows an example of a display device of the present invention.

FIGS. 17 and 18 show a pixel structure of a VA-type liquid crystal panel. FIG. 17 is a plane view, and FIG. 18 is a cross-sectional view of a structure taken along a line I-J in FIG. 17. Hereinafter, the pixel structure is described with reference to the both drawings.

In this pixel structure, a plurality of pixel electrodes are included in one pixel, and TFTs are connected to the pixel electrodes. Each of the TFTs is driven by a different gate signal. In other words, a multi-domain pixel has a structure in which signals applied to the pixel electrodes are individually controlled.

A pixel electrode layer 1624 is connected to a TFT 1628 by a wiring layer 1618 using an opening (contact hole) 1623. A pixel electrode layer 1626 is connected to a TFT 1629 by a wiring layer 1619 using an opening (contact hole) 1627. A gate electrode layer 1602 of the TFT 1628 and a gate electrode layer 1603 of the TFT 1629 are separated so that different gate signals can be given. On the other hand, a wiring layer 1616 serving as a data line is used in common for the TFT 1628 and the TFT 1629.

The opening 1623 and the opening 1627 can be formed by utilizing ablation using laser beam irradiation as described in Embodiment Mode 1 to 4. Specifically, by conducting irradiation with two kinds of laser beams that are absorbed by different layers (a layer ablated and a layer stacked thereover) so that the laser beams overlap, a part or all of the region irradiated with an overlap part of the laser beams is ablated: accordingly, openings are formed. In this embodiment mode, irradiation with a first laser beam having a wavelength that is absorbed by the wiring layers 1618 and 1619 and a second laser beam having a wavelength that is absorbed by the insulating layers 1620 and 1622 over the wiring layers 1618 and 1619 is conducted so that the laser beams overlap, and the region irradiated with an overlap part of the laser beams is ablated to remove a part of the insulating layers 1620 and 1622. Thus openings are formed. Note that the first laser beam has energy with such a level that can ablate the region irradiated with the overlap part of the first laser beam and the second laser beam. The second laser beam has energy with such a level that does not cause an irreversible change of the irradiated region. Although the insulating layers 1620 and 1622 are removed to form the openings, openings may be formed so as to remove upper portions of the wiring layers 1618 and 1619 and leave lower portions thereof or so as to penetrate the wiring layers 1618 and 1619 by selecting energy of the first laser beam and the second laser beam, materials of the wiring layers 1618 and 1619, and the like as appropriate. In this case, the wiring layers 1618 and 1619 are exposed at side surfaces (or at side surfaces and the bottom) of the openings, it is possible to electrically connect the wiring layers 1618 and 1619 to the pixel electrode layers 1624 and 1626.

Figure 19:
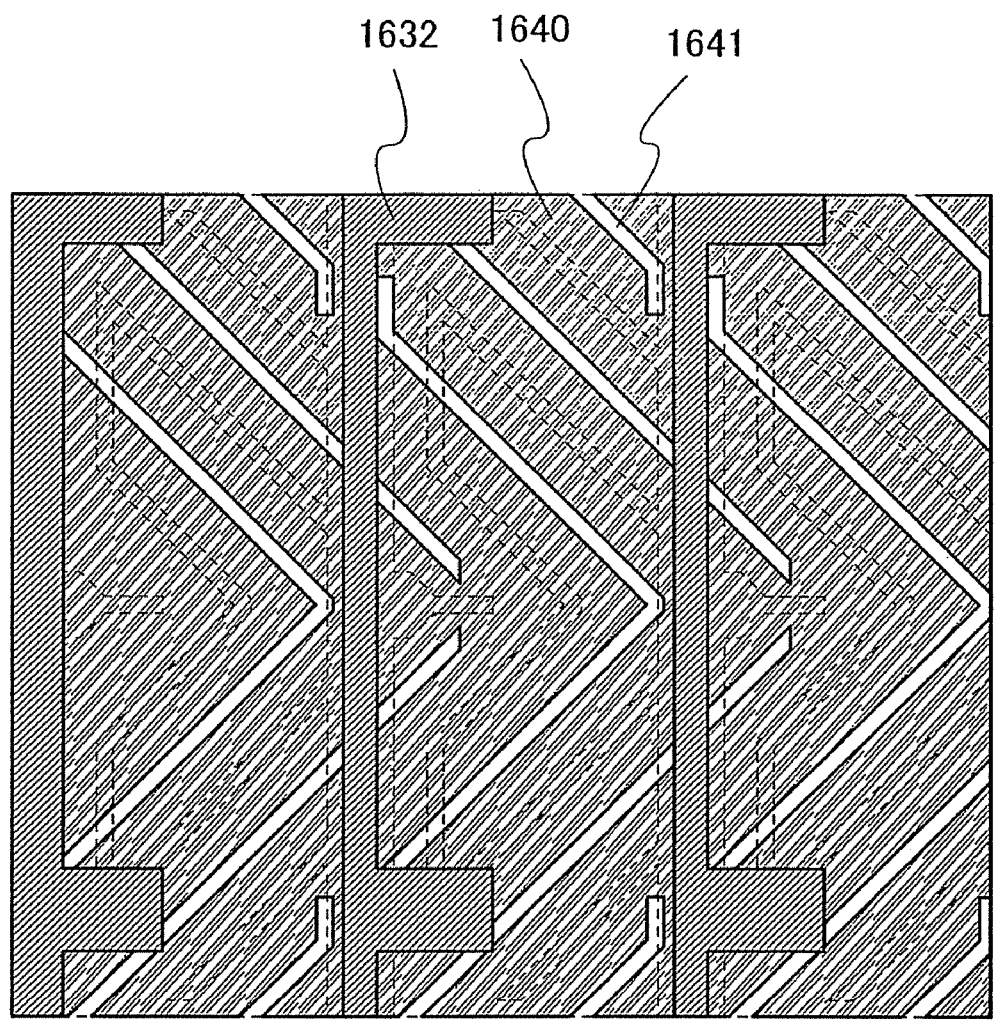
FIG. 19 shows an example of a display device of the present invention.

The pixel electrode layer 1624 and the pixel electrode layer 1626 can be formed by forming a conductive material over an entire surface and selectively etching the conductive material. The shape of the pixel electrode layer 1624 and the shape of the pixel electrode layer 1626 are different from each other, and the pixel electrode layers are separated by a slit 1625. The pixel electrode layer 1626 is formed so as to surround the external side of the pixel electrode layer 1624 that is spread in a V-shaped manner. Timing of voltage application is made to vary between the pixel electrode layer 1624 and the pixel electrode layer 1626 by the TFT 1628 and the TFT 1629, whereby orientation of liquid crystal is controlled. An opposite substrate 1601 is provided with a light-blocking layer 1632, a colored layer 1636, and an opposite electrode layer 1640. Furthermore, a planarization layer 1637 is formed between the colored layer 1636 and the opposite electrode layer 1640, whereby orientation disorder of liquid crystal is prevented. FIG. 19 shows a structure of the opposite substrate side. Although the opposite electrode layer 1640 is used in common between different pixels, a slit 1641 is formed. This slit 1641 and the slit 1625 on the pixel electrode layers 1624 and 1626 side are arranged to be meshed alternately, whereby an oblique electric field is efficiently generated, and orientation of liquid crystal can be controlled. Thus, directions in which liquid crystal is oriented can be varied depending on places, and a viewing angle is widened.

By employing the present invention, an opening can be formed in a desired region without using a lithography step that uses a photoresist. Accordingly, a lithography step can be reduced or simplified. In the present invention, an opening can be formed by laser ablation which is caused by conducting irradiation with two kinds of laser beams that are absorbed by different layers so that the laser beams overlap. With this manner, damage to another layer or a substrate can be prevented and laser ablation can be easily caused, so that an opening can be formed. Accordingly, reduction in manufacturing cost and improvement in throughput can be achieved in a manufacturing process of a display device.

This embodiment mode can be freely combined with any of Embodiment Modes 1 to 4.

Embodiment Mode 9

Embodiment Mode 9 will describe a liquid crystal display device using a liquid crystal display element for a display element.

Figure 30:
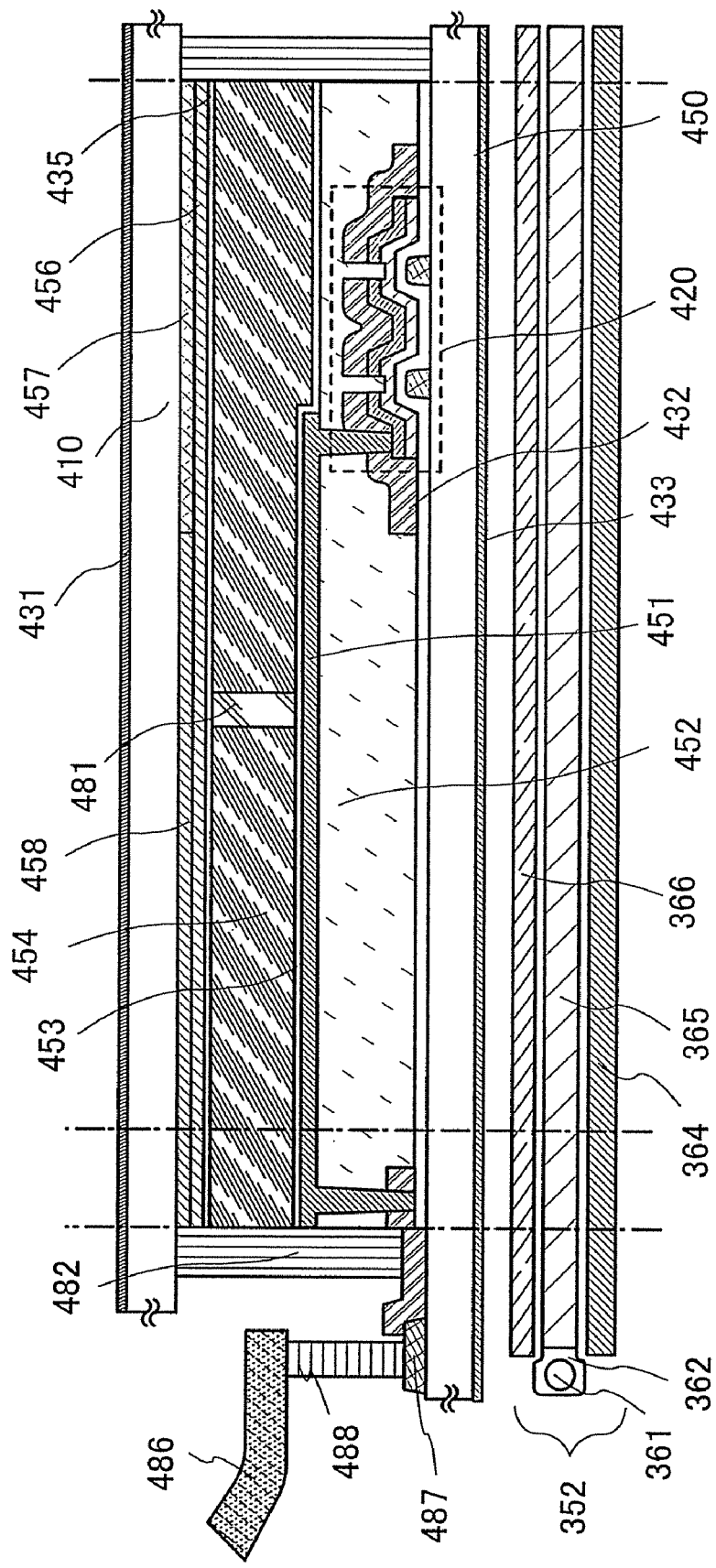
FIG. 30 shows an example of a display device of the present invention.

In a display device shown in FIG. 30, the following is provided over a substrate 450: a transistor 420 that is an inversely staggered transistor, a pixel electrode layer 451, an insulating layer 452, an insulating layer 453, a liquid crystal layer 454, a spacer 481, an insulating layer 435, an opposite electrode layer 456, a color filter 458, a black matrix 457, an opposite substrate 410, a polarizer (polarizing plate) 431, a polarizer (polarizing plate) 433 in a pixel region; and a sealant 482, a terminal electrode layer 487, an anisotropic conductive layer 488, and an FPC 486 in a sealing region.

A gate electrode layer, a semiconductor layer, a source electrode layer, and a drain electrode layer of the transistor 420, and the pixel electrode layer 451 manufactured in this embodiment mode can be formed by forming a material layer including a conductive material or a semiconductor material and selectively etching the material layer as appropriate as described in Embodiment Modes 6 and 8, and the like.

In this embodiment mode, an amorphous semiconductor layer is used as a semiconductor layer for forming a channel. A semiconductor layer having one conductivity type provided between a source electrode layer or drain electrode layer and the semiconductor layer for forming a channel may be formed as needed. In this embodiment mode, a semiconductor layer and an amorphous n-type semiconductor layer as a semiconductor layer having one conductivity type are stacked. Moreover, an NMOS structure of an n-channel thin film transistor where an n-type semiconductor layer is formed as the semiconductor layer having one conductivity type, a PMOS structure of a p-channel thin film transistor where a p-type semiconductor layer is formed, or a CMOS structure of an n-channel thin film transistor and a p-channel thin film transistor can be manufactured.

An n-channel transistor or a p-channel transistor can be formed in such a manner that an element which imparts a conductivity type is added by doping in order to impart conductivity, and an impurity region is formed in the semiconductor layer. Alternatively, plasma treatment using a $PH_3$ gas may be performed, so that a conductivity type is imparted to the semiconductor layer.

In this embodiment mode, the transistor 420 is an n-channel inversely staggered thin-film transistor. A channel protection-type inversely staggered thin-film transistor can be used, where a protective layer is provided over a channel region of a semiconductor layer.

Next, a structure of a backlight unit 352 is described. The backlight unit 352 includes a cold cathode tube, a hot cathode tube, a light emitting diode, an inorganic EL, or an organic EL as a light source 361 that emits fluorescence; a lamp reflector 362 for effectively leading fluorescence to a light conducting plate 365; the light conducting plate 365 by which fluorescence is totally reflected and light is led to the entire surface; a diffusing plate 366 for reducing variations in brightness; and a reflector plate 364 for reusing light leaked under the light conducting plate 365.

A control circuit for controlling the luminance of the light source 361 is connected to the backlight unit 352. The luminance of the light source 361 can be controlled by a signal supplied from the control circuit.

The source electrode layer or the drain electrode layer of the transistor 420 is electrically connected to the pixel electrode layer 451 at an opening formed in the insulating layer 452. The opening can be formed by utilizing ablation using laser beam irradiation as described in Embodiment Modes 1 to 4. Specifically, the opening can be formed in the following manner: irradiation with two kinds of laser beams that are absorbed by different layers (a layer ablated and a layer stacked thereover) is conducted so that the laser beams overlap and a part or all of the region irradiated with an overlap part of the laser beams is ablated. In this embodiment mode, irradiation with a first laser beam having a wavelength that is absorbed by the source or drain electrode layer and a second laser beam having a wavelength that is absorbed by the insulating layer 452 is conducted so that the laser beams overlap, and the region irradiated with an overlap part of the laser beams is ablated to remove a part of the source or drain electrode layer and the insulating layer 452; thus the opening can be formed. The source or drain electrode layer and the semiconductor layer having one conductivity type are exposed at a side surface and a bottom of the opening. The first laser beam has energy with such a level that can ablate the region irradiated with an overlap part of the first laser beam and the second laser beam. The second laser beam has energy with such a level that does not cause an irreversible change of the irradiated region. In the case of forming an opening utilizing ablation using laser beam irradiation, it is preferable to use a low melting metal (in this embodiment, chromium) that evaporates relatively easily for the source or drain electrode layer. Although an example where the opening is formed to penetrate the insulating layer 452 and the source or drain electrode layer is described in this embodiment mode, an opening can be formed to penetrate only the insulating layer 452 or to remove an upper portion of the source or drain electrode layer and leave a lower portion thereof, by appropriately selecting energy of the first laser beam and the second laser beam and materials for forming the source or drain electrode layer, the insulating layer, and the like.

The pixel electrode layer 451 is formed in the opening formed in the insulating layer 452, and the source or drain electrode layer is electrically connected to the pixel electrode layer 451.

By employing the present invention, an opening can be formed in a desired region without using a lithography step that uses a photoresist. Accordingly, a lithography step can be reduced or simplified. In the present invention, an opening can be formed by laser ablation which is caused by conducting irradiation with two kinds of laser beams that are absorbed by different layers so that the laser beams overlap. With this manner, damage to another layer or a substrate can be prevented and laser ablation can be easily caused, so that an opening can be formed. Accordingly, reduction in manufacturing cost and improvement in throughput can be achieved in a manufacturing process of a display device.

This embodiment mode can be freely combined with any of Embodiment Modes 1 to 4 and 8.

Embodiment Mode 10

Embodiment Mode 10 will describe an example of a display device different from that of the above embodiment mode.

Figure 20:
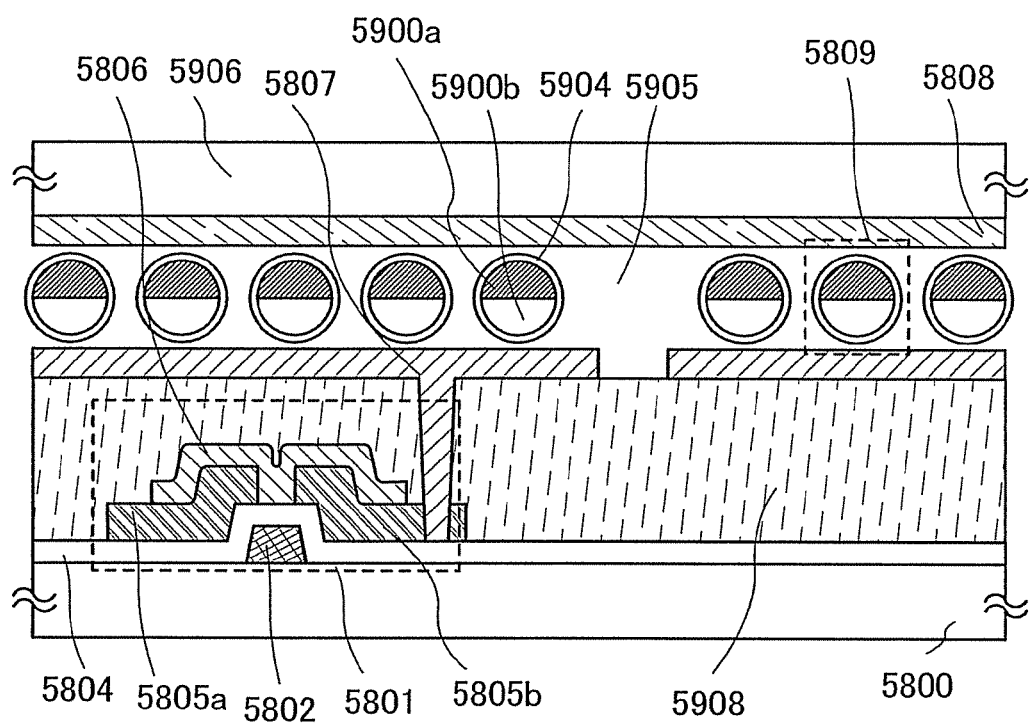
FIG. 20 shows an example of a display device of the present invention.

FIG. 20 shows an active-matrix electronic paper to which the present invention is applied. Although the active-matrix electronic paper is shown in FIG. 20, the present invention can be applied to a passive-matrix electronic paper.

As the electronic paper, a twisting ball display system can be used. A twisting ball display system is a method in which display is performed by providing between a first electrode layer and a second electrode layer spherical particles each of which is colored separately in black and white, and generating a potential difference between the first electrode layer and the second electrode layer so as to control the directions of the spherical particles.

A transistor 5801 is an inverted coplanar thin film transistor, which includes a gate electrode layer 5802, a gate insulating layer 5804, wiring layers 5805*a* and 5805*b*, and a semiconductor layer 5806. The wiring layers 5805*a* and 5805*b* serve as a source electrode layer and a drain electrode layer. In addition, the wiring layer 5805*b* is in contact with and electrically connected to a first electrode layer 5807 through an opening formed in an insulating layer 5908. Between the first electrode layer 5807 and a second electrode layer 5808, spherical particles 5809, each of which includes a black region 5900*a* and a white region 5900*b*, and in which a cavity 5904 filled with liquid is included around the black region 5900*a* and the white region 5900*b*, are provided. A space around the spherical particles 5809 is filled with a filler 5905 such as a resin.

In this embodiment mode, the gate electrode layer 5802, the semiconductor layer 5806, the wiring layers 5805*a* and 5805*b*, and the like included in the transistor 5801 can be formed as follows, as shown in the above embodiment mode: a material layer is formed using a conductive material or a semiconductor material and the material layer is selectively etched as appropriate.

The wiring layer 5805*b* is electrically connected to the first electrode layer 5807 at the opening formed in the insulating layer 5908. The opening can be formed by utilizing ablation using laser beam irradiation as described in Embodiment Modes 1 to 4. Specifically, the opening can be formed in the following manner: irradiation with two kinds of laser beams that are absorbed by different layers (a layer ablated and a layer stacked thereover) is conducted so that the laser beams overlap and a part or all of the region irradiated with an overlap part of the laser beams is ablated. In this embodiment mode, irradiation with a first laser beam having a wavelength that is absorbed by the wiring layer 5805*b* and a second laser beam having a wavelength that is absorbed by the insulating layer 5908 is conducted so that the laser beams overlap, and the region irradiated with the overlap part of the laser beams is ablated to remove a part of the insulating layer 5908 and the wiring layer 5805*b*; thus the opening can be formed. The first laser beam has energy with such a level that can ablate the region irradiated with the overlap part of the first laser beam and the second laser beam. The second laser beam has energy with such a level that does not cause an irreversible change of the irradiated region. In the case of forming an opening utilizing ablation using laser beam irradiation, it is preferable to use a low melting metal (in this embodiment, chromium) that evaporates relatively easily for the wiring layer 5805*b*.

Although an example where the opening is formed to penetrate the insulating layer 5908 and the wiring layer 5805*b* is described in this embodiment mode, an opening can be formed to penetrate only the insulating layer 5908 or to remove an upper portion of the wiring layer 5805*b* and leave a lower portion thereof, by appropriately selecting energy of the first laser beam and the second laser beam and materials for forming the wiring layer, the insulating layer, and the like.

The first electrode layer 5807 is formed in the opening formed in the insulating layer 5908, and the first electrode layer 5807 is electrically connected to the wiring layer 5805*b*.

By utilizing laser ablation, an opening can be formed in the insulating layer without conducting a complicated lithography step.

Instead of the twisting ball, an electrophoretic element can also be used. A microcapsule having a diameter of approximately 10 µm to 20 µm, in which a transparent liquid, and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is called electronic paper in general. The electrophoretic display element has higher reflectance than a liquid crystal display element, and thus, an auxiliary light is unnecessary, less power is consumed, and a display portion can be recognized in a dusky place. Even when power is not supplied to the display portion, an image which has been displayed once can be maintained. Thus, it is possible that a displayed image can be stored, even if a display device having a display function is distanced from a source of an electric wave.

Any structure is acceptable for the transistor as long as the transistor can serve as a switching element. The semiconductor layer may be formed using various semiconductors such as an amorphous semiconductor, a crystalline semiconductor, a polycrystalline semiconductor, and a microcrystalline semiconductor, or an organic transistor may be formed using an organic compound.

Although a case in which a structure of a display device is an active-matrix type is specifically described in this embodiment mode, the present invention can be naturally applied to a passive-matrix display device.

By employing the present invention, an opening can be formed in a desired region without using a lithography step that uses a photoresist. Accordingly, a lithography step can be reduced or simplified. In the present invention, an opening can be formed by laser ablation which is caused by conducting irradiation with two kinds of laser beams that are absorbed by different layers so that the laser beams overlap. With this manner, damage to another layer or a substrate can be prevented and laser ablation can be easily caused, so that an opening can be formed. Accordingly, reduction in manufacturing cost and improvement in throughput can be achieved in a display device.

This embodiment mode can be freely combined with any of Embodiment Modes 1 to 4.

Embodiment Mode 11

Next, a mode in which a driver circuit for driving is mounted on a display panel manufactured in accordance with Embodiment Modes 4 to 10 will be described.

First, a display device employing a COG method is described with reference to FIG. 16A. A pixel portion 2701 for displaying information of characters, images, or the like is provided over a substrate 2700. A substrate provided with a plurality of driver circuits is divided into rectangles, and driver circuits (also referred to as driver ICs) 2751 after division are mounted on the substrate 2700. FIG. 16A shows a mode of mounting the plurality of driver ICs 2751 and mounting FPCs 2750 on the end of the driver ICs 2751. In addition, the size obtained after division may be made almost equal to the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 16B. Similarly to the case of a COG method, a single driver IC may be mounted on a single tape. In this case, a metal piece or the like for fixing the driver IC may be attached together in terms of strength.

A plurality of driver ICs to be mounted on a display panel are preferably formed over a rectangular substrate having a size of 300 mm to 1000 mm, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or a length obtaining by adding a side length of the pixel portion to a side length of each driver circuit.

An advantage of the driver IC over an IC chip is the length of the long side of the external dimension. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased because the shape of a substrate used as a mother body is not limited. This is a great advantage compared with the case of taking IC chips out of a circular silicon wafer.

When a scanning line driver circuit 3702 is formed in an integrated manner over a substrate as shown in FIG. 15B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with a continuous wave laser beam. Therefore, a continuous wave solid-state or gas laser is preferably used for an oscillator for generating the laser beam. There are almost no crystal defects when a continuous wave laser beam is used, and as a result, a polycrystalline semiconductor layer having a large grain size can be obtained. When a transistor is manufactured using such a semiconductor layer, high-speed driving is possible because mobility or response speed is high, and it is possible to further improve an operating frequency of an element than that of the conventional element. Therefore, high reliability can be obtained because variation in characteristics is little. Note that the channel-length direction of the transistor and a scanning direction of a laser beam may be arranged in the same direction to further improve the operating frequency. This is because the highest mobility can be obtained when a channel length direction of a transistor and a scanning direction of a laser beam over a substrate are almost parallel to each other (preferably, greater than or equal to −30° and less than or equal to 30°) in a step of laser crystallization with a continuous wave laser beam. Note that the channel length direction corresponds to a current flowing direction, in other words, a direction in which an electric charge moves in a channel formation region. The thus manufactured transistor has a semiconductor layer including a polycrystalline semiconductor layer in which a crystal grain is extended in the channel direction, and this means that a crystal grain boundary is formed almost along the channel direction.

In order to perform laser crystallization, it is preferable to significantly narrow down the laser beam, and the shape of the laser beam (beam spot) preferably has the same width as that of a short side of the driver ICs, approximately 1 mm or more and 3 mm or less. In addition, in order to secure an enough and effective energy density for an irradiation object, a region irradiated with the laser beam preferably has a linear shape. The term "linear" used herein refers to not a line in a strict sense but a rectangle or an oblong with a high aspect ratio. For example, the linear shape refers to a shape with an aspect ratio of 2 or more (preferably higher than or equal to 10 and lower than or equal to 10000). Thus, by making a width of the laser beam shape (beam spot) the same length as a short side of the driver ICs, a method for manufacturing a display device with improved productivity can be provided.

As shown in FIGS. 16A and 16B, driver ICs may be mounted as both the scanning line driver circuit and the signal line driver circuit. In this case, it is preferable to use the driver ICs having different specifications for the scanning line driver circuit and the signal line driver circuit.

In the pixel region, the signal lines and the scanning lines intersect to form a matrix, and transistors are arranged corresponding to intersections. One feature of this embodiment mode is that TFTs having an amorphous semiconductor or a semiamorphous semiconductor in channel portions are used as the transistors arranged in the pixel region. The amorphous semiconductor is formed by a method such as a plasma CVD method or a sputtering method. The semiamorphous semiconductor can be formed by a plasma CVD method at a temperature of 300° C. or lower. A film of the semiamorphous semiconductor having a thickness necessary to form the transistor can be formed in a short time even in the case of using, for example, a non-alkaline glass substrate having an external size of 550 mm×650 mm. The feature of such a manufacturing technique is effective for manufacturing a large-sized display device. In addition, a semiamorphous TFT can obtain a field effect mobility of 2 $cm^2$/V-sec to 10 $cm^2$/V-sec by forming a channel formation region using a SAS. Thus, a display panel in which system-on-panel is realized can be manufactured.

The scanning line driver circuit can also be formed in an integrated manner over the substrate by using a TFT having a semiconductor layer formed of a SAS. In the case of using a TFT having a semiconductor layer formed of a SAS, the driver ICs may be mounted as both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, a drive frequency thereof is 100 kHz or less, and high-speed operation is not comparatively required. Therefore, it is preferable to set a channel length (L) of the transistor included in the scanning line driver sufficiently long. On the other hand, a transistor of the signal line driver IC is required to withstand a voltage of only approximately 12 V; however, a drive frequency thereof is around 65 MHz at 3 V, and high-speed operation is required. Therefore, it is preferable to set a channel length or the like of the transistor included in the driver on a micron rule.

A method for mounting the driver IC is not particularly limited, and a COG method, a wire bonding method, or a TAB method can be employed.

When the thicknesses of the driver IC and the opposite substrate are set equal to each other, the heights thereof are almost same, which contributes to thinning of a display device as a whole. When substrates are formed of the same material, thermal stress is not generated and characteristics of a circuit formed of a TFT are not damaged even when a temperature change is caused in the display device. Furthermore, the number of the driver ICs to be mounted on one pixel region can be reduced by mounting longer driver ICs than IC chips as driver circuits as described in this embodiment mode.

In this manner, a driver circuit can be incorporated in a display panel.

Embodiment Mode 12

In a display panel (EL display panel or liquid crystal display panel) manufactured in accordance with Embodiment Modes 4 to 11, an example will be shown, in which a semiconductor layer is formed of an amorphous semiconductor or a SAS, and a scanning line driver circuit is formed over a substrate.

Figure 22:
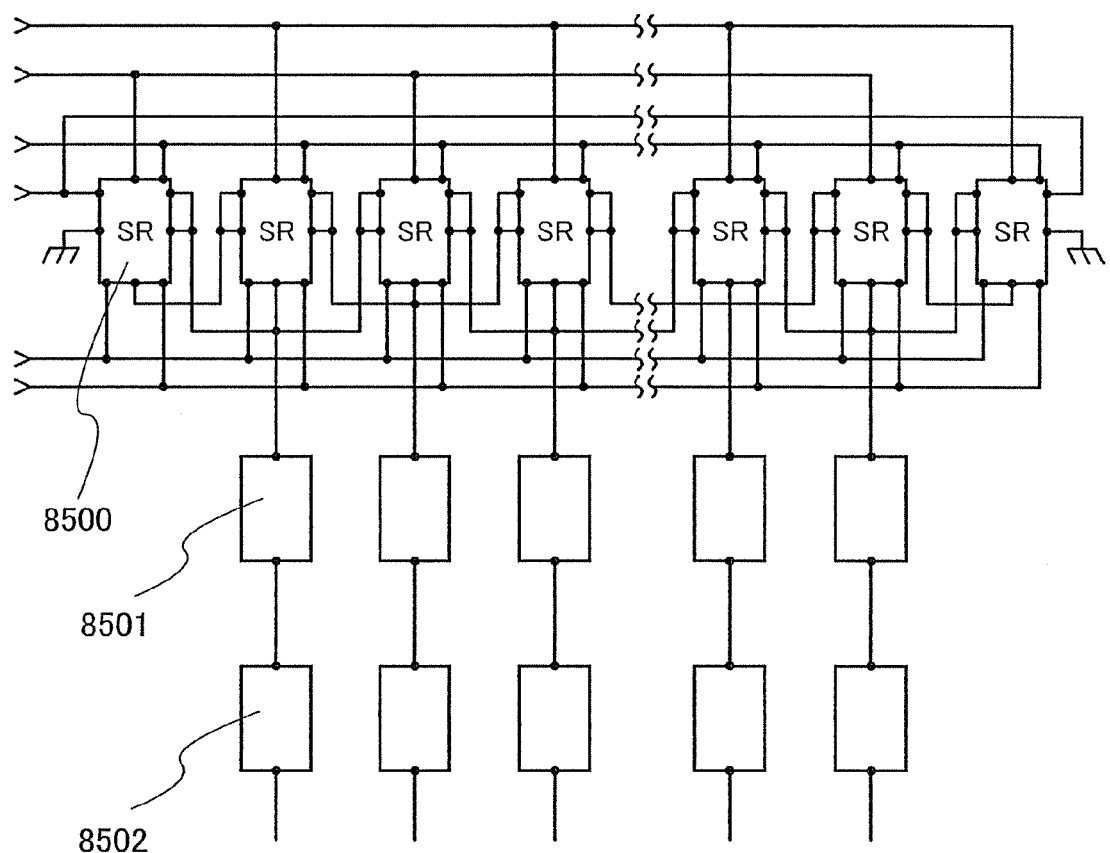
FIG. 22 shows an example of a circuit configuration of a display device of the present invention.

FIG. 22 is a block diagram of a scanning line driver circuit that includes an n-channel TFT using a SAS in which a field-effect mobility of 1 cm$^2$/V·sec to 15 cm$^2$/V·sec can be obtained.

In FIG. 22, a block denoted by reference numeral 8500 corresponds to a pulse-output circuit that outputs a sampling pulse for one stage, and a shift register includes n pieces of pulse-output circuits. Reference numeral 8501 denotes a buffer circuit, and a pixel 8502 is connected to the end of the buffer circuit.

Figure 23:
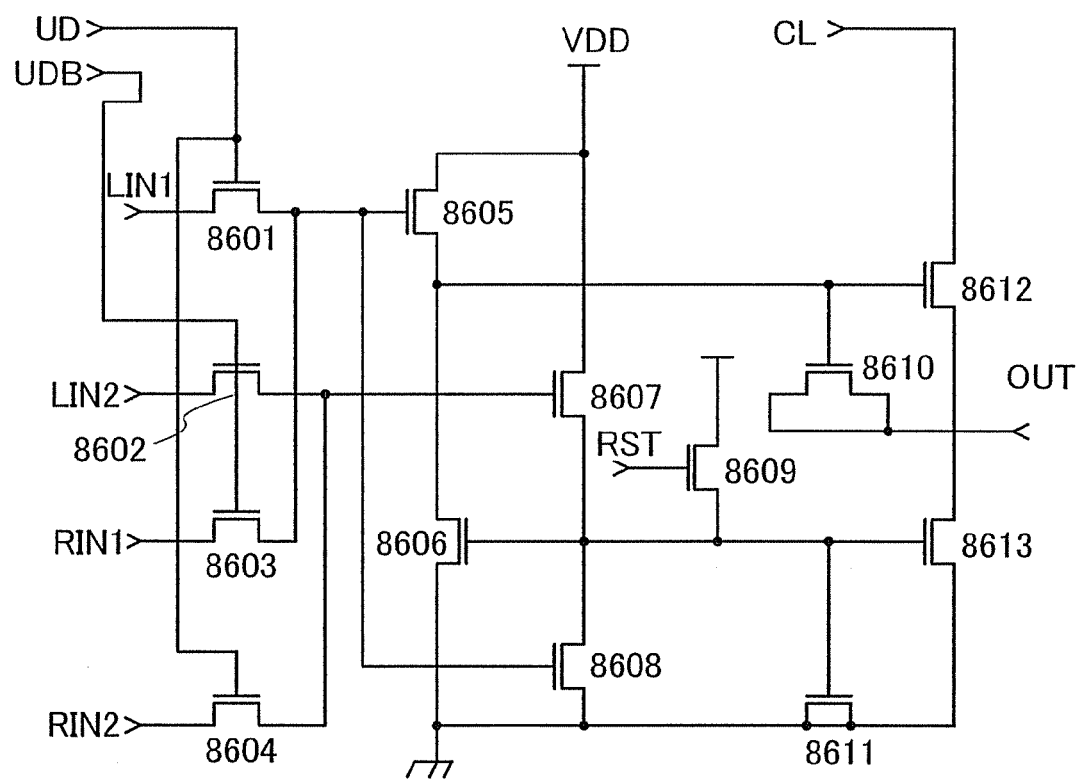
FIG. 23 shows an example of a circuit configuration of a display device of the present invention.

FIG. 23 shows a specific structure of the pulse-output circuit 8500, which includes n-channel TFTs 8601 to 8613. At this point, a size of the TFTs may be determined in consideration of operation characteristics of the n-channel TFTs that use a SAS. For example, when the channel length is 8 μm, the channel width can be set in a range of 10 μm to 80 μm.

Figure 24:
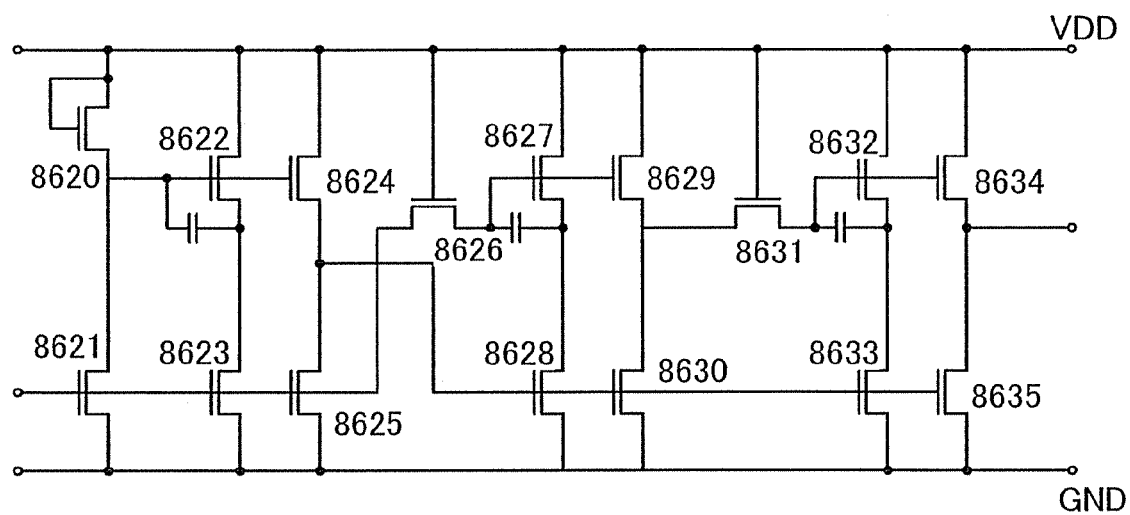
FIG. 24 shows an example of a circuit configuration of a display device of the present invention.

Furthermore, a specific structure of the buffer circuit 8501 is shown in FIG. 24. Similarly, the buffer circuit includes n-channel TFTs 8620 to 8635. At this point, a size of the TFTs may be determined in consideration of operation characteristics of the n-channel TFTs that use a SAS. For example, when the channel length is 10 μm, the channel width is to be set in a range of 10 μm to 1800 μm.

In order to realize such a circuit, it is necessary to connect the TFTs with one another by a wiring.

In the above-described manner, a driver circuit can be incorporated in a display panel.

Embodiment Mode 13

Embodiment Mode 13 will be described with reference to FIG. 28. FIG. 28 shows an example in which an EL display module is formed using a TFT substrate 2800 manufactured in accordance with the present invention. In FIG. 28, a pixel portion including pixels is formed over the TFT substrate 2800.

In FIG. 28, a TFT that has a similar structure to that formed in the pixel, or a protective circuit portion 2801 is provided between a driver circuit and the pixel and outside the pixel portion. The protective circuit portion 2801 operates in a similar manner to a diode by connecting either a source electrode layer or a drain electrode layer to a gate electrode layer of the TFT similar to that formed in the pixel. A driver IC formed of a single crystalline semiconductor, a stick driver IC formed of a polycrystalline semiconductor layer over a glass substrate, a driver circuit formed of a SAS, or the like is applied to a driver circuit 2809.

The TFT substrate 2800 is firmly fixed to a sealing substrate 2820 with spacers 2806*a* and 2806*b* formed by a droplet discharge method interposed therebetween. The spacers are preferably provided to keep a distance between two substrates constant even when the substrate is thin or an area of the pixel portion is enlarged. A space between the TFT substrate 2800 and the sealing substrate 2820 over light emitting elements 2804 and 2805 connected to TFTs 2802 and 2803 respectively may be filled with a resin material having a light-transmitting property to at least light of a visible region and the resin material may be solidified. Alternatively, the space may be filled with anhydrous nitrogen or an inert gas.

FIG. 28 shows a case where the light emitting elements 2804 and 2805 have a top-emission structure, in which light is emitted in the direction of arrows shown in the drawing. Multicolor display can be performed by making the pixels emit light of different colors of red, green, and blue. At this time, color purity of the light emitted to the outside can be improved by forming colored layers 2807*a* to 2807*c* corresponding to respective colors on the sealing substrate 2820 side. Moreover, pixels that emit white light may be used and may be combined with the colored layers 2807*a* to 2807*c*.

The driver circuit 2809 that is an external circuit is connected by a wiring board 2810 to a scanning line or signal line connection terminal that is provided at one end of an external circuit substrate 2811. In addition, a heat pipe 2813, which is a high-efficiency heat conduction device having a pipe-like shape, and a heat sink 2812, each of which is used for conducting heat to the outside of the device, may be provided in contact with or adjacent to the TFT substrate 2800 to enhance a heat dissipation effect.

Note that FIG. 28 shows the top-emission EL display module; however, a bottom emission structure may be employed by changing the structure of the light emitting element or the disposition of the external circuit board. Naturally, a dual emission structure in which light is emitted from both the top and bottom surfaces may be used. In the case of the top emission structure, the insulating layer serving as a partition may be colored and used as a black matrix. This partition can be formed by a droplet discharge method and it may be formed by mixing a black resin of a pigment material, carbon black, or the like into a resin material such as polyimide. A stack thereof may alternatively be used.

In addition, in the EL display module, reflected light of light that is incident from outside may be blocked by using a retardation film or a polarizer. In a top-emission display device, an insulating layer serving as a partition may be colored and used as a black matrix. This partition can be formed by a droplet discharge method or the like. Carbon black or the like may be mixed into a black resin of a pigment material or a resin material such as polyimide, and a stack thereof may also be used. By a droplet discharge method, different materials may be discharged to the same region plural times to form the partition. A quarter-wave plate or a half-wave plate may be used as the retardation film and may be designed to be able to control light. As the structure, a TFT element substrate, the light emitting element, the scaling substrate (sealant), the retardation film (quarter-wave plate or a half-wave plate), and the polarizer are sequentially stacked, through which light emitted from the light emitting element passes and is emitted to the outside from the polarizer side. The retardation film or polarizer may be provided on a side where light is emitted or may be provided on both sides in the case of a dual emission display device in which light is emitted from the both surfaces. In addition, an anti-reflection film may be provided on the outer side of the polarizer. Accordingly, a more high-definition and accurate image can be displayed.

A resin film may be attached to the side of the TFT substrate 2800 where the pixel portion is formed, with the use of a sealant or an adhesive resin, to form a sealing structure. Although glass sealing using a glass substrate is used in this embodiment mode, various sealing methods such as resin sealing using a resin, plastic sealing using plastics, and film sealing using a film can be used. A gas barrier film that prevents water vapor from penetrating the resin film is preferably provided over the surface of the resin film. By employing a film sealing structure, further reductions in thickness and weight can be achieved.

In a display device provided with a TFT substrate or the like manufactured using the present invention, a part of process is simplified, and throughput in the manufacture is improved. Accordingly, a display module can be manufactured with high mass productivity.

This embodiment mode can be freely combined with any of Embodiment Modes 1 to 7, 11, and 12.

Embodiment Mode 14

Embodiment Mode 14 will be described with reference to FIGS. 31A and 31B. Each of FIGS. 31A and 31B shows an example of forming a liquid crystal display module by using a TFT substrate 2600 manufactured by the present invention.

Figure 31A:
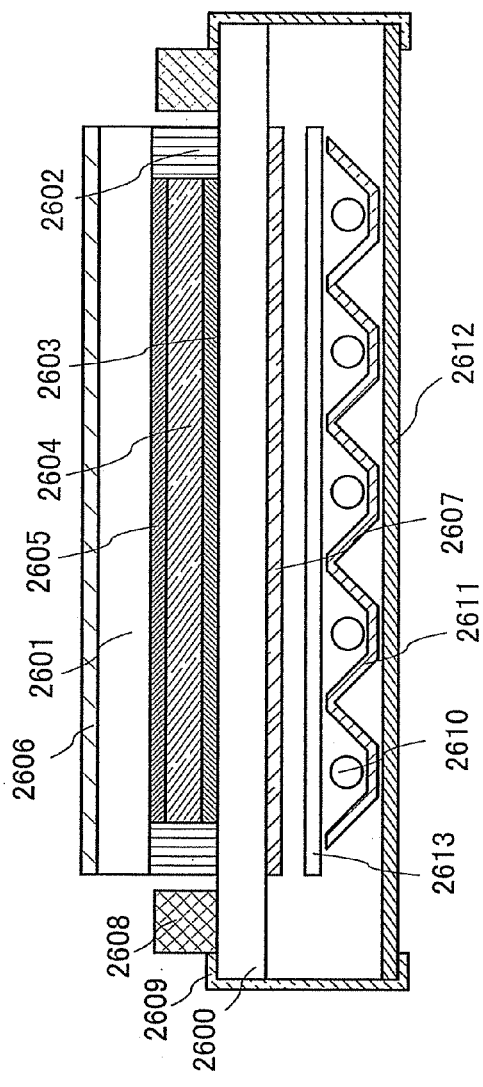
FIGS. 31A and 31B show structural examples of a display module of the present invention.

FIG. 31A shows an example of a liquid crystal display module, in which the TFT substrate 2600 and an opposite substrate 2601 are firmly fixed to each other with a sealant 2602, and a pixel portion 2603 and a liquid crystal layer 2604 are provided therebetween to form a display region. A colored layer 2605 is necessary to perform color display. In the case of the RGB system, colored layers corresponding to colors of red, green, and blue are provided for corresponding pixels. The outer side of the TFT substrate 2600 is provided with a polarizer 2607 and a diffuser plate 2613, and the outer side of the opposite substrate 2601 is provided with a polarizer 2606. A light source includes a cold cathode tube 2610 and a reflector plate 2611. A circuit board 2612 is connected to the TFT substrate 2600 by a flexible wiring board 2609. External circuits such as a control circuit and a power supply circuit are incorporated in the circuit board 2612. The polarizer and the liquid crystal layer may be stacked with a retardation film interposed therebetween.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

Figure 31B:
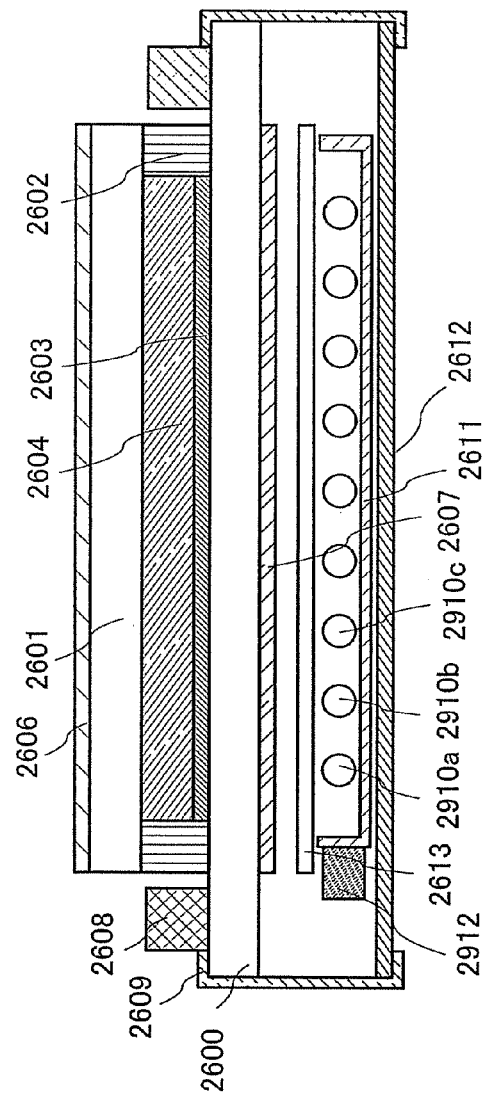

FIG. 31B shows an example of applying an OCB mode to the liquid crystal display module of FIG. 31A, and this liquid crystal display module is an FS-LCD (Field Sequential-LCD). The FS-LCD performs red, green, and blue light emissions in one frame period. Color display can be performed by composing an image by a time division method. In addition, emission of each color is performed using a light emitting diode, a cold cathode tube, or the like; hence, a color filter is not required. There is no necessity for arranging color filters of three primary colors and limiting a display region of each color. Display of all three colors can be performed in any region. On the other hand, since light emission of three colors is performed in one frame period, high speed response of liquid crystal is needed. When an FLC mode using an FS system and the OCB mode are applied to the display device of the present invention, a display device or a liquid crystal television device having higher performance and high image quality can be completed.

A liquid crystal layer of the OCB mode has a so-called π cell structure. In the π cell structure, liquid crystal molecules are oriented such that pretilt angles of the molecules are symmetrical with respect to the center plane between the active matrix substrate and the opposite substrate. The orientation in the π cell structure is a splay orientation when a voltage is not applied between the substrates, and shifts into a bend orientation when a voltage is applied. White display is performed in this bend orientation. Further voltage application makes the liquid crystal molecules in the bend orientation orientated perpendicular to the substrates, which does not allow light to pass therethrough. Note that a response speed approximately ten times higher than that of a conventional TN mode can be achieved by using the OCB mode.

Further, as a mode corresponding to the FS system, an HV (Half V)-FLC, an SS (surface stabilized)-FLC, or the like using a ferroelectric liquid crystal (FLC) that can operate at high speed can also be used. A nematic liquid crystal that has relatively low viscosity can be used for the OCB mode. A smectic liquid crystal that has a ferroelectric phase can be used for the HV-FLC or the SS-FLC.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch of a pixel region of a TN-mode liquid crystal display module is 30 μm or less. The optical response speed can be further increased by an overdrive method in which an applied voltage is increased (or decreased) only for a moment.

The liquid crystal display module of FIG. 31B is a transmissive liquid crystal display module, in which a red light source 2910a, a green light source 2910b, and a blue light source 2910c are provided as light sources. A control portion 2912 is provided to control turn on or off of the red light source 2910a, the green light source 2910b, and the blue light source 2910c separately. The light emission of each color is controlled by the control portion 2912. Light enters the liquid crystal and an image is composed using the time division, thereby performing color display.

The liquid crystal display module described above can employ the present invention in manufacturing the TFT substrate 2600. Further, by using the present invention, an opening for connecting the TFT substrate 2600 to the pixel portion or the like can be formed. Accordingly, a part of process can be simplified, and throughput is improved; therefore, the liquid crystal display module can be manufactured with high mass productivity.

This embodiment mode can be freely combined with any of Embodiment Modes 1 to 3, 8, 9, 11, and 12 as appropriate.

Embodiment Mode 15

Figure 21:
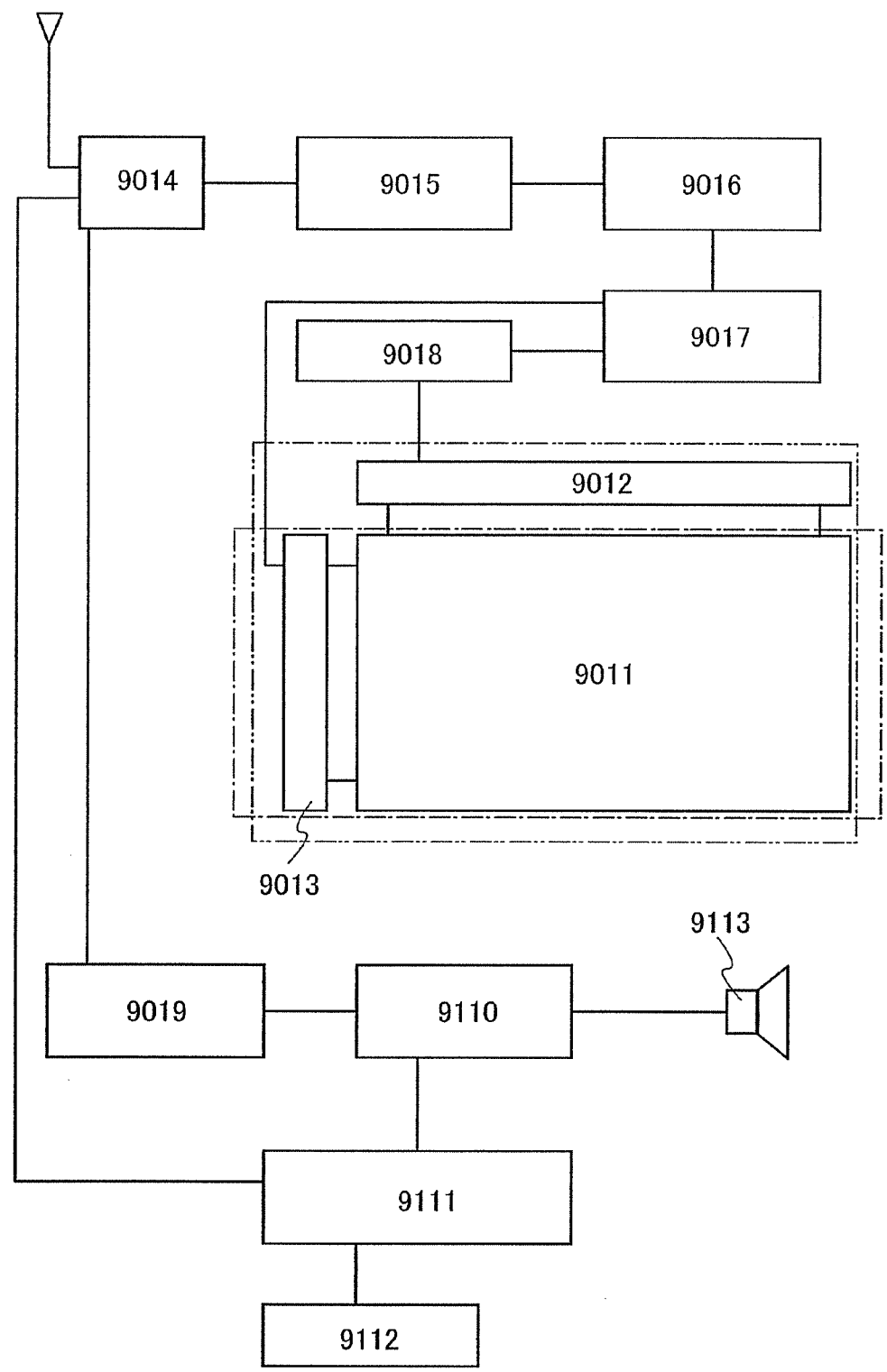
FIG. 21 is a block diagram of a main structure of an electronic device to which the present invention is applied.

With the display device formed by the present invention, a television device (also referred to as simply a television, or a television receiver) can be completed. FIG. 21 is a block diagram showing main components of the television device.

A display panel included in the television device of this embodiment mode includes a pixel portion 9011, a signal line driver circuit 9012, and a scanning line driver circuit 9013. In the display panel, the signal line driver circuit 9012 and the scanning line driver circuit 9013 may be external driver circuits as shown in FIG. 15A, they may be additionally mounted as driver ICs by a COG method as shown in FIG. 16A, or they may be mounted as driver ICs by a TAB method as shown in FIG. 16B. Alternatively, the scanning line driver circuit may be formed using TFTs integrally with the pixel portion over the substrate as shown in FIG. 15B, or the signal line driver circuit and the scanning line driver circuit may be formed using TFTs integrally with the pixel portion over the substrate as shown in FIG. 15C. Since detailed explanation of FIGS. 15A to 16B has been made in the above embodiment mode, it is omitted here.

As another external circuit in FIG. 21, a video signal amplifier circuit 9015 that amplifies a video signal among signals received by a tuner 9014, a video signal processing circuit 9016 that converts the signals output from the video signal amplifier circuit 9015 into chrominance signals corresponding to respective colors of red, green, and blue, a control circuit 9017 that converts the video signal into an input specification of the driver IC, and the like are provided on an input side of the video signal. The control circuit 9017 outputs signals to both a scanning line side and a signal line side. In the case of digital drive, a signal dividing circuit 9018 may be provided on the signal line side and an input digital signal may be divided into m pieces and supplied.

An audio signal among signals received by the tuner 9014 is sent to an audio signal amplifier circuit 9019 and is supplied to a speaker 9113 through an audio signal processing circuit 9110. A control circuit 9111 receives control information of a receiving station (reception frequency) or sound volume from an input portion 9112 and transmits signals to the tuner 9014 and the audio signal processing circuit 9110.

Figure 25A:
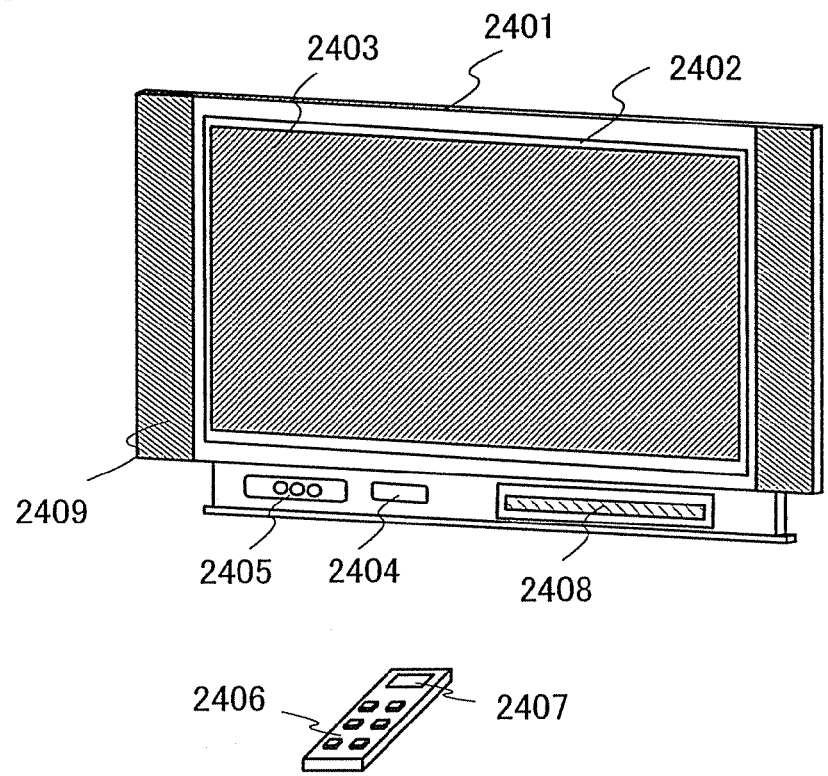
FIGS. 25A and 25B show examples of an electronic device to which the present invention is applied.
Figure 25B:
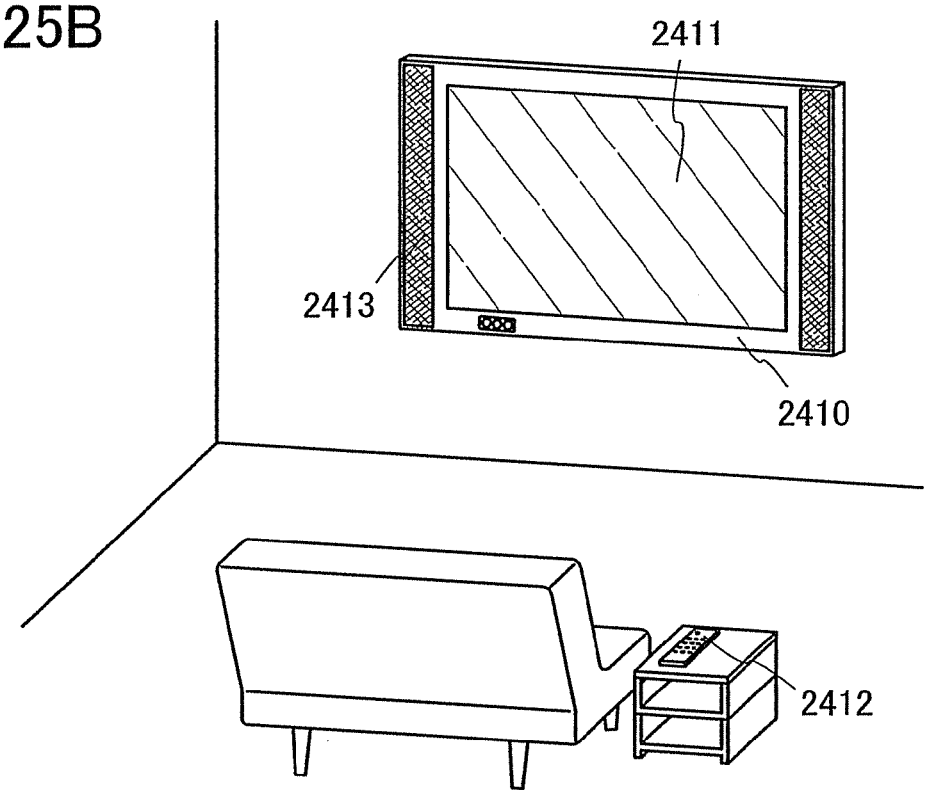

A television device can be completed by incorporating the display module into a housing as shown in FIGS. 25A and 25B. When a liquid crystal display module is used as a display module, a liquid crystal television device can be manufactured. When an EL display module is used, an EL television device can be manufactured. Alternatively, a plasma television, electronic paper, or the like can be manufactured. In FIG. 25A, a main screen 2403 is formed by using the display module, and a speaker portion 2409, an operation switch, and the like are provided as its accessory equipment. Thus, a television device can be completed in accordance with the present invention.

In FIG. 25A, a display panel 2402 is incorporated in a housing 2401, and general TV broadcast can be received by a receiver 2405. When the display device is connected to a communication network by wired or wireless connections via a modem 2404, one-way (from a sender to a receiver) or two-way (between a sender and a receiver or between receivers) information communication can be performed. The television device can be operated by using a switch built in the housing 2401 or a remote control unit 2406 that is separately formed. A display portion 2407 for displaying output information may also be provided in the remote control device 2406.

Further, the television device may include a sub screen 2408 formed using a second display panel so as to display channels, volume, or the like, in addition to the main screen 2403. In this structure, both the main screen 2403 and the sub screen 2408 can be formed using a liquid crystal display panel or an EL display panel according to the present invention. Alternatively, the main screen 2403 may be formed using an EL display panel having a wide viewing angle, and the sub screen 2408 may be formed using a liquid crystal display panel capable of displaying images with lower power consumption. In order to reduce the power consumption preferentially, the main screen 2403 may be formed using a liquid crystal display panel, and the sub screen may be formed using an EL display panel which can be switched on and off. In accordance with the present invention, a display device can be formed at reduced manufacturing cost even when a large-area substrate is used and a large number of TFTs or electronic components are used.

FIG. 25B shows a television device having a large-sized display portion, for example, a 20-inch to 80-inch display portion. The television device includes a housing 2410, a display portion 2411, a remote control device 2412 that is an operation portion, a speaker portion 2413, and the like. The present invention is applied to manufacture of the display portion 2411. Since the television device in FIG. 25B is a wall-hanging type, it does not require a large installation space.

Naturally, the present invention is not limited to the television device, and can be applied to various use applications particularly as a large-sized display medium such as an information display board at a train station, an airport, or the like, or an advertisement display board on the street, as well as a monitor of a personal computer.

An opening or the like which connects a TFT of a display device to a pixel can be formed using the present invention. Accordingly, the display device can be manufactured with a simplified process, and thus it is possible to improve throughput in manufacture of the display device.

This embodiment mode can be freely combined with any of Embodiment Mode 1 to 14 as appropriate.

Embodiment Mode 16

Examples of electronic devices in accordance with the present invention are as follows: television devices (also referred to as simply a television, or a television receiver), cameras such as a digital camera and a digital video camera, portable information terminal devices such as a cellular phone device (simply also referred to as a cellular phone or a cell-phone) and a PDA, portable game machines, computer monitors, computers, sound reproducing devices such as car audio systems, image reproducing devices including a recording medium, such as a home-use game machine, and the like. Specific examples of them are described with reference to FIGS. 26A to 26E.

Figure 26A:
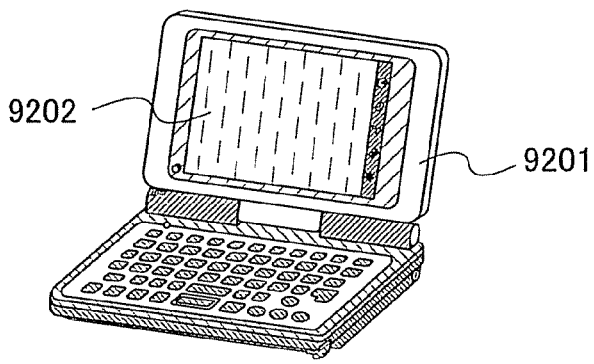
FIGS. 26A to 26E show examples of an electronic device to which the present invention is applied.

A portable information terminal device shown in FIG. 26A includes a main body 9201, a display portion 9202, and the like. A display device of the present invention can be applied to the display portion 9202. Accordingly, a portable information terminal device can be manufactured by a simplified process with improved throughput, whereby it can be manufactured with high mass productivity.

Figure 26B:
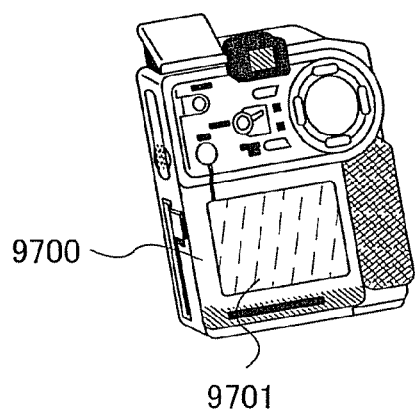

A digital video camera shown in FIG. 26B includes a main body 9700, a display portion 9701, and the like. A display device of the present invention can be applied to the display portion 9701. Accordingly, a digital video camera can be manufactured by a simplified process with improved throughput, whereby it can be manufactured with high mass productivity.

Figure 26C:
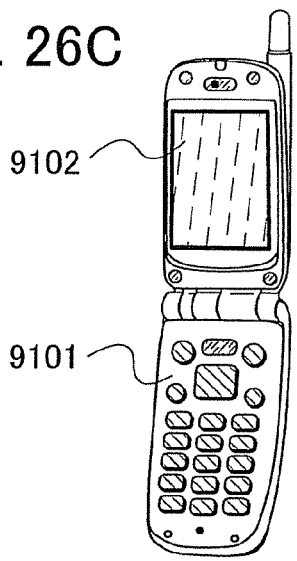

A cellular phone shown in FIG. 26C includes a main body 9101, a display portion 9102, and the like. A display device of the present invention can be applied to the display portion 9102. Accordingly, a cellular phone can be manufactured by a simplified process with improved throughput, whereby it can be manufactured with high mass productivity.

Figure 26D:
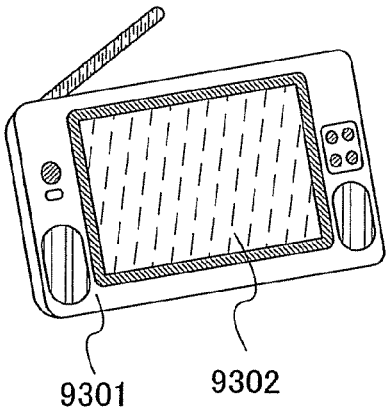

A portable television device shown in FIG. 26D includes a main body 9301, a display portion 9302, and the like. A display device of the present invention can be applied to the display portion 9302. Accordingly, a portable television device can be manufactured by a simplified process with improved throughput, whereby it can be manufactured with high mass productivity. The display device of the present invention can be applied to a wide range of television devices ranging from a small-sized television device mounted on a portable terminal such as a cellular phone, a medium-sized television device which can be carried, to a large-sized (for example, 40-inch or larger) television device.

Figure 26E:
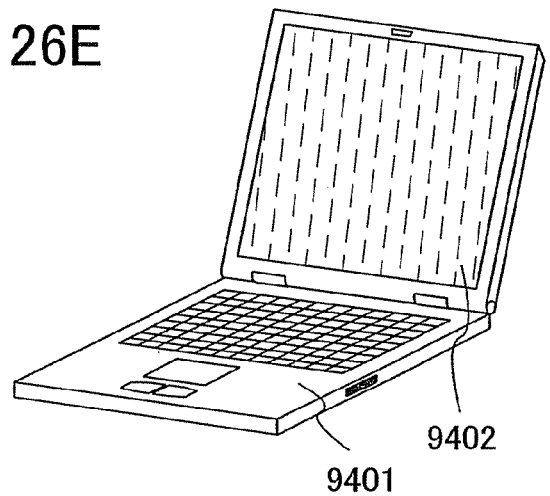

A portable computer shown in FIG. 26E includes a main body 9401, a display portion 9402, and the like. A display device of the present invention can be applied to the display portion 9402. Accordingly, a portable computer can be manufactured by a simplified process with improved throughput, whereby it can be manufactured with high mass productivity.

As described above, by using the display device of the present invention, electronic devices can be manufactured with high mass productivity.

This embodiment mode can be freely combined with any of Embodiment Modes 1 to 15.

This application is based on Japanese Patent Application serial no. 2006-290771 filed in Japan Patent Office on Oct. 26, 2006, the entire contents of which are hereby incorporated by reference.

What is claimed is:

1. A manufacturing method of a semiconductor device, comprising the steps of:
    forming a first material layer;
    forming a second material layer over the first material layer; and
    irradiating the first material layer and the second material layer with a first laser beam and a second laser beam to remove at least a region of the second material layer,
    wherein the first laser beam is absorbed by at least the first material layer,
    wherein the second laser beam is absorbed by at least the second material layer,
    wherein the first laser beam and the second laser beam overlap at the region, and
    wherein the first material layer and the second material layer are irradiated with the first laser beam and the second laser beam at the same time.

2. The manufacturing method of a semiconductor device according to claim 1, wherein a wavelength of the first laser beam is longer than a wavelength of the second laser beam.

3. The manufacturing method of a semiconductor device according to claim 1,
    wherein a second harmonic wave emitted from a YAG laser is used as the first laser beam, and
    wherein a third harmonic wave emitted from the YAG laser is used as the second laser beam.

4. The manufacturing method of a semiconductor device according to claim 1, wherein a beam spot area S1 of the first laser beam at the region and a beam spot area S2 of the second laser beam at the region satisfy a relation S1<S2.

5. The manufacturing method of a semiconductor device according to claim 1, wherein a beam diameter W1 of the first laser beam at the region and a beam diameter W2 of the second laser beam at the region satisfy a relation W1<W2.

6. A manufacturing method of a semiconductor device, comprising the steps of:
    forming a first material layer;
    forming a second material layer over the first material layer; and
    irradiating the first material layer and the second material layer with a first laser beam and a second laser beam to remove at least a region of the second material layer,
    wherein an oscillation wavelength of the first laser beam is in an absorption wavelength range of the first material layer,
    wherein an oscillation wavelength of the second laser beam is in an absorption wavelength range of the second material layer,
    wherein the first laser beam and the second laser beam overlap at the region, and
    wherein the first material layer and the second material layer are irradiated with the first laser beam and the second laser beam at the same time.

7. The manufacturing method of a semiconductor device according to claim 6, wherein a wavelength of the first laser beam is longer than a wavelength of the second laser beam.

8. The manufacturing method of a semiconductor device according to claim 6,
    wherein a second harmonic wave emitted from a YAG laser is used as the first laser beam, and
    wherein a third harmonic wave emitted from the YAG laser is used as the second laser beam.

9. The manufacturing method of a semiconductor device according to claim 6, wherein a beam spot area S1 of the first laser beam at the region and a beam spot area S2 of the second laser beam at the region satisfy a relation S1<S2.

10. The manufacturing method of a semiconductor device according to claim 6, wherein a beam diameter W1 of the first laser beam at the region and a beam diameter W2 of the second laser beam at the region satisfy a relation W1<W2.

11. A manufacturing method of a semiconductor device, comprising the steps of:
    forming a first material layer;
    forming a second material layer over the first material layer; and
    irradiating the first material layer and the second material layer with a first laser beam and a second laser beam to remove at least a region of the second material layer,
    wherein the first laser beam has an oscillation wavelength of 400 nm or longer,
    wherein the second laser beam has an oscillation wavelength of 400 nm or shorter,
    wherein the first laser beam and the second laser beam overlap at the region, and
    wherein the first material layer and the second material layer are irradiated with the first laser beam and the second laser beam at the same time.

12. The manufacturing method of a semiconductor device according to claim 11,
    wherein the oscillation wavelength of the first laser beam is in an absorption wavelength range of the first material layer, and
    wherein the oscillation wavelength of the second laser beam is in an absorption wavelength range of the second material layer.

13. The manufacturing method of a semiconductor device according to claim 11,
wherein a second harmonic wave emitted from a YAG laser is used as the first laser beam, and
wherein a third harmonic wave emitted from the YAG laser is used as the second laser beam.

14. The manufacturing method of a semiconductor device according to claim 11, wherein a beam spot area S1 of the first laser beam at the region and a beam spot area S2 of the second laser beam at the region satisfy a relation S1<S2.

15. The manufacturing method of a semiconductor device according to claim 11, wherein a beam diameter W1 of the first laser beam at the region and a beam diameter W2 of the second laser beam at the region satisfy a relation W1<W2.

* * * * *